United States Patent
Li et al.

(10) Patent No.: US 12,249,529 B2
(45) Date of Patent: Mar. 11, 2025

(54) LIGHT-EMITTING DIODE SUBSTRATE AND MANUFACTURING METHOD THEREOF, DISPLAY DEVICE

(71) Applicant: BOE TECHNOLOGY GROUP CO., LTD., Beijing (CN)

(72) Inventors: Haixu Li, Beijing (CN); Xiao Zhang, Beijing (CN); Fei Wang, Beijing (CN); Mingxing Wang, Beijing (CN); Shulei Li, Beijing (CN); Xue Dong, Beijing (CN); Guangcai Yuan, Beijing (CN); Zhanfeng Cao, Beijing (CN); Xin Gu, Beijing (CN); Ke Wang, Beijing (CN); Feng Qu, Beijing (CN); Xuan Liang, Beijing (CN); Junwei Yan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 688 days.

(21) Appl. No.: 17/427,628

(22) PCT Filed: Oct. 30, 2020

(86) PCT No.: PCT/CN2020/125490
§ 371 (c)(1),
(2) Date: Jul. 30, 2021

(87) PCT Pub. No.: WO2022/088093
PCT Pub. Date: May 5, 2022

(65) Prior Publication Data
US 2022/0352000 A1     Nov. 3, 2022

(51) Int. Cl.
*H01L 21/683* (2006.01)
*H01L 25/075* (2006.01)
*H01L 33/62* (2010.01)

(52) U.S. Cl.
CPC ...... *H01L 21/6835* (2013.01); *H01L 25/0753* (2013.01); *H01L 33/62* (2013.01);
(Continued)

(58) Field of Classification Search
CPC . H01L 21/6835; H01L 25/0753; H01L 33/62; H01L 2221/68354;
(Continued)

(56) References Cited

U.S. PATENT DOCUMENTS

2010/0259164 A1   10/2010  Oohata et al.
2017/0061867 A1   3/2017   Cok et al.
(Continued)

FOREIGN PATENT DOCUMENTS

CN    105129259 A    12/2015
CN    107017319 A    8/2017
(Continued)

OTHER PUBLICATIONS

Extended European Search Report dated Jul. 26, 2023 received in European Patent Application No. EP 20959255.9.

*Primary Examiner* — Syed I Gheyas
(74) *Attorney, Agent, or Firm* — Scully, Scott, Murphy & Presser, P.C.

(57) ABSTRACT

A light-emitting diode substrate, a manufacturing method thereof, and a display device are disclosed. The manufacturing method of the light-emitting diode substrate includes: forming an epitaxial layer group of M light-emitting diode chips on a substrate; transferring N epitaxial layer groups on N substrates onto a transition carrier substrate, the N epitaxial layer groups on the N substrates being densely arranged on the transition carrier substrate; and transferring at least part of N*M light-emitting diode chips corresponding to the N epitaxial layer groups on the transition carrier substrate onto a driving substrate, an area of the transition
(Continued)

carrier substrate is greater than or equal to a sum of areas of the N substrates, M is a positive integer greater than or equal to 2, and N is a positive integer greater than or equal to 2.

20 Claims, 24 Drawing Sheets

(52) U.S. Cl.
CPC ............... *H01L 2221/68354* (2013.01); *H01L 2221/68368* (2013.01); *H01L 2221/68386* (2013.01); *H01L 2933/0066* (2013.01)

(58) Field of Classification Search
CPC . H01L 2221/68368; H01L 2221/68386; H01L 2933/0066; H01L 33/0095; H01L 25/167; H01L 2221/68322; H01L 2221/68363
See application file for complete search history.

(56) References Cited

U.S. PATENT DOCUMENTS

| | | | |
|---|---|---|---|
| 2019/0035688 | A1 | 1/2019 | Chen |
| 2019/0043843 | A1* | 2/2019 | Liu ..................... H01L 25/0753 |
| 2019/0044023 | A1 | 2/2019 | Cheng et al. |
| 2019/0393069 | A1 | 12/2019 | Paranjpe et al. |
| 2020/0259044 | A1* | 8/2020 | Cheng ..................... H01L 33/62 |

FOREIGN PATENT DOCUMENTS

| | | |
|---|---|---|
| CN | 107852794 A | 3/2018 |
| CN | 107946415 A | 4/2018 |
| CN | 108352143 A | 7/2018 |
| CN | 108538878 A | 9/2018 |
| CN | 109309038 A | 2/2019 |
| CN | 109473532 A | 3/2019 |
| CN | 110021237 A | 7/2019 |
| CN | 110100306 A | 8/2019 |
| CN | 110249429 A | 9/2019 |
| CN | 110462834 A | 11/2019 |
| CN | 110690243 A | 1/2020 |
| CN | 110870066 A | 3/2020 |
| CN | 111128813 A | 5/2020 |
| CN | 111244004 A | 6/2020 |
| CN | 111244008 A | 6/2020 |
| CN | 111261658 A | 6/2020 |
| CN | 111344862 A | 6/2020 |
| CN | 112018143 A | 12/2020 |

\* cited by examiner

LIGHT-EMITTING DIODE SUBSTRATE AND MANUFACTURING METHOD THEREOF, DISPLAY DEVICE

CROSS-REFERENCE TO RELATED APPLICATIONS

This application is a national phase entry of PCT International Application No. PCT/CN2020/125490, filed on Oct. 30, 2020. The disclosure of PCT International Application No. PCT/CN2020/125490 is incorporated by reference herein.

TECHNICAL FIELD

Embodiments of the present disclosure relate to a light-emitting diode substrate and a manufacturing method thereof, and a display device.

BACKGROUND

Light-emitting diode (LED) is a semiconductor device that emits light by recombination of electrons and holes. The light-emitting diode can usually be made of a compound of gallium (Ga), arsenic (As), phosphorus (P), nitrogen (N) and indium (In). Light-emitting diode can efficiently convert electric energy into light energy, and can emit monochromatic light of different colors. For example, gallium arsenide diodes can emit red light, gallium phosphide diodes can emit green light, silicon carbide diodes can emit yellow light and gallium nitride diodes can emit blue light.

With the continuous development of display technology, LED display technology as a new display technology has gradually become one of the research hotspots. The light-emitting diode display technology uses an array of light-emitting diodes (LEDs) to display. Compared with other display technologies, LED display technology has the advantages of high luminous intensity, fast response speed, low power consumption, low voltage demand, light and thin equipment, long service life, strong impact resistance and anti-interference ability.

On the other hand, micro-LED with smaller sizes can better realize high-resolution products, such as smart phones or virtual display screens with 4K or even 8K resolution. For the virtual display screen, although the response time of organic light-emitting diode (OLED) display panel has been reduced to microsecond level, it has a very good response time level. However, the response time of micro-LED is further reduced to nanosecond level, which is 1000 times faster, so it is more suitable for making virtual display screen.

SUMMARY

Embodiments of the present disclosure provide a light-emitting diode substrate, a manufacturing method thereof, and a display device. The manufacturing method of a light-emitting diode substrate includes: forming an epitaxial layer group of M light-emitting diode chips on a substrate; transferring N epitaxial layer groups on N substrates onto a transition carrier substrate, the N epitaxial layer groups on the N substrates being densely arranged on the transition carrier substrate; and transferring at least part of N*M light-emitting diode chips corresponding to the N epitaxial layer groups on the transition carrier substrate onto a driving substrate, an area of the transition carrier substrate is greater than or equal to a sum of areas of the N substrates, M is a positive integer greater than or equal to 2, and N is a positive integer greater than or equal to 2. Therefore, in the manufacturing method of the light-emitting diode substrate, N epitaxial layer groups on N substrates are firstly transferred to the transition carrier substrate with a larger size, and these epitaxial layer groups are densely arranged on the transition carrier substrate, and then transferring the light-emitting diode chips on the transition carrier substrate to the driving substrate, so that more light-emitting diode chips can be taken and transferred at one time, or even the light-emitting diode chips required by the driving substrate can be taken and transferred at one time, and the taking efficiency and the transfer efficiency can be greatly improved.

At least one embodiment of the present disclosure provides a manufacturing method of a light-emitting diode substrate, which includes: forming an epitaxial layer group of M light-emitting diode chips on a substrate; transferring N epitaxial layer groups on N substrates onto a transition carrier substrate, the N epitaxial layer groups on the N substrates being densely arranged on the transition carrier substrate; and transferring at least part of N*M light-emitting diode chips corresponding to the N epitaxial layer groups on the transition carrier substrate onto a driving substrate, an area of the transition carrier substrate is greater than or equal to a sum of areas of the N substrates, M is a positive integer greater than or equal to 2, and N is a positive integer greater than or equal to 2.

For example, in the manufacturing method of the light-emitting diode substrate provided by an embodiment of the present disclosure, on the transition carrier substrate, a distance between two adjacent epitaxial layer groups is approximately equal to a distance between two adjacent light-emitting diode chips.

For example, in the manufacturing method of the light-emitting diode substrate provided by an embodiment of the present disclosure, a shape of the transition carrier substrate is substantially the same as a shape of the driving substrate, and the area of the transition carrier substrate is substantially equal to an area of the driving substrate.

For example, in the manufacturing method of the light-emitting diode substrate provided by an embodiment of the present disclosure, the driving substrate includes a base substrate and a plurality of driving circuits on the base substrate, each of the plurality of driving circuits includes a pad and is configured to drive a light-emitting diode chip electrically connected with the pad to emit light, and the manufacturing method further includes: bonding the light-emitting diode chip transferred on the driving substrate with the pad of a corresponding one of the plurality of driving circuits by adopting a bonding process.

For example, in the manufacturing method of the light-emitting diode substrate provided by an embodiment of the present disclosure, bonding the light-emitting diode chip transferred on the driving substrate with the pad of the corresponding one of the plurality of driving circuits by adopting the bonding process includes: performing thermal reflow on the driving substrate to bond the light-emitting diode chip and the pad together.

For example, in the manufacturing method of the light-emitting diode substrate provided by an embodiment of the present disclosure, the driving substrate further includes a plurality of conductive bumps located at a side of the pad away from the base substrate, and an orthographic projection of the pad on the base substrate is overlapped with an orthographic projection of at least one of the plurality of conductive bumps on the base substrate, and the manufacturing method further includes: coating an organic insulating adhesive on the driving substrate before transferring at least part of the N*M light-emitting diode chips corresponding to the N epitaxial layer groups on the transition carrier substrate onto the driving substrate; bonding the light-emitting diode chip transferred on the driving substrate with the pad of the corresponding one of the plurality of driving circuit by adopting a bonding process includes: performing thermal reflow on the driving substrate and evaporating a solvent in the organic insulating adhesive, to bond the light-emitting diode chip and the pad together.

For example, in the manufacturing method of the light-emitting diode substrate provided by an embodiment of the present disclosure, transferring the N epitaxial layer groups on the N substrates to the transition carrier substrate includes: forming a first adhesive layer on the transition carrier substrate; and transferring the N epitaxial layer groups on the N substrates to a side of the first adhesive layer away from the transition carrier substrate.

For example, in the manufacturing method of the light-emitting diode substrate provided by an embodiment of the present disclosure, forming the first adhesive layer on the transition carrier substrate includes: coating a first adhesive material layer on the transition carrier substrate; and patterning the first adhesive material layer to form a plurality of through holes penetrating through the first adhesive material layer in the first adhesive material layer, the first adhesive material layer including the plurality of through holes is the first adhesive layer, and a size of an orthographic projection of each of the plurality of through holes on the transition carrier substrate is smaller than a size of an orthographic projection of each of the light-emitting diode chips on the transition carrier substrate.

For example, in the manufacturing method of the light-emitting diode substrate provided by an embodiment of the present disclosure, a material of the first adhesive layer includes ultraviolet light viscosity reducing adhesive or laser dissociation adhesive.

For example, in the manufacturing method of the light-emitting diode substrate, transferring the N epitaxial layer groups on the N substrates to the transition carrier substrate further includes: forming a plurality of light shielding structures on the transition carrier substrate before forming the first adhesive layer on the transition carrier substrate, wherein an orthographic projection of each of the plurality of light shielding structures on the transition carrier substrate is located between orthographic projections of two adjacent light-emitting diode chips on the transition carrier substrate.

For example, in the manufacturing method of the light-emitting diode substrate provided by an embodiment of the present disclosure, after forming the epitaxial layer group of the M light-emitting diode chips on the substrate, the manufacturing method further includes: forming M electrode structures on a side of the epitaxial layer group away from the substrate; and dividing the epitaxial layer group and the M electrode structures to form the M light-emitting diode chips.

For example, in the manufacturing method of the light-emitting diode substrate provided by an embodiment of the present disclosure, dividing the epitaxial layer group and the M electrode structures to form the M light-emitting diode chips includes: dividing the epitaxial layer group and the M electrode structures to form the M light-emitting diode chips by adopting an etching process.

For example, in the manufacturing method of the light-emitting diode substrate provided by an embodiment of the present disclosure, transferring the N epitaxial layer groups on the N substrates to the transition carrier substrate includes: transferring the substrate on which the M light-emitting diode chips are formed to a transfer substrate; peeling off the substrate from the transfer substrate; and transferring N*M light-emitting diode chips on N transfer substrates to the transition carrier substrate, an area of the transfer substrate is approximately equal to an area of the substrate.

For example, in the manufacturing method of the light-emitting diode substrate provided by an embodiment of the present disclosure, transferring the substrate on which M light-emitting diode chips are formed to the transfer substrate includes: coating a second adhesive layer on the transfer substrate; and transferring the substrate on which M light-emitting diode chips are formed to a side of the second adhesive layer away from the transfer substrate.

For example, in the manufacturing method of the light-emitting diode substrate provided by an embodiment of the present disclosure, a material of the second adhesive layer includes ultraviolet light viscosity reducing adhesive or laser dissociation adhesive, and after transferring the N*M light-emitting diode chips on the N transfer substrates to the transition carrier substrate, irradiating light to the transfer substrates to reduce viscosity of the second adhesive layer, so as to remove the transfer substrates.

For example, in the manufacturing method of the light-emitting diode substrate provided by an embodiment of the present disclosure, the transition carrier substrate includes a plurality of first support structures, and a size of each of the plurality of first support structures in a direction perpendicular to the transition carrier substrate is larger than a size of the light-emitting diode chips in the direction perpendicular to the transition carrier substrate, and transferring the N*M light-emitting diode chips on the N transfer substrates to the transition carrier substrate includes: sequentially aligning the N transfer substrates with the transition carrier substrate so that each of the plurality of first support structures is located between two adjacent light-emitting diode chips on the transfer substrate.

For example, in the manufacturing method of the light-emitting diode substrate provided by an embodiment of the present disclosure, each of the plurality of first support structures has a columnar structure, and a shape of an orthographic projection of each of the plurality of first support structures on the transition carrier substrate includes one selected from the group consisting of rectangle, T-shape and circle.

For example, in the manufacturing method of the light-emitting diode substrate provided by an embodiment of the present disclosure, each of the plurality of first support structures has a columnar structure, and orthographic projections of the plurality of first support structures on the transition carrier substrate are connected with each other to form a grid.

For example, in the manufacturing method of the light-emitting diode substrate provided by an embodiment of the present disclosure, transferring at least part of the N*M light-emitting diode chips corresponding to the N epitaxial layer groups on the transition carrier substrate onto the driving substrate includes: aligning the transition carrier substrate with the driving substrate so that the plurality of first support structures are located between the transition carrier substrate and the driving substrate; aligning a first mask plate with the transition carrier substrate, wherein the first mask plate includes a plurality of openings corresponding to a plurality of light-emitting diode chips to be transferred; and irradiating light to the transition carrier substrate through the first mask plate to transfer the plurality of light-emitting diode chips to be transferred onto the driving substrate.

For example, in the manufacturing method of the light-emitting diode substrate provided by an embodiment of the present disclosure, the first mask plate includes a light-absorbing material, and a light absorption rate of the light-absorbing material is greater than 60%.

For example, in the manufacturing method of the light-emitting diode substrate provided by an embodiment of the present disclosure, the first mask plate includes: a first transparent substrate; and a first light-absorbing pattern layer located on the first transparent substrate and including the plurality of openings, the first light-absorbing pattern layer is made of the light-absorbing material, and the light absorption rate of the light-absorbing material is greater than 60%.

For example, in the manufacturing method of the light-emitting diode substrate provided by an embodiment of the present disclosure, the first mask plate further includes: a first magnetic attraction structure located between the first transparent substrate and the first light-absorbing pattern layer, an orthographic projection of the first magnetic attraction structure on the first transparent substrate and an orthographic projection of the plurality of openings on the first transparent substrate are arranged at intervals.

For example, in the manufacturing method of the light-emitting diode substrate provided by an embodiment of the present disclosure, the driving substrate includes a plurality of first receiving structures, and aligning the transition carrier substrate with the driving substrate includes: inserting the plurality of first support structures on the transition carrier substrate into the plurality of first receiving structures on the driving substrate, wherein the plurality of first support structures and the plurality of first receiving structures are arranged in one-to-one correspondence, and a size of each of the plurality of first receiving structures in a direction perpendicular to the driving substrate is smaller than a size of each of the light-emitting diode chips in the direction perpendicular to the driving substrate.

For example, in the manufacturing method of the light-emitting diode substrate provided by an embodiment of the present disclosure, forming the epitaxial layer group of the M light-emitting diode chips on the substrate includes: forming a first conductivity type semiconductor layer on the substrate; forming a light-emitting layer on a side of the first conductivity type semiconductor layer away from the substrate; and forming a second conductivity type semiconductor layer on a side of the light-emitting layer away from the first conductivity type semiconductor layer.

For example, in the manufacturing method of the light-emitting diode substrate provided by an embodiment of the present disclosure, forming the M electrode structures on the side of the epitaxial layer group away from the substrate includes: patterning the epitaxial layer group to expose a part of the first conductivity type semiconductor layer to form M exposed portions; forming M first electrodes on a side of the M exposed portions away from the substrate; forming M second electrodes on a side of the second conductivity type semiconductor layer away from the substrate; forming a passivation layer on a side of the M first electrodes and the M second electrodes away from the substrate; patterning the passivation layer to form first via holes corresponding to the first electrodes and second via holes corresponding to the second electrodes in the passivation layer; forming first electrode pads and second electrode pads on a side of the passivation layer away from the substrate, wherein the first electrode pads are connected with the first electrodes through the first via holes and the second electrode pads are connected with the second electrodes through the second via holes, each of the electrode structures includes one first electrode, one first electrode pad, one second electrode and one second electrode pad.

For example, in the manufacturing method of the light-emitting diode substrate provided by an embodiment of the present disclosure, forming the epitaxial layer group of the M light-emitting diode chips on the substrate further includes: forming an electron blocking layer between the light-emitting layer and the second conductivity type semiconductor layer.

For example, in the manufacturing method of the light-emitting diode substrate provided by an embodiment of the present disclosure, before forming the first conductivity type semiconductor layer on the substrate, the manufacturing method further includes: performing high-temperature treatment on the substrate and cleaning a surface of the substrate; and forming a buffer layer on the substrate.

For example, in the manufacturing method of the light-emitting diode substrate provided by an embodiment of the present disclosure, the first conductivity type semiconductor layer is an n-type semiconductor layer and the second conductivity type semiconductor layer is a p-type semiconductor layer.

For example, in the manufacturing method of the light-emitting diode substrate, the first conductivity type semiconductor layer is of n-type gallium nitride, the second conductivity type semiconductor layer is of p-type gallium nitride, and the buffer layer is of aluminum nitride.

For example, in the manufacturing method of the light-emitting diode substrate provided by an embodiment of the present disclosure, transferring at least part of the N*M light-emitting diode chips corresponding to the N epitaxial layer groups on the transition carrier substrate onto the driving substrate includes: providing a selecting substrate, wherein the selecting substrate includes a plurality of selecting structures; aligning the selecting substrate with the transition carrier substrate, and contacting the plurality of selecting structures with a plurality of light-emitting diode chips to be transferred; aligning a second mask plate with the transition carrier substrate, the second mask plate including a plurality of openings corresponding to the plurality of selecting structures; irradiating light to the transition carrier substrate through the second mask plate to transfer the plurality of light-emitting diode chips to be transferred onto the plurality of selecting structures on the selecting substrate; aligning the selecting substrate and the driving substrate; bonding the plurality of light-emitting diode chips to be transferred on the plurality of selecting structures on the selecting substrate with the driving substrate; and removing the plurality of selecting structures.

For example, in the manufacturing method of the light-emitting diode substrate provided by an embodiment of the present disclosure, the second mask plate includes a light-absorbing material, and light absorption rate of the light-absorbing material is greater than 60%.

For example, in the manufacturing method of the light-emitting diode substrate provided by an embodiment of the present disclosure, the second mask plate includes: a second transparent substrate; and a second light-absorbing pattern layer located on the second transparent substrate and including the plurality of openings, the second light-absorbing pattern layer is made of the light-absorbing material, and the light absorption rate of the light-absorbing material is greater than 60%.

For example, in the manufacturing method of the light-emitting diode substrate provided by an embodiment of the present disclosure, the second mask plate further includes: a second magnetic attraction structure located between the second transparent substrate and the second light-absorbing pattern layer, an orthographic projection of the second magnetic attraction structure on the second transparent substrate and an orthographic projection of the plurality of openings on the second transparent substrate are arranged at intervals.

For example, in the manufacturing method of the light-emitting diode substrate provided by an embodiment of the present disclosure, each of the plurality of selecting structures includes a support portion and a pyrolysis portion located on a side of the support portion away from the transition carrier substrate.

For example, in the manufacturing method of the light-emitting diode substrate provided by an embodiment of the present disclosure, aligning the selecting substrate with the transition carrier substrate and contacting the plurality of selecting structures with the plurality of light-emitting diode chips to be transferred includes: aligning the selecting substrate with the transition carrier substrate in a vacuum environment; applying a force to the selecting substrate to make the pyrolysis portion in each of the plurality of selecting structures adhere to a corresponding one of the plurality of light-emitting diode chips.

For example, in the manufacturing method of the light-emitting diode substrate provided by an embodiment of the present disclosure, irradiating light to the transition carrier substrate through the second mask plate to transfer the plurality of light-emitting diode chips to be transferred onto the plurality of selecting structures on the selecting substrate includes: introducing inert gas between the selecting substrate and the transition carrier substrate after irradiating light to the transition carrier substrate through the second mask plate.

For example, in the manufacturing method of the light-emitting diode substrate provided by an embodiment of the present disclosure, removing the plurality of selecting structures includes: heating in a vacuum environment to melt the pyrolysis portion to remove the plurality of selecting structures.

For example, in the manufacturing method of the light-emitting diode substrate provided by an embodiment of the present disclosure, a material of each of the plurality of selecting structures includes ultraviolet light viscosity reducing adhesive or laser dissociation adhesive, and removing the plurality of selecting structures includes: irradiating light to the selecting substrate to remove the plurality of selecting structures.

For example, in the manufacturing method of the light-emitting diode substrate provided by an embodiment of the present disclosure, each of the plurality of selecting structures includes an elastic material.

For example, in the manufacturing method of the light-emitting diode substrate provided by an embodiment of the present disclosure, a shape of a cross section of each of the plurality of selecting structures cut by a plane perpendicular to the selecting substrate includes a trapezoid.

For example, in the manufacturing method of the light-emitting diode substrate provided by an embodiment of the present disclosure, the driving substrate includes a plurality of second support structures, and a size of each of the plurality of second support structures in a direction perpendicular to the driving substrate is larger than a size of each of the plurality of light-emitting diode chips in the direction perpendicular to the driving substrate.

For example, in the manufacturing method of the light-emitting diode substrate provided by an embodiment of the present disclosure, transferring at least part of the N*M light-emitting diode chips corresponding to the N epitaxial layer groups on the transition carrier substrate onto the driving substrate includes: aligning the transition carrier substrate with the driving substrate, and inserting the plurality of second support structures between two adjacent light-emitting diode chips on the transition carrier substrate; aligning a third mask plate with the transition carrier substrate, wherein the third mask plate includes a plurality of openings corresponding to a plurality of light-emitting diode chips to be transferred; and irradiating light to the transition carrier substrate through the third mask plate to transfer the plurality of light-emitting diode chips to be transferred onto the driving substrate.

For example, in the manufacturing method of the light-emitting diode substrate provided by an embodiment of the present disclosure, transferring the N epitaxial layer groups on the N substrates to the transition carrier substrate includes: sequentially transferring the N epitaxial layer groups on the N substrates to the transition carrier substrate; forming M electrode structures on a side of each of the N epitaxial layer groups away from the transition carrier substrate; dividing each of the N epitaxial layer groups on the transition carrier substrate to form the M light-emitting diode chips together with the M electrode structures.

For example, in the manufacturing method of the light-emitting diode substrate provided by an embodiment of the present disclosure, dividing the N epitaxial layer groups on the transition carrier substrate to form the M light-emitting diode chips together with M electrode structure groups includes: dividing each of the N epitaxial layer groups on the transition carrier substrate to form the M light-emitting diode chips together with M electrode structure groups by adopting an etching process.

For example, in the manufacturing method of the light-emitting diode substrate provided by an embodiment of the present disclosure, forming the epitaxial layer group of M light-emitting diode chips on the substrate includes: forming a first conductivity type semiconductor layer on the substrate; forming a light-emitting layer on a side of the first conductivity type semiconductor layer away from the substrate; and forming a second conductivity type semiconductor layer on a side of the light-emitting layer away from the first conductivity type semiconductor layer.

For example, in the manufacturing method of the light-emitting diode substrate provided by an embodiment of the present disclosure, before forming the first conductivity type semiconductor layer on the substrate, the manufacturing method further includes: performing high-temperature treatment on the substrate and cleaning a surface of the substrate; and forming a buffer layer on the substrate.

For example, in the manufacturing method of the light-emitting diode substrate provided by an embodiment of the present disclosure, the first conductivity type semiconductor layer is an n-type semiconductor layer and the second conductivity type semiconductor layer is a p-type semiconductor layer.

For example, in the manufacturing method of the light-emitting diode substrate provided by an embodiment of the present disclosure, the first conductivity type semiconductor layer is of n-type gallium nitride, the second conductivity type semiconductor layer is of p-type gallium nitride, and the buffer layer is of aluminum nitride.

For example, in the manufacturing method of the light-emitting diode substrate provided by an embodiment of the present disclosure, each of the electrode structures includes a first electrode and J second electrodes, and forming the M electrode structures on a side of each of the epitaxial layer groups away from the substrate includes: patterning each of the epitaxial layer groups to expose part of the first conductivity type semiconductor layer to form M exposed portions, and dividing the second conductivity type semiconductor layer into M*J second conductivity type semiconductor blocks; forming M*J second electrodes on a side of the M*J second conductivity type semiconductor blocks away from the transition carrier substrate; forming a passivation layer on a side of the M*J second electrodes away from the transition carrier substrate; patterning the passivation layer to form M first via holes corresponding to the M exposed portions and M*J second via holes corresponding to the M*J second electrodes in the passivation layer; forming M first electrodes on a side of the M exposed portions away from the substrate through the M first via holes; and forming a first electrode pad and a second electrode pad on a side of the passivation layer away from the transition carrier substrate, wherein the first electrode pad is connected with the first electrode through the first via hole and the second electrode pad is connected with one of the second electrodes through the second via hole, J is a positive integer greater than or equal to 2.

For example, in the manufacturing method of the light-emitting diode substrate provided by an embodiment of the present disclosure, forming the epitaxial layer group of the M light-emitting diode chips on the substrate further includes: forming an electron blocking layer between the light-emitting layer and the second conductivity type semiconductor layer.

For example, in the manufacturing method of the light-emitting diode substrate provided by an embodiment of the present disclosure, forming the epitaxial layer group of the M light-emitting diode chips on the substrate includes: forming the epitaxial layer group of the M light-emitting diode chips on a circular substrate; and cutting the circular substrate into a square or hexagonal substrate along an edge of the epitaxial layer group, a shape of an orthographic projection of the epitaxial layer group on the substrate is square.

For example, in the manufacturing method of the light-emitting diode substrate provided by an embodiment of the present disclosure, transferring the N epitaxial layer groups on the N substrates onto the transition carrier substrate includes: arranging the N epitaxial layer groups of N square or hexagonal substrates densely on the transition carrier substrate.

For example, in the manufacturing method of the light-emitting diode substrate provided by an embodiment of the present disclosure, forming the epitaxial layer group of the M light-emitting diode chips on the substrate includes: cutting the substrate with a circular shape into a square or hexagonal substrate; splicing N square or hexagonal substrates together to form a combination of N substrates; forming epitaxial layer groups of the M*N light-emitting diode chips on the combination of N substrates.

For example, in the manufacturing method of the light-emitting diode substrate provided by an embodiment of the present disclosure, transferring the N epitaxial layer groups on the N substrates to the transition carrier substrate includes: transferring the epitaxial layer groups of the M*N light-emitting diode chips formed on the combination of N substrates to the transition carrier substrate.

For example, in the manufacturing method of the light-emitting diode substrate provided by an embodiment of the present disclosure, the pad includes at least two sub-pads, and each of the sub-pads includes a groove configured to receive an electrode pad of the corresponding light-emitting diode chip.

At least one embodiment of the present disclosure further discloses a light-emitting diode substrate manufactured by any one of the above-mentioned manufacturing method.

For example, in the light-emitting diode substrate provided by an embodiment of the present disclosure, the driving substrate includes a plurality of receiving structures, and a size of each of the plurality of first receiving structures in a direction perpendicular to the driving substrate is smaller than a size of the light-emitting diode chips in the direction perpendicular to the driving substrate.

For example, the light-emitting diode substrate provided by an embodiment of the present disclosure further includes: a plurality of support structures, each of which is located between two adjacent light-emitting diode chips, and a size of each of the plurality of support structures in the direction perpendicular to the driving substrate is larger than a size of the light-emitting diode chips in the direction perpendicular to the driving substrate.

For example, in the light-emitting diode substrate provided by an embodiment of the present disclosure, the driving substrate includes a base substrate and a plurality of driving circuits on the base substrate, each of the plurality of driving circuits includes a pad and is configured to drive a corresponding light-emitting diode chip electrically connected with the pad to emit light, the pad includes at least two sub-pads, and each of the two sub-pads includes a groove configured to receive an electrode pad of the corresponding light-emitting diode chip.

At least one embodiment of the present disclosure further provides a display device including any one of the above-mentioned light-emitting diode substrate.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure without constituting any limitation thereto.

DETAILED DESCRIPTION

Figure 1:
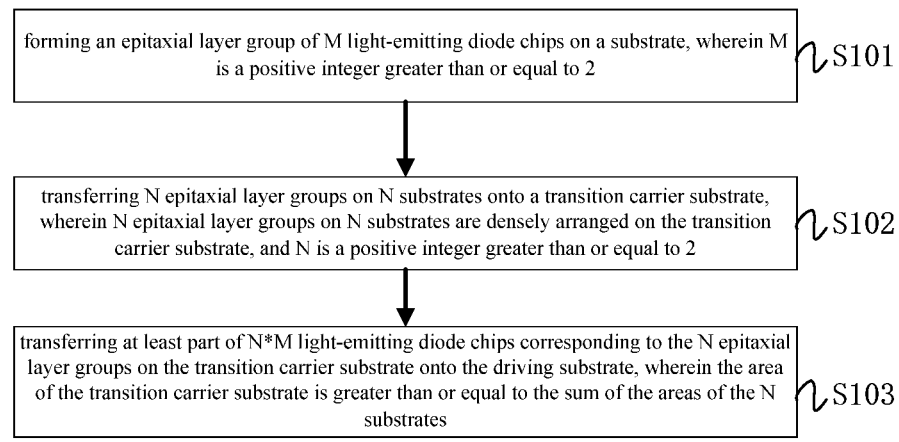
FIG. 1 is a schematic diagram of a manufacturing method of a light-emitting diode substrate according to an embodiment of the present disclosure.

In order to make objectives, technical details and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

The general manufacturing method of a light-emitting diode (LED) substrate includes: firstly, manufacturing LED chips on a substrate; then, transferring the LED chips on the substrate onto a driving substrate by a massive transfer technology. However, because the size of the substrate is small and the size of the driving substrate is large, it is needed to transfer the LED chips on a plurality of substrates to the driving substrate in turn, resulting in low transfer efficiency.

The embodiments of the present disclosure provide a light-emitting diode substrate and a manufacturing method thereof. The manufacturing method of the light-emitting diode substrate includes the following steps: forming an epitaxial layer group of M light-emitting diode chips on a substrate; transferring N epitaxial layer groups on N substrates onto a transition carrier substrate, the N epitaxial layer groups on the N substrates are densely arranged on the transition carrier substrate; and transferring at least part of N*M light-emitting diode chips corresponding to the N epitaxial layer groups on the transition carrier substrate onto a driving substrate. The area of the transition carrier substrate is greater than or equal to the sum of the areas of N substrates, M is a positive integer greater than or equal to 2, and N is a positive integer greater than or equal to 2. Therefore, in the manufacturing method of the light-emitting diode substrate, N epitaxial layer groups on N substrates are firstly transferred to the transition carrier substrate with a larger size, and these epitaxial layer groups are densely arranged on the transition carrier substrate, and then transferring the light-emitting diode chips on the transition carrier substrate to the driving substrate, so that more light-emitting diode chips can be taken and transferred at one time, or even the light-emitting diode chips required by the driving substrate can be taken and transferred at one time, and the taking efficiency and the transfer efficiency can be greatly improved.

Hereinafter, the light-emitting diode substrate and the manufacturing method thereof according to the embodiments of the present disclosure will be described in detail with reference to the accompanying drawings.

Figure 2:
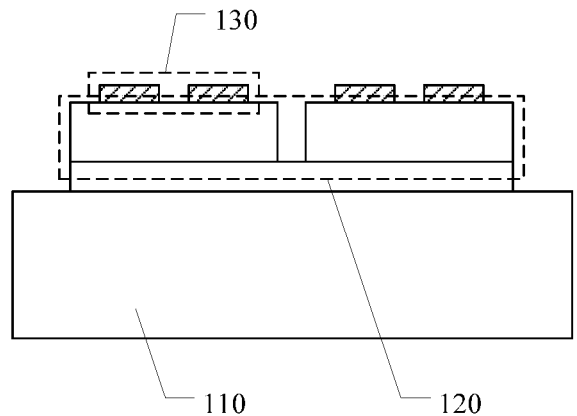
FIGS. 2-4 are schematic steps of a manufacturing method of a light-emitting diode substrate according to an embodiment of the present disclosure.

An embodiment of the present disclosure provides a manufacturing method of a light-emitting diode substrate. FIG. 1 is a schematic diagram of a manufacturing method of a light-emitting diode substrate according to an embodiment of the present disclosure. FIGS. 2-4 are schematic steps of a manufacturing method of a light-emitting diode substrate according to an embodiment of the present disclosure.

As illustrated by FIG. 1, the manufacturing method of the light-emitting diode substrate includes the following steps S101-S103.

S101: forming an epitaxial layer group of M light-emitting diode chips on a substrate, wherein M is a positive integer greater than or equal to 2.

For example, FIG. 2 illustrates a substrate and an epitaxial layer group on the substrate formed by the manufacturing method according to an embodiment of the present disclosure. As illustrated by FIG. 2, an epitaxial layer group 120 is formed on the substrate 110. For example, the epitaxial layer group can include epitaxial layers such as a first conductivity type semiconductor layer, a light-emitting layer and a second conductivity type semiconductor layer, which are grown in sequence, and these epitaxial layers can constitute the epitaxial layer group 120 of the M light-emitting diode chips. It should be noted that M can be a positive integer greater than 1000 or a positive integer greater than 10000.

S102: transferring N epitaxial layer groups on N substrates onto a transition carrier substrate, wherein N epitaxial layer groups on N substrates are densely arranged on the transition carrier substrate, and N is a positive integer greater than or equal to 2.

Figure 3A:
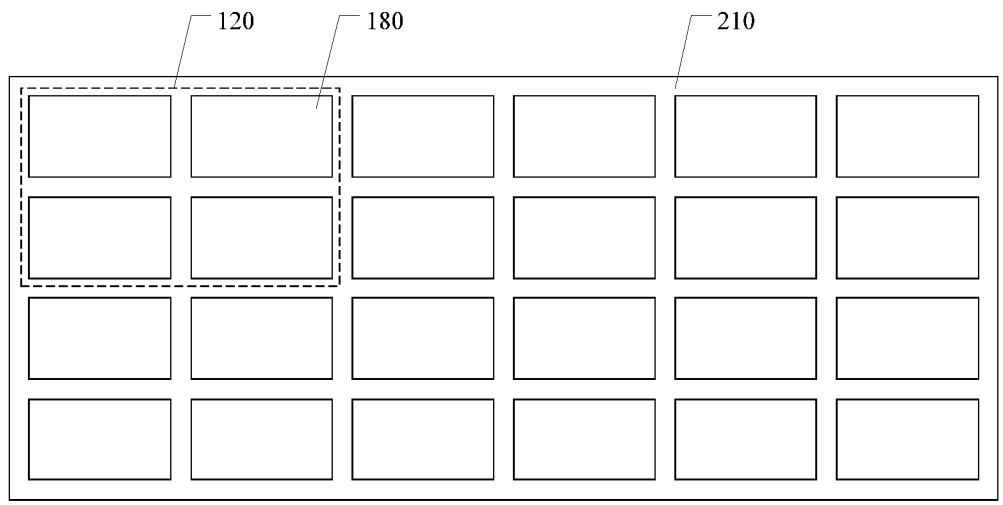
Figure 3B:
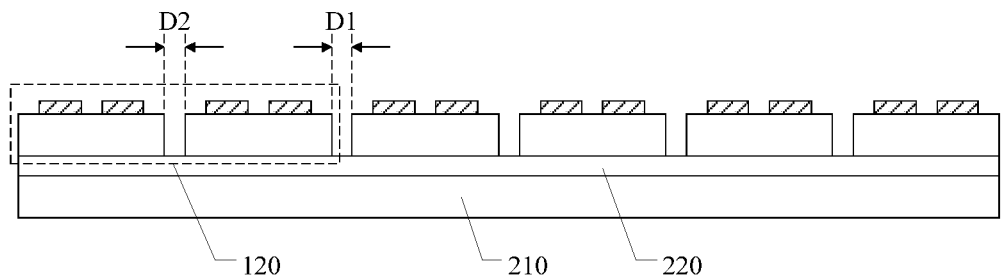
Figure 4:
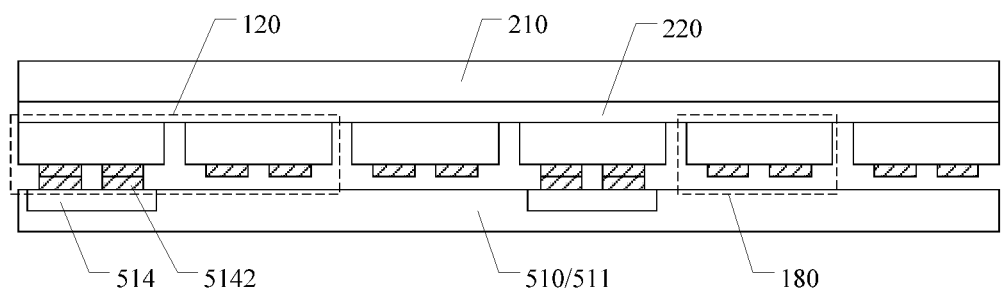

For example, FIG. 3A illustrates a schematic plan view of a transition carrier substrate and an epitaxial layer group on the transition carrier substrate formed by the manufacturing method according to an embodiment of the present disclosure; FIG. 3B illustrates a schematic section view of a transition carrier substrate and epitaxial layer groups on the transition carrier substrate formed by the manufacturing method according to an embodiment of the present disclosure. As illustrated by FIGS. 3A and 3B, six epitaxial layer groups 120 on six substrates are transferred onto the transition carrier substrate 210, and the six epitaxial layer groups 120 are densely arranged on the transition carrier substrate 210. Of course, for clear explanation, only six substrates are illustrated in FIG. 3, but the specific value of N in the embodiment of the present disclosure includes but is not limited thereto.

It should be noted that the above-mentioned "densely arranged" means that the distance between two adjacent epitaxial layer groups is approximately equal to the distance between two adjacent LED chips formed after the epitaxial layer groups are divided. In addition, the above-mentioned "transferring N epitaxial layer groups on N substrates onto a transition carrier substrate" includes a case that transferring N epitaxial layer groups on N substrates that are not divided onto the transition carrier substrate, and also includes a case that transferring N epitaxial layer groups on N substrates that are divided (the divided N epitaxial layer groups can be N*M light-emitting diode chips) to the transition carrier substrate.

S103: transferring at least part of N*M light-emitting diode chips corresponding to the N epitaxial layer groups on the transition carrier substrate onto the driving substrate, wherein the area of the transition carrier substrate is greater than or equal to the sum of the areas of the N substrates.

For example, as illustrated by FIG. 4, transferring at least part of N*M light-emitting diode chips 180 corresponding to the N epitaxial layer groups 120 on the transition carrier substrate 210 onto the driving substrate 510.

It should be noted that when transferring N epitaxial layer groups on N substrates to the transition carrier substrate, the epitaxial layer groups on different substrates can be divided into different numbers of LED chips, that is, the specific values of M on different substrates can be different, and M is used here only for the purpose of explaining the present disclosure more clearly. For example, the specific value of N can be 3. The epitaxial layer group on the first substrate can be divided into M1 light-emitting diode chips, the epitaxial layer group on the second substrate can be divided into M2 light-emitting diode chips, and the epitaxial layer group on the third substrate can be divided into M3 light-emitting diode chips. In this case, the above N*M can be M1+M2+M3.

In the light-emitting diode substrate according to the embodiment of the present disclosure, and in the manufacturing method of the light-emitting diode substrate, the N epitaxial layer groups on the N substrates are firstly transferred onto a transition carrier substrate with larger size, and these epitaxial layer groups are densely arranged on the transition carrier substrate; then, at least part of the light-emitting diode chips on the transition carrier substrate are selected and transferred on the driving substrate. Because the N epitaxial layer groups on the N substrates are densely arranged on the transition carrier substrate, during the process of transferring at least part of N*M light-emitting diode chips corresponding to the N epitaxial layers on the transition carrier substrate to the driving substrate, the light-emitting diode chips on the transition carrier substrate are uniformly distributed, so that more light-emitting diode chips can be transferred at one time (more than the number of light-emitting diode chips that can be transferred by one substrate), even the LED chips of the same color required by the driving substrate can be taken at one time, that is, the LED chips of the same color on the driving substrate can be taken only by one transfer process. Therefore, the manufacturing method of the light-emitting diode substrate can greatly improve the taking efficiency and transfer efficiency.

In some example, the LED substrate according to the embodiment of the present disclosure can be used as a display substrate for directly displaying, and can also be used as a backlight plate for provide a backlight source. In the case where the LED substrate according to the embodiment of the present disclosure is used as a backlight plate, the above-mentioned substrate does not need to be peeled off, thereby saving the process steps and reducing the cost. In addition, in the case where the light-emitting diode substrate is used as a backlight plate, the light-emitting diode chips in the light-emitting diode substrate can be light-emitting diode chips of the same color.

In some examples, as illustrated by FIG. 3B, on the transition carrier substrate 210, the distance D1 between two adjacent epitaxial layer groups 120 is approximately equal to the distance D2 between two adjacent light-emitting diode chips 180. When the above N value is large (for example, greater than or equal to 4), N epitaxial layer groups on the transition carrier substrate can be arranged in an array.

For example, as illustrated by FIG. 3A, the outline of one epitaxial layer group 120 can be approximately rectangular, and N epitaxial layer groups 120 on the transition carrier substrate can be arrayed to form a larger rectangle.

In some examples, as illustrated by FIG. 4, the shape of the transition carrier substrate 210 is approximately the same as that of the driving substrate 510, and the area of the transition carrier substrate 210 is approximately equal to that of the driving substrate 510. In this case, according to the manufacturing method of the light-emitting diode substrate, the light-emitting diode chips of the same color required by the driving substrate can be transferred onto the driving substrate from the transition carrier substrate at one time, thereby greatly improving the taking efficiency and the transfer efficiency.

For example, as illustrated by FIG. 4, in the case where the transition carrier substrate 210 has the same shape and area as the driving substrate 510, the transition carrier substrate 210 carrying the first color LED chips can be firstly aligned with the driving substrate 510, and then a plurality of first color LED chips (e.g., red LED chips) on the transition carrier substrate 210 can be transferred to a plurality of driving circuits corresponding to the plurality of first color LED chips on the driving substrate 510 at one time, then, the transition carrier substrate 210 carrying the second color LED chips (e.g., green LED chips) is aligned with the driving substrate 510, and then the second color LED chips on the transition carrier substrate 210 are transferred to a plurality of driving circuits corresponding to the second color LED chips on the driving substrate 510 at one time; finally, the transition carrier substrate 210 carrying the third color LED chips (e.g., blue LED chips) is aligned with the driving substrate 510, and then a plurality of third color LED chips (e.g., blue LED chips) on the transition carrier substrate 210 can be transferred to a plurality of driving circuits corresponding to the third color LED chips on the driving substrate 510 at one time. Therefore, in the manufacturing method of the light-emitting diode substrate, light-emitting diode chips of one color can be transferred onto the driving substrate through one transfer process, and all the light-emitting diode chips can be transferred onto the driving substrate through three transfer processes in total, so that the taking efficiency and the transfer efficiency can be greatly improved.

In some examples, as illustrated by FIG. 4, the driving substrate 510 includes a base substrate 511 and a plurality of driving circuits 514 located on the base substrate 511, each driving circuit 514 includes a pad 5142; each driving circuit 514 is configured to drive a LED chip 180 electrically connected to the pad 5142 to emit light. In this case, the manufacturing method of the light-emitting diode substrate further includes: bonding the light-emitting diode chip 180 transferred on the driving substrate 510 with the pad 5142 of a corresponding driving circuit 514 by a bonding process. Therefore, the driving substrate can drive the light-emitting diode chip to emit light or display.

In some examples, as illustrated by FIG. 4, the number of driving circuits 514 on the driving substrate 510 is approximately the same as the number of light-emitting diode chips 180 on the transition carrier substrate 210. The positions of the driving circuits 514 on the driving substrate 510 and the positions of the LED chips 180 on the transition carrier substrate 210 are arranged in one-to-one correspondence. Therefore, after the transition carrier substrate and the driving substrate are aligned, any number of LED chips which need to be transferred on the transition carrier substrate can be transferred onto the driving substrate at one time.

In some examples, the above-mentioned step of transferring N epitaxial layer groups on N substrates onto the transition carrier substrate (i.e., S102) includes: forming a first adhesive layer 220 on the transition carrier substrate 210; and transferring the N epitaxial layer groups 120 on the N substrates 110 to a side of the first adhesive layer 220 away from the transition carrier substrate 210. Therefore, the light-emitting diode substrate can transfer the light-emitting diode chips 180 to be transferred onto the driving substrate 510 by simply detaching the first adhesive layer 220 or reducing the viscosity of the first adhesive layer 220, thereby improving the transfer efficiency.

For example, the material of the first adhesive layer 220 includes ultraviolet light viscosity reducing adhesive or laser dissociation adhesive; in the case where the first adhesive layer 220 is ultraviolet light viscosity reducing adhesive, the viscosity of the corresponding region of the first adhesive layer 220 can be reduced by irradiating ultraviolet light to a part region of the transition carrier substrate 210, so that the LED chips 180 in this region fall off and are transferred on the driving substrate. In the case where the first adhesive layer 220 is a laser dissociation adhesive, the corresponding region of the first adhesive layer 220 can be dissociated by irradiating a laser to partial region of the transition carrier substrate 210, so that the LED chips 180 in the region fall off and are transferred onto the driving substrate.

For example, when transferring at least part of N*M LED chips corresponding to N epitaxial layer groups on the transition carrier substrate to the driving substrate, the transition carrier substrate can be arranged above the driving substrate according to the direction of gravity, that is, the transition carrier substrate and the driving substrate are arranged in sequence along the direction of gravity, so that the light-emitting diode chips to be transferred on the transition carrier substrate can be transferred onto the driving substrate by gravity, matching with the ultraviolet light viscosity reducing adhesive or laser dissociation adhesive.

It should be noted that the first adhesive layer includes, but is not limited to the above-mentioned ultraviolet light viscosity reducing adhesive or laser dissociation adhesive, and the first adhesive layer can also be pyrolytic adhesive; in this case, the corresponding region of the first adhesive layer can be dissociated by heating partial region of the transition carrier substrate, so that the LED chips in the region fall off and are transferred onto the driving substrate.

In some examples, the size of the substrate 110 described above is greater than or equal to 2 inches. That is to say, the above-mentioned substrate is a single crystalline substrate or wafer, rather than a light-emitting diode chip with a large size and a plurality of sub-light-emitting structures.

For example, the above substrate can be a sapphire substrate. Of course, embodiments of the present disclosure include but are not limited thereto, and the above substrate can also be other suitable substrates such as silicon carbide substrate.

Figure 5A:
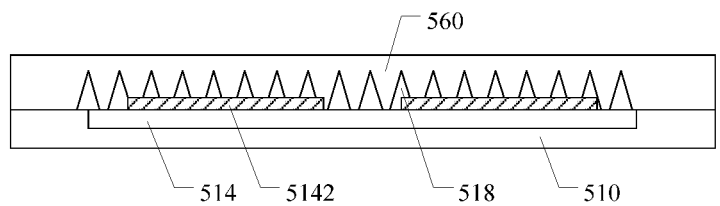
FIGS. 5A-5C are schematic steps of a bonding process according to an embodiment of the present disclosure.
Figure 5B:
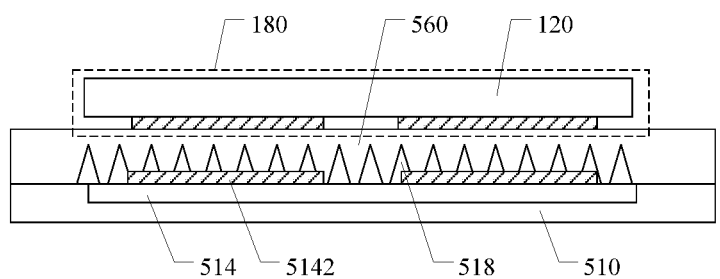
Figure 5C:
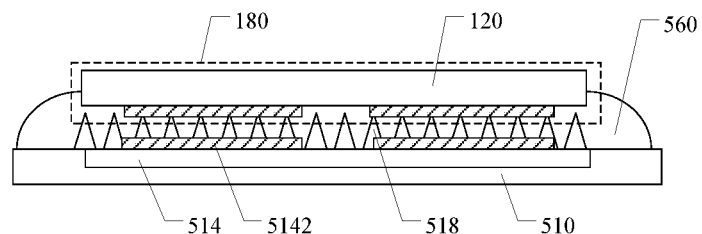

FIGS. 5A-5C are schematic steps of a bonding process according to an embodiment of the present disclosure. As illustrated by FIG. 5A, the driving substrate 510 also includes a plurality of conductive bumps 518, which are located on a side of the pad 5142 away from the base substrate 511, the orthographic projection of each pad 5142 on the base substrate 511 is overlapped with the orthographic projection of at least one of the plurality of conductive bumps 518 on the base substrate 511, the manufacturing method of the light-emitting diode substrate also includes: coating an organic insulating adhesive 560 on the driving substrate 510 before transferring at least part of N*M light-emitting diode chips 180 corresponding to the N epitaxial layer groups 120 on the transition carrier substrate 210 onto the driving substrate 510; bonding the LED chip 180 transferred on the driving substrate 510 with the pad 5142 of the corresponding driving circuit 514 by a bonding process includes, as illustrated by FIGS. 5B-5C, performing thermal reflow on the driving substrate 510 and evaporating the solvent in the organic insulating adhesive 560 to bond the LED chip 180 and the pad 5142 together.

It should be noted that although the plurality of conductive bumps 518 illustrated in FIGS. 5A-5C are arranged all over the entire driving substrate 510, the embodiments of the present disclosure include but are not limited thereto, and the conductive bumps 518 can also be only arranged above the pad 5142. In addition, the plurality of conductive bumps are insulated from each other.

For example, the material of the conductive bump can be metal, alloy or other conductive materials. For example, the material of the conductive bump can be any one of aluminum, silver, molybdenum, copper and gold or an alloy composed of at least two of them. Of course, embodiments of the present disclosure include but are not limited thereto, and other conductive materials can also be used for the conductive bumps. For example, the size of the orthographic projection of the conductive bump on the driving substrate is smaller than the size of the orthographic projection of the pad on the driving substrate.

For example, the base substrate can be a rigid substrate or a flexible substrate, and embodiments of the present disclosure are not limited here. In addition, the material of the base substrate can be glass, quartz or plastic.

For example, the shape of the cross section of the conductive bump cut by a plane perpendicular to the driving substrate includes arch, single taper, trapezoid, boss, or multi-taper, etc.

In some examples, the conductive bumps described above can be manufactured by nano-imprinting process. For example, the nano-imprinting manufacturing method of the conductive bump can include: forming a conductive layer (for example, forming a metal layer by a deposition process); coating imprinting resist material on the conductive layer; adopting a template with a concave structure to imprint the imprinting resist material; adopting ultraviolet light to irradiate and cure the imprinting resist material; demoulding; adopting a dry etching process to copy the structure formed by imprinting resist material on the template to the conductive layer. Of course, the conductive bumps according to the embodiments of the present disclosure can also be made by other methods, such as exposure etching, wet etching, electrochemical deposition, and the like.

It should be noted that in order to avoid the oxidation of the conductive layer, a conductive anti-oxidation layer can be covered after the conductive bumps are prepared, but the anti-oxidation layer between the conductive bumps needs to be removed to ensure that the conductive bumps are insulated from each other.

Figure 6A:
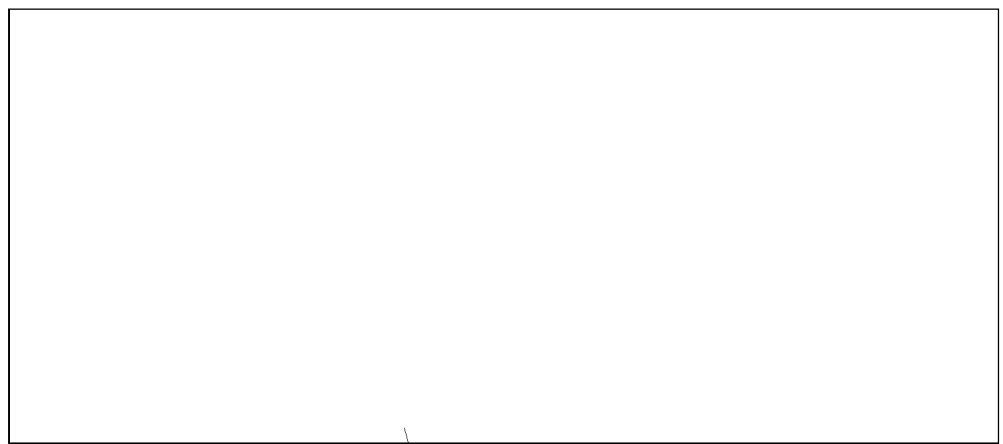
FIGS. 6A and 6B are schematic steps of a manufacturing method of a first adhesive layer according to an embodiment of the present disclosure.
Figure 6B:
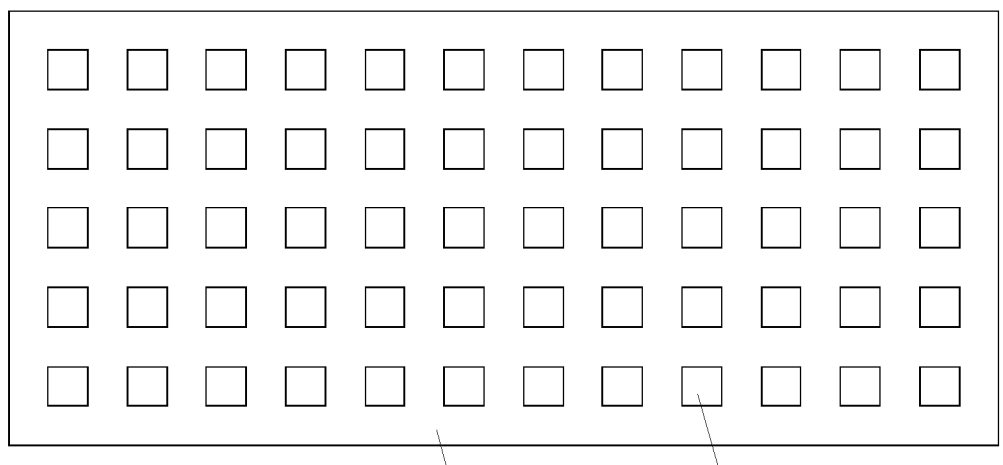

FIGS. 6A and 6B are schematic steps of a manufacturing method of a first adhesive layer according to an embodiment of the present disclosure. As illustrated by FIGS. 6A-6B, forming a first adhesive layer 220 on the transition carrier substrate 210 includes: coating a first adhesive material layer 221 on the transition carrier substrate 210; and patterning the first adhesive material layer 221 to form a plurality of through holes 225 penetrating through the first adhesive material layer 221. The first adhesive material layer 221 including the plurality of through holes 225 is the first adhesive layer 220, and the size of the orthographic projection of each through hole 225 on the transition carrier substrate 210 is smaller than the size of the orthographic projection of the light-emitting diode chip 180 on the transition carrier substrate 210.

For example, as illustrated by FIG. 6B, the plurality of through holes 225 are arranged in an array on the transition carrier substrate 210.

For example, as illustrated by FIG. 6B, the shape of each through hole 225 can be rectangular or circular. Of course, the embodiments of the present disclosure include but are not limited thereto, and the shapes of the through holes can also adopt other shapes.

Figure 6C:
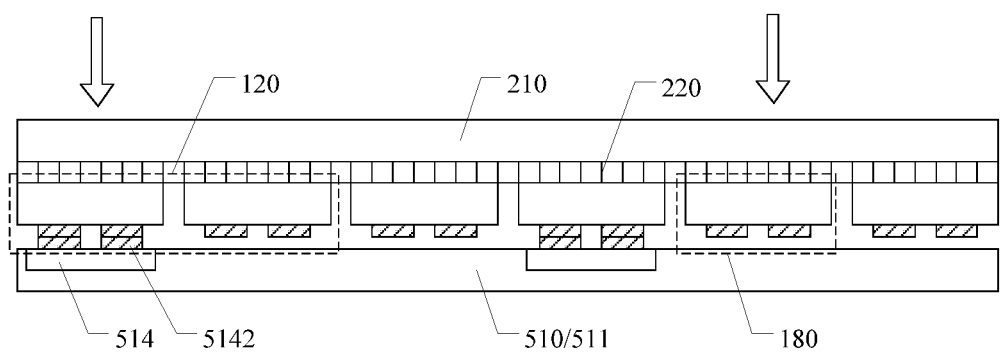
FIG. 6C is a schematic diagram of transferring a light-emitting diode chip on a transition carrier substrate onto a driving substrate according to an embodiment of the present disclosure.

FIG. 6C is a schematic diagram of transferring a light-emitting diode chip on a transition carrier substrate onto a driving substrate according to an embodiment of the present disclosure. As illustrated by FIG. 6C, in the case where the first adhesive layer 220 adopts the structure illustrated in FIG. 6B, in the case where the transition carrier substrate 210 is exposed or heated, the plurality of through holes 225 in the first adhesive layer 220 can effectively prevent light or heat from affecting non-target area regions, thereby improving the accuracy and improving the product yield.

FIG. 7-FIG. 14 are schematic steps of another manufacturing method of a light-emitting diode substrate according to an embodiment of the present disclosure.

Figure 7:
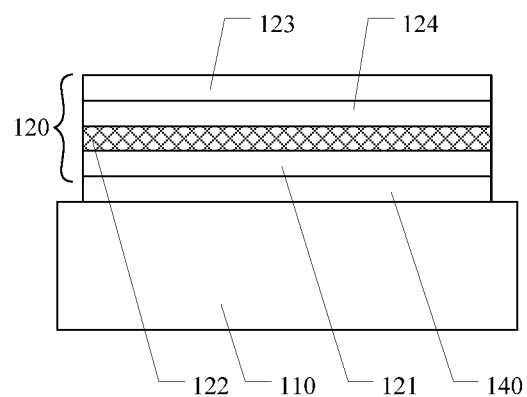
FIG. 7-FIG. 14 are schematic steps of another manufacturing method of a light-emitting diode substrate according to an embodiment of the present disclosure.
Figure 8:
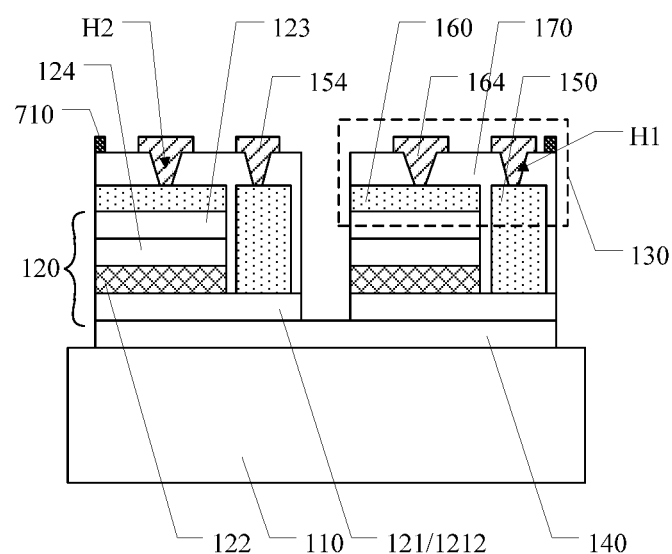

In some examples, as illustrated by FIGS. 7 and 8, after forming the epitaxial layer group 120 of M light-emitting diode chips on the substrate 110, the manufacturing method of the light-emitting diode substrate further includes: forming M electrode structures 130 on a side of the epitaxial layer group 120 away from the substrate 110; and dividing the epitaxial layer group 120 and the M electrode structures 130 to form the M light-emitting diode chips 180. That is, in this example, the M electrode structures are formed on the substrate, and the epitaxial layer group and M electrode structures are also divided on the substrate to form M light-emitting diode chips.

In some examples, as illustrated by FIG. 7, forming the epitaxial layer group 120 of M light-emitting diode chips 180 on the substrate 110 includes: forming a first conductivity type semiconductor layer 121 on the substrate 110; forming a light-emitting layer 122 on a side of the first conductivity type semiconductor layer 121 away from the substrate 110; and forming a second conductivity type semiconductor layer 123 on a side of the light-emitting layer 122 away from the first conductivity type semiconductor layer 121.

For example, the first conductivity type semiconductor layer 121 can be an n-type semiconductor layer, and the second conductivity type semiconductor layer 123 can be a p-type semiconductor layer. Of course, embodiments of the present disclosure include, but are not limited thereto, the first conductivity type semiconductor layer 121 can be a p-type semiconductor layer, and the second conductivity type semiconductor layer 123 can be an n-type semiconductor layer.

For example, materials of the first conductivity type semiconductor layer 121 and the second conductivity type semiconductor layer 123 can be gallium nitride materials. For example, the first conductivity type semiconductor layer 121 can be an n-type gallium nitride layer, and the second conductivity type semiconductor layer 123 can be a p-type gallium nitride layer. Of course, the embodiments of the present disclosure include but are not limited thereto, and other suitable semiconductor materials can be selected for the materials of the first conductivity type semiconductor layer 121 and the second conductivity type semiconductor layer 123.

For example, in the case where the above-mentioned light-emitting diode chip is used to emit blue light or green light, the above-mentioned gallium nitride (GaN) can be used for the first conductivity type semiconductor layer and the second conductivity type semiconductor layer. In addition, in the case where the light-emitting diode chip is used for emitting red light, gallium phosphide (GaP), aluminum gallium arsenide (AlGaAs) or aluminum gallium indium phosphide (AlGaInP) can be used for the first conductivity type semiconductor layer and the second conductivity type semiconductor layer. Of course, embodiments of the present disclosure include but are not limited thereto, and the first conductivity type semiconductor layer and the second conductivity type semiconductor layer can also be made of other suitable materials.

For example, the substrate can be a sapphire substrate. For another example, the sapphire substrate can also include a patterned sapphire substrate (PSS) layer. On the one hand, the patterned sapphire layer can effectively reduce the dislocation density of the first conductivity type semiconductor layer (i.e., epitaxial layer), thereby reducing non-radiative recombination, reducing reverse leakage current and prolonging the service life of the LED chip. On the other hand, the light emitted by the light-emitting layer can be scattered in the patterned sapphire layer for many times, which changes the exit angle of the totally reflected light, thus improving the light extraction efficiency. Of course, embodiments of the present disclosure include but are not limited thereto, and the LED chip may not be provided with the above-mentioned patterned sapphire layer. It should be noted that the substrate can also adopt other substrates, such as silicon carbide substrate.

For example, the patterned sapphire layer can be manufactured by a dry etching process. Of course, the embodiments of the present disclosure include but are not limited thereto, and the above-mentioned patterned sapphire layer can also be manufactured by other suitable methods.

In some examples, as illustrated by FIG. 7, forming the epitaxial layer group 120 of M light-emitting diode chips 180 on the substrate 110 further includes: forming an electron blocking layer 124 between the light-emitting layer 122 and the second conductivity type semiconductor layer 123. The electron blocking layer 124 can block electrons from entering the second conductivity type semiconductor layer 123 to restrict carriers from flowing through, thereby improving light-emitting efficiency and light-emitting intensity.

The electron blocking layer 124 can be p-type aluminum gallium nitride (p-AlGaN), for example. Of course, embodiments of the present disclosure include but are not limited thereto, and the electron blocking layer 124 can also be of other suitable materials.

In some examples, as illustrated by FIG. 7, before forming the first conductivity type semiconductor layer 121 on the substrate 110, the manufacturing method further includes: performing high temperature treatment on the substrate 110 and cleaning the surface of the substrate 110; and forming a buffer layer 140 on the substrate 110. Then, forming the first conductivity type semiconductor layer 121 on a side of the buffer layer 140 away from the substrate 110. By treating and cleaning the substrate at high temperature and forming a buffer layer on the substrate, the degree of lattice matching can be improved, which is convenient for the subsequent growth of the epitaxial layer group.

For example, in the case where the first conductivity type semiconductor layer is n-type gallium nitride and the second conductivity type semiconductor layer is p-type gallium nitride, the buffer layer is aluminum nitride. Of course, the embodiments of the present disclosure include but are not limited thereto, and the buffer layer can be made of any material that can improve the degree of lattice matching.

In some examples, as illustrated by FIG. 8, forming M electrode structures on the side of the epitaxial layer group away from the substrate includes: patterning the epitaxial layer group 120 to expose part of the first conductivity type semiconductor layer 121 to form M exposed portions 1212; forming M first electrodes 150 on a side of the M exposed portions 1212 away from the substrate 110; forming M second electrodes 160 on a side of the second conductivity type semiconductor layer 123 away from the substrate 110; forming a passivation layer 170 on a side of the M first electrodes 150 and the M second electrodes 160 away from the substrate 110; patterning the passivation layer 170 to form a first via hole H1 corresponding to the first electrode 150 and a second via hole H2 corresponding to the second electrode 160 in the passivation layer 170; forming a first electrode pad 154 and a second electrode pad 164 on a side of the passivation layer 170 away from the substrate 110. The first electrode pad 154 is connected with the first electrode 150 through the first via hole H1, and the second electrode pad 164 is connected with the second electrode 160 through the second via hole H2. Each of the electrode structures 130 includes one first electrode 150, one first electrode pad 154, one second electrode 160 and one second electrode pad 164.

For example, in the manufacturing method of the light-emitting diode substrate, after patterning the epitaxial layer group 120 to expose part of the first conductivity type semiconductor layer 121 to form M exposed portions 1212, a first conductive layer can be formed on a side of the second conductivity type semiconductor layer 123 and the exposed portions 1212 away from the substrate 110, and then the first conductive layer is patterned to form the first electrode 150 and the second electrode 160. The first electrode 150 is arranged in contact with the exposed portion 1212, and the second electrode 160 is arranged in contact with the second conductivity type semiconductor layer 123, and the first electrode 150 and the second electrode 160 are insulated from each other.

For example, in the manufacturing method of the light-emitting diode substrate, after patterning the passivation layer 170 to form the first via hole H1 corresponding to the first electrode 150 and the second via hole H2 corresponding to the second electrode 160 in the passivation layer 170, a second conductive layer can be formed on the side of the passivation layer 170 away from the substrate 110, and then the second conductive layer is patterned to form the first electrode pad 154 and the second electrode pad 164 described above.

For example, dividing the epitaxial layer group 120 and the M electrode structures 130 to form M light-emitting diode chips 180 includes: dividing the epitaxial layer group 120 and the M electrode structures 130 to form M light-emitting diode chips 180 by an etching process. Of course, the embodiments of the present disclosure include but are not limited thereto, and other processes can be used for segmentation.

For example, as illustrated by FIG. 8, while forming the epitaxial layer group 120 on the substrate 110, a first alignment mark 710 can be formed on the substrate 110. The embodiment of the present disclosure does not limit the manufacturing method of the first alignment mark.

Figure 9:
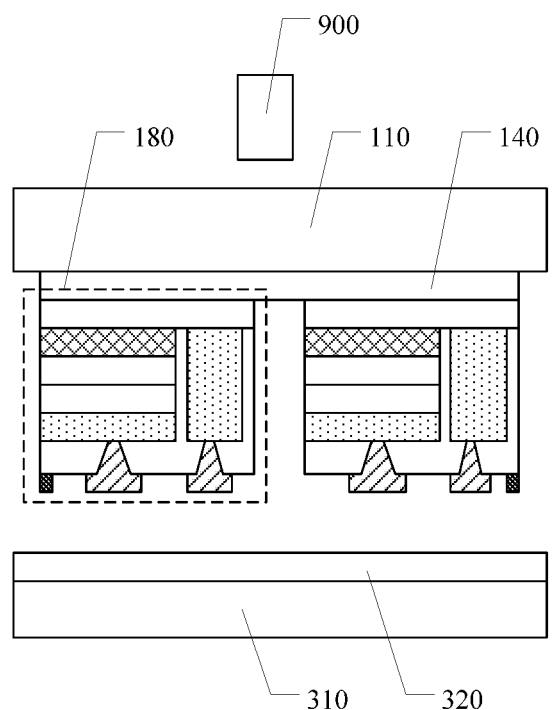
Figure 10:
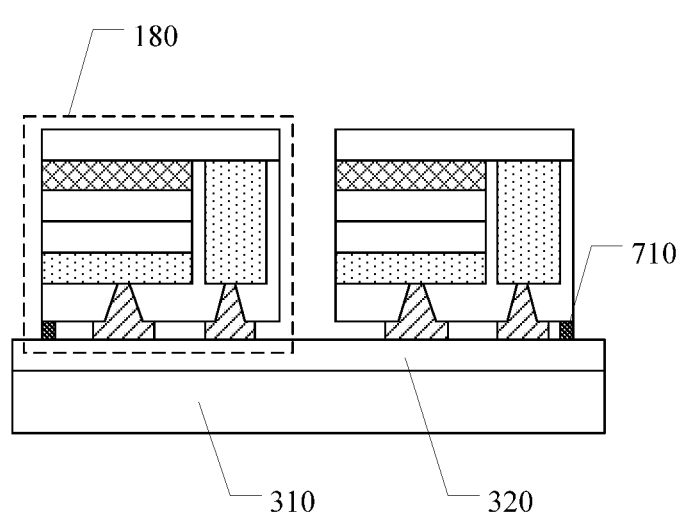
Figure 11:
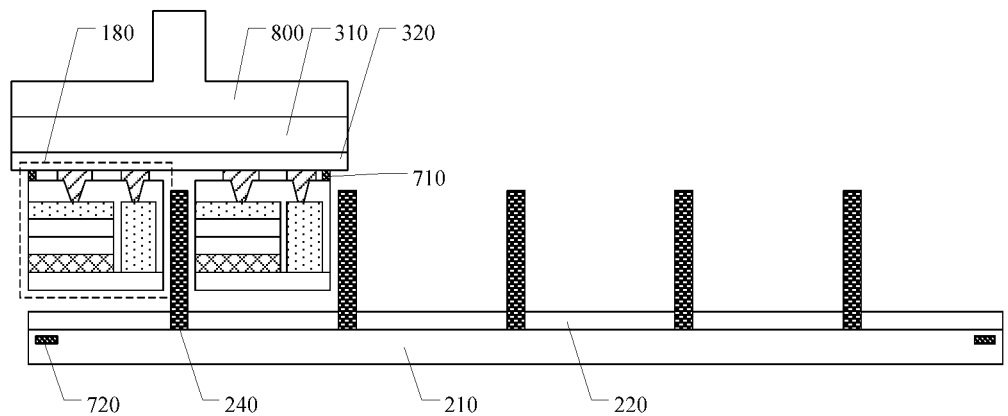

In some examples, as illustrated by FIGS. 9-11, transferring the N epitaxial layer groups 120 on the N substrates 110 onto the transition carrier substrate 210 includes: transferring the substrate 110 on which the M light-emitting diode chips 180 are formed onto a transfer substrate 310; peeling off the substrate 110 from the transfer substrate 310; and transferring the N*M light-emitting diode chips 180 on the N transfer substrates 310 onto the transition carrier substrate 210, the area of the transfer substrate 310 is approximately equal to the area of the substrate 110. That is to say, in the manufacturing method of the light-emitting diode substrate, the light-emitting diode chips on the substrate are firstly transferred onto a transfer substrate with approximately equal area, and then the N*M light-emitting diode chips on the N transfer substrates are transferred onto the transition carrier substrate, thereby realizing the transfer of N epitaxial layer groups on N substrates onto the transition carrier substrate. In addition, after two transferring processes, the electrode structure of the light-emitting diode chip on the transition carrier substrate is located at the side of the light-emitting diode chip away from the transition carrier substrate. Therefore, the light-emitting diode chip on the transition carrier substrate can be conveniently and directly transferred from the transition carrier substrate to the driving substrate, and the electrode structure of the light-emitting diode chip can also be conveniently bonded with the pad on the driving substrate.

In some examples, as illustrated by FIG. 9, transferring the substrate 110 on which M light-emitting diode chips 180 are formed onto the transfer substrate 310 includes: coating a second adhesive layer 320 on the transfer substrate 310; and transferring the substrate 110 on which M light-emitting diode chips 180 are formed to the side of the second adhesive layer 320 away from the transfer substrate 310. In the manufacturing method of the light-emitting diode substrate, M light-emitting diode chips 180 can be adhered to the transfer substrate 310 through the second adhesive layer 320, and in this case, the electrode structure 130 of the light-emitting diode chip 180 is located at a side of the light-emitting diode chip 180 close to the second adhesive layer 320. In addition, because the M light-emitting diode chips 180 are adhered to the transfer substrate 310 by the second adhesive layer 320, the transfer can be conveniently performed in the subsequent transfer step, thereby improving the transfer efficiency and reducing the cost.

In some examples, as illustrated by FIGS. 9 and 10, in the process of transferring the substrate 110 on which M light-emitting diode chips 180 are formed to the transfer substrate 310, the substrate 110 and the transfer substrate 310 are aligned first; then, the substrate 110 is moved toward the transfer substrate 310 and contacted with the second adhesive layer 320. In this case, the second adhesive layer 320 can adhere the LED chip 180 on the substrate 110.

For example, as illustrated by FIG. 10, after the substrate 110 on which M light-emitting diode chips 180 are formed is transferred onto the transfer substrate 310, the first alignment mark 710 formed on the substrate 110 is also transferred to the transfer substrate 310.

In some examples, the material of the second adhesive layer 320 includes ultraviolet light viscosity reducing adhesive or laser dissociation adhesive. After the N*M LED chips 180 on the N transfer substrates 310 are transferred to the transition carrier substrate 210, the transfer substrate 310 can be irradiated with light to reduce the viscosity of the second adhesive layer 320, so as to remove the transfer substrate 310. Therefore, the manufacturing method of the light-emitting diode substrate can conveniently transfer the light-emitting diode chip 180 and remove the transfer substrate 310.

For example, in the case where the second adhesive layer 320 is ultraviolet light viscosity reducing adhesive, the adhesive of the second adhesive layer 320 can be reduced by irradiating ultraviolet light to the transfer substrate 310, so that the LED chip 180 on the transfer substrate 310 falls off and is transferred on the driving substrate 510. In the case where the second adhesive layer 320 is a laser dissociation adhesive, the second adhesive layer 320 can be dissociated by irradiating the transfer substrate 310 with laser, so that the LED chip 180 on the transfer substrate 310 falls off and is transferred on the driving substrate 510.

It should be noted that the materials of the second adhesive layer according to the embodiment of the present disclosure include but are not limited to the above-mentioned ultraviolet light viscosity reducing adhesive and laser dissociation adhesive, and the second adhesive layer can also be pyrolytic adhesive.

In some examples, as illustrated by FIGS. 9 and 10, peeling off the substrate 110 from the transfer substrate 310 can include thinning the substrate 110 from a side of the substrate 110 away from the transfer substrate 310 by a thinning process, and then peeling off the thinned substrate 110 from the transfer substrate 310 by a laser lift-off (LLO) process.

For example, as illustrated by FIG. 9, a laser light source 900 can be used to irradiate laser light from the side of the substrate 110 away from the transfer substrate 310, so that the buffer layer 140 is decomposed, thereby peeling off the substrate 110. It should be noted that the laser light source 900 can be a surface light source or a line light source. In the case where the laser light source 900 is a line light source, the exposure can be completed by moving the laser light source 900 to scan.

In some examples, as illustrated by FIG. 11, the transition carrier substrate 210 includes a plurality of first support structures 240, and the size of each first support structure 240 in the direction perpendicular to the transition carrier substrate 210 is larger than the size of the light-emitting diode chips 180 in the direction perpendicular to the transition carrier substrate 210. Transferring N*M light-emitting diode chips 180 on N transfer substrates 310 to the transition carrier substrate 210 includes: sequentially aligning the N transfer substrates 310 with the transition carrier substrate 210 so that the plurality of first support structures 240 are located between two adjacent light-emitting diode chips 180 on the transfer substrate 310. In this case, the first support structure 240 can not only support the space between the transition carrier substrate 210 and the transfer substrate 310 which are oppositely arranged, but also make the space between the transition carrier substrate 210 and the transfer substrate 310 uniform, and also play a buffering role.

For example, the size range of each first support structure 240 in the direction perpendicular to the transition carrier substrate 210 is 3-10 microns. Of course, embodiments of the present disclosure include but are not limited thereto.

For example, as illustrated by FIG. 11, a transfer device 800 (e.g., a transfer head) can be used to move the transfer substrate 310 above the transition carrier substrate 210 to align with the transition carrier substrate 210.

In some examples, as illustrated by FIG. 11, after the transfer substrate 310 is aligned with the transition carrier substrate 210, the transfer substrate 310 can move toward the transition carrier substrate 210 and contact with the first adhesive layer 220 on the transition carrier substrate 210. The first adhesive layer 220 can adhere the light-emitting diode chip 180 on the transfer substrate 310. Then, by irradiating ultraviolet light or laser to the transfer substrate 310 to reduce the viscosity of the second adhesive layer 320, or heating the transfer substrate 310 to reduce the viscosity of the second adhesive layer 320, the light-emitting diode chips 180 on the transfer substrate 310 can be transferred to the transition carrier substrate 210, and the transfer substrate 310 is peeled off.

For example, the material of the transition carrier substrate can be a glass substrate, so that the cost can be reduced.

For example, the plane shape of the transition carrier substrate can be rectangular, such as a square of 300 mm*300 mm, a square of 500 mm*500 mm, a rectangle of 450 mm*550 mm (2.5 generation line), or a rectangle of 2200 mm*2500 mm (8.5 generation line). Of course, the plane shape and size of the transition carrier substrate according to the embodiments of the present disclosure include but are not limited thereto.

In some examples, the manufacturing method of the light-emitting diode substrate can use an alignment machine, a high-precision alignment device, and a photosensitive device (or a charge coupled device, CCD) to align the transfer substrate and the transition carrier substrate. In addition, in the manufacturing method of the light-emitting diode substrate, a cleaning device can be adopted to clean the adhesive material of the second adhesive layer remaining on the transition carrier substrate, so as to avoid the adhesive material influencing the subsequent process.

For example, as illustrated by FIG. 11, the transition carrier substrate 210 can further include a second alignment mark 720. In this case, the above CCD can identify, record and calculate according to the positions of the first alignment mark on the transfer substrate and the second alignment mark on the transition carrier substrate, and feed them back to the high-precision alignment unit to ensure alignment realization and accuracy.

For example, the alignment machine can have the function of moving in three axial directions, which is convenient for alignment. In addition, the alignment machine can also include a vacuum adsorption function, so as to better adsorb and fix the transition carrier substrate.

For example, the above-mentioned alignment machine can also include a function of aligning, so as to realize the alignment of the initial position of the transition carrier substrate. In addition, the alignment machine can also have a lifting and lowering structure to realize the automatic loading and unloading function of the transition carrier substrate.

Figure 12:
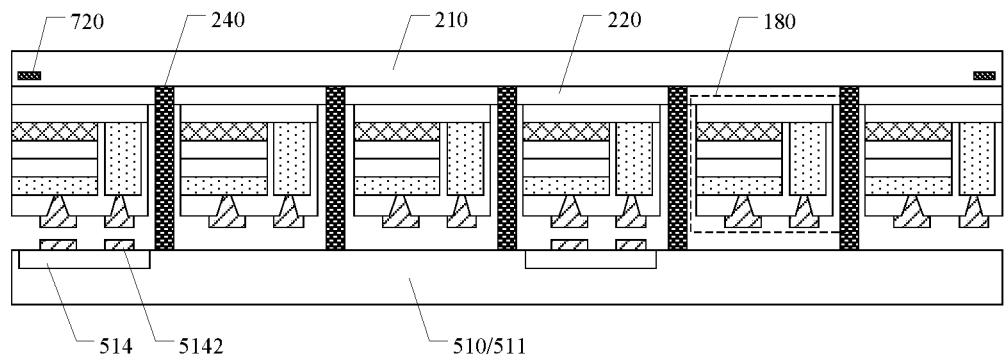
Figure 13:
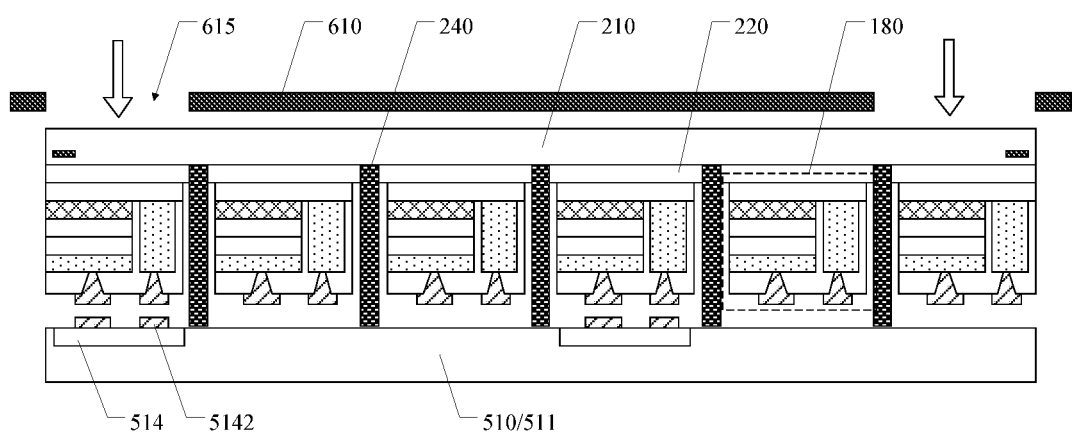
Figure 14:
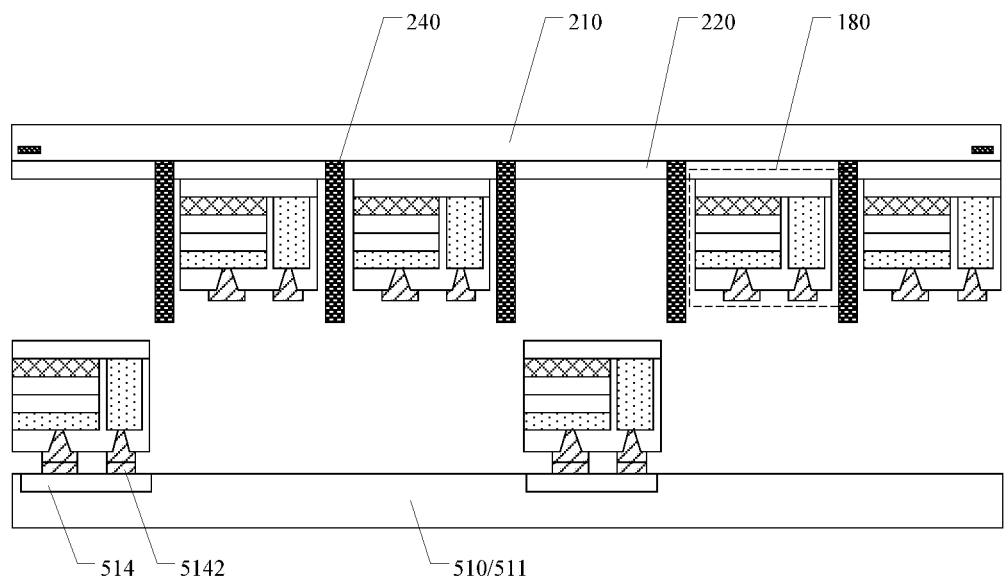

In some examples, as illustrated by FIGS. 12-14, transferring at least part of N*M light-emitting diode chips 180 corresponding to the N epitaxial layer groups 120 on the transition carrier substrate 210 to the driving substrate 510 includes: as illustrated by FIG. 12, aligning the transition carrier substrate 210 with the driving substrate 510, so that the plurality of first support structures 240 are located between the transition carrier substrate 210 and the driving substrate 510; as illustrated by FIG. 13, aligning the first mask plate 610 with the transition carrier substrate 210, and the first mask plate 610 includes a plurality of openings 615 corresponding to a plurality of light-emitting diode chips 180 to be transferred; and irradiating light to the transition carrier substrate 210 through the first mask plate 610 to transfer the plurality of light-emitting diode chips 180 to be transferred onto the driving substrate 510. As illustrated by FIG. 14, separating the transition carrier substrate 210 from the driving substrate 510. It should be noted that the N*M LED chips corresponding to the N epitaxial layer groups refer to the N*M LED chips that can be formed by the N epitaxial layer groups.

For example, the first mask plate 610 includes a light-absorbing material, and the light absorption rate of the light-absorbing material is greater than 60%. Therefore, the first mask plate can effectively avoid reflecting the light, thereby preventing the reflected light from entering the non-target region of the transition carrier substrate again.

For example, as illustrated by FIG. 13, the transition carrier substrate 210 is coated with a first adhesive layer 220; upon light being irradiated to the transition carrier substrate 210 through the first mask plate 610, light (such as ultraviolet light or laser) is irradiated to the corresponding region on the transition carrier substrate 210 through the opening 615 of the first mask plate 610. In this case, the viscosity of the first adhesive layer 220 corresponding to this region is weakened, or the first adhesive layer 220 corresponding to this region is dissociated, so that the light-emitting diode chip 180 to be transferred falls off the transition carrier substrate 210 and falls on the driving substrate 510.

For example, the material of the first adhesive layer 220 includes ultraviolet light viscosity reducing adhesive or laser dissociation adhesive. In the case where the first adhesive layer 220 is ultraviolet light viscosity reducing adhesive, the viscosity of the corresponding region of the first adhesive layer 220 can be reduced by irradiating ultraviolet light to a part region of the transition carrier substrate 210, so that the LED chip 180 in this region falls off and is transferred onto the driving substrate; in the case where the first adhesive layer 220 is the first laser dissociation adhesive, the corresponding region of the first adhesive layer 220 can be dissociated by irradiating laser to a part region of the transition carrier substrate 210, so that the LED chip 180 in this region falls off and is transferred on the driving substrate.

It should be noted that the first adhesive layer includes, but is not limited to, the above-mentioned ultraviolet light viscosity reducing adhesive or laser dissociation adhesive, and the first adhesive layer can also be pyrolytic adhesive. In this case, the corresponding region of the first adhesive layer can be dissociated by heating a part of the region of the transition carrier substrate, so that the LED chip in this region falls off and is transferred onto the driving substrate.

In some examples, the first adhesive layer 220 can have a structure as illustrated by FIG. 6B, that is, the first adhesive layer 220 includes a plurality of through holes 225 arranged in an array. The first adhesive layer includes a plurality of through holes, that is, the first adhesive layer is patterned, so that the first adhesive layer corresponding to each LED chip is relatively independent. Upon a specific region of the transition carrier substrate 210 being irradiated with light or heated, the first adhesive layer outside the specific region (i.e., the non-target region) will not be affected, so that the light-emitting diode chips that should not be transferred can be prevented from being transferred, and the product yield can be improved.

Figure 15:
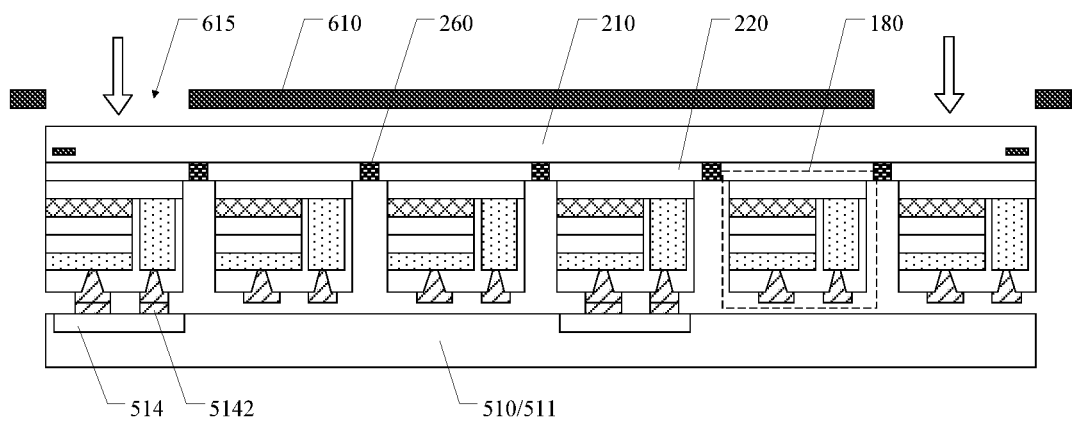
FIG. 15 is a schematic diagram of a transition carrier substrate according to an embodiment of the present disclosure.

FIG. 15 is a schematic diagram of a transition carrier substrate according to an embodiment of the present disclosure. As illustrated by FIG. 15, in the manufacturing method of the light-emitting diode substrate, transferring the N epitaxial layer groups 120 on the N substrates 110 to the transition carrier substrate 210 further includes: forming a plurality of light shielding structures 260 on the transition carrier substrate 210 before forming the first adhesive layer 220 on the transition carrier substrate 210, and the orthographic projection of each light shielding structure 260 on the transition carrier substrate 210 is located between the orthographic projections of two adjacent light-emitting diode chips 180 on the transition carrier substrate 210. Therefore, the light shielding structure 260 can shield the stray light passing through the transition carrier substrate and prevent the stray light from irradiating the region shielded by the first mask plate, so that the LED chip can be transferred with high precision and the product yield can be improved.

For example, the size of the light shielding structure 260 is smaller than the size of the space between adjacent LED chips 180.

In some examples, the light shielding structure can exist at the same time as the first support structure, and the light shielding structure can be located on a side of the first support structure close to the transition carrier substrate. Of course, the embodiments of the present disclosure include but are not limited thereto, and the first support structure can be made of light shielding material, so as to play the role of light shielding structure.

For example, the light shielding structure can be manufactured by photolithography. For example, a whole light shielding layer can be manufactured on the transition carrier substrate first, and then the patterned light shielding structure can be realized by photolithography, and the embodiments of the present disclosure will not be described in detail here.

Figure 16:
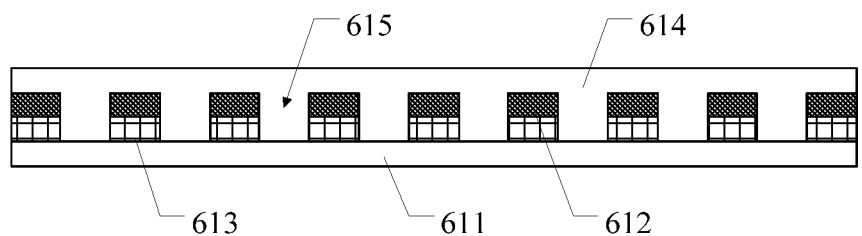
FIG. 16 is a schematic diagram of a first mask plate according to an embodiment of the present disclosure.

FIG. 16 is a schematic diagram of a first mask plate according to an embodiment of the present disclosure. As illustrated by FIG. 16, the first mask plate 610 includes a first transparent substrate 611 and a first light-absorbing pattern layer 612; the first light-absorbing pattern layer 612 is located on the first transparent substrate 611 and includes a plurality of openings 615. The first light-absorbing pattern layer 612 includes a light-absorbing material, and the light absorption rate of the light-absorbing material is greater than 60%.

For example, as illustrated by FIG. 16, the first mask plate 610 further includes: a first magnetic attraction structure 613 located between the first transparent substrate 611 and the first light-absorbing pattern layer 612, and the orthographic projection of the first magnetic attraction structure 613 on the first transparent substrate 611 and the orthographic projection of the plurality of openings 615 on the first transparent substrate 611 are arranged at intervals. Therefore, the first magnetic attraction structure 613 can be adsorbed and fixed, so that the flatness of the first mask plate in the exposure process can be improved, and the exposure accuracy can be improved.

For example, the first magnetic attraction structure can be made of nickel, iron-nickel alloy and other materials, so that it has certain magnetism and can be attracted by electro-magnets.

For example, the plane shape of the first magnetic attraction structure can be a grid structure.

For example, as illustrated by FIG. 16, the first mask plate 610 further includes: a first protective layer 614 located on a side of the first light-absorbing pattern layer 612 away from the first transparent substrate 611. The first protective layer 614 can be a transparent protective layer so as not to affect the transmission of light. Of course, embodiments of the present disclosure include but are not limited thereto, and the first protective layer can also be opaque; in this case, the first protective layer can be peeled off upon the first mask plate being used.

For example, the first transparent substrate can be made of quartz or silica glass with high hardness and thickness, thereby reducing the deformation of the mask plate caused by gravity.

In some examples, as illustrated by FIG. 14, the driving substrate 510 includes a plurality of driving circuits 514, each driving circuit 514 includes a pad 5142; each driving circuit 514 is configured to drive the LED chip 180 electrically connected to the pad 5142 to emit light. In this case, the manufacturing method of the light-emitting diode substrate also includes: bonding the light-emitting diode chip 180 transferred on the driving substrate 510 with the pad 5142 of the corresponding driving circuit 514 by a bonding process. For example, the first electrode pad 154 and the second electrode pad 164 of the light-emitting diode chip 180 are respectively bonded to the pads 5142 of the corresponding driving circuit 514. Therefore, the driving substrate can drive the light-emitting diode chip to emit light or display.

In some examples, as illustrated by FIG. 14, the number of driving circuits 514 on the driving substrate 510 is approximately the same as the number of light-emitting diode chips 180 on the transition carrier substrate 210. The positions of the driving circuits 514 on the driving substrate 510 and the positions of the LED chips 180 on the transition carrier substrate 210 are arranged in one-to-one correspondence. Therefore, after the transition carrier substrate and the driving substrate are aligned, any number of LED chips which need to be transferred on the transition carrier substrate can be transferred on the driving substrate at one time.

Figure 17:
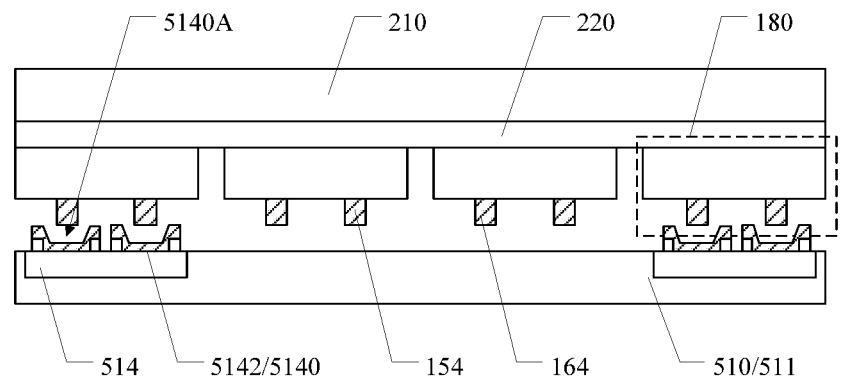
FIG. 17 is a schematic diagram of a pad on a driving substrate according to an embodiment of the present disclosure.

FIG. 17 is a schematic diagram of a pad on a driving substrate according to an embodiment of the present disclosure. As illustrated by FIG. 17, each pad 5142 includes at least two sub-pads 5140, and each sub-pad 5140 includes a groove 5140A configured to receive the electrode pad 154 or 164 of the corresponding light-emitting diode chip 180.

In some examples, as illustrated by FIGS. 12-14, each first support structure 240 has a columnar structure.

In some examples, the shape of the orthographic projection of each first support structure 240 on the transition carrier substrate 210 includes at least one of rectangle, T-shape and circle.

Figure 18A:
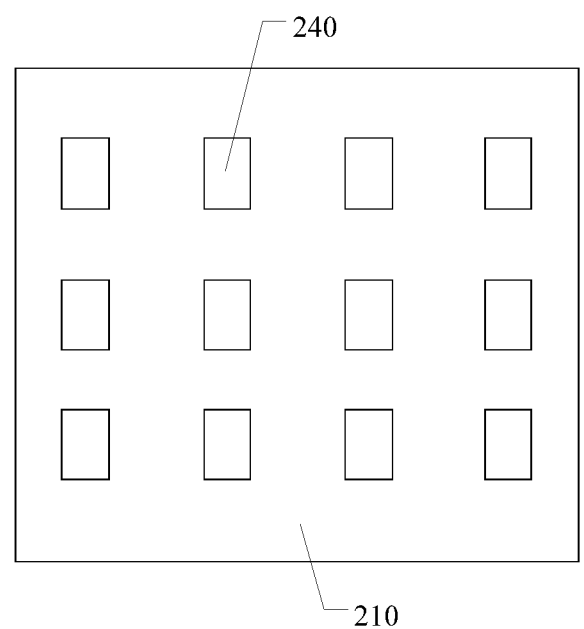
FIGS. 18A-18C are schematic plan views of a first support structure according to an embodiment of the present disclosure.
Figure 18B:
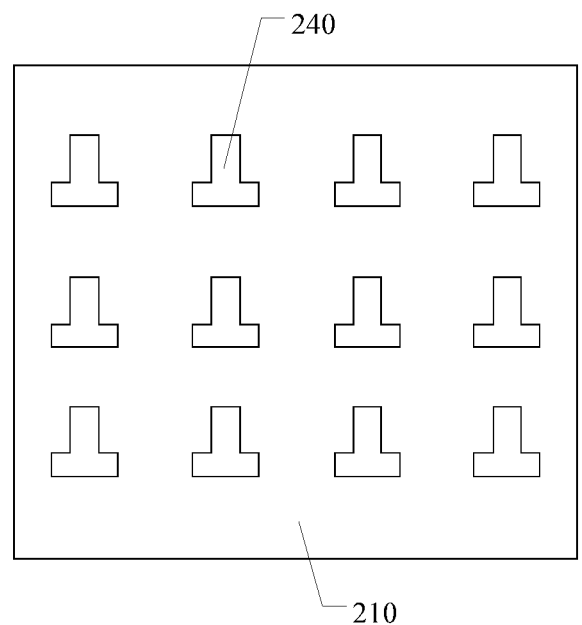
Figure 18C:
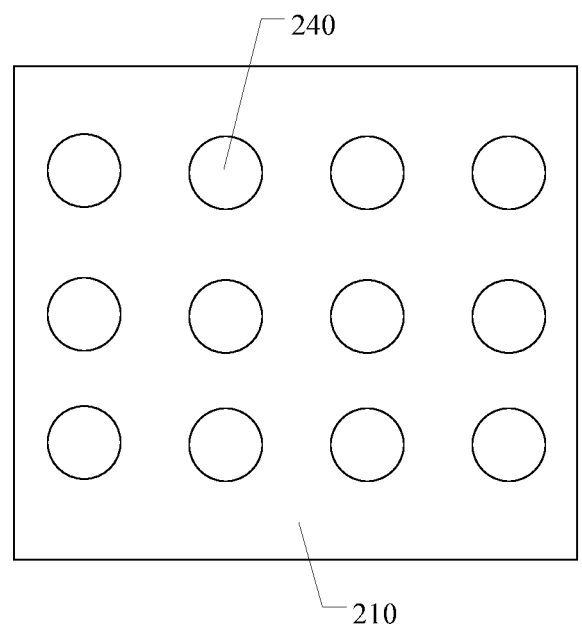

FIGS. 18A-18C are schematic plan views of a first support structure according to an embodiment of the present disclosure. As illustrated by FIG. 18A, the shape of the orthographic projection of each first support structure 240 on the transition carrier substrate 210 includes a rectangle; as illustrated by FIG. 18B, the shape of the orthographic projection of each first support structure 240 on the transition carrier substrate 210 includes a T-shape; as illustrated by FIG. 18C, the shape of the orthographic projection of each first support structure 240 on the transition carrier substrate 210 includes a circle. Of course, the embodiments of the present disclosure include but are not limited to the above situations, and the shape of the orthographic projection of each first support structure on the transition carrier substrate can also be other shapes.

Figure 18D:
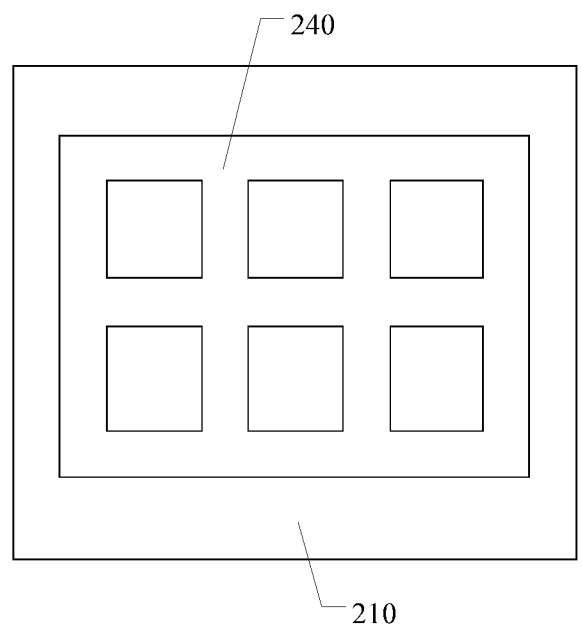
FIG. 18D is a schematic plan view of another first support structure according to an embodiment of the present disclosure.

FIG. 18D is a schematic plan view of another first support structure according to an embodiment of the present disclosure. As illustrated by FIG. 18D, each of the first support structures 240 has a columnar structure, and the orthographic projections of the first support structures 240 on the transition carrier substrate 210 are connected with each other to form a grid.

Figure 19:
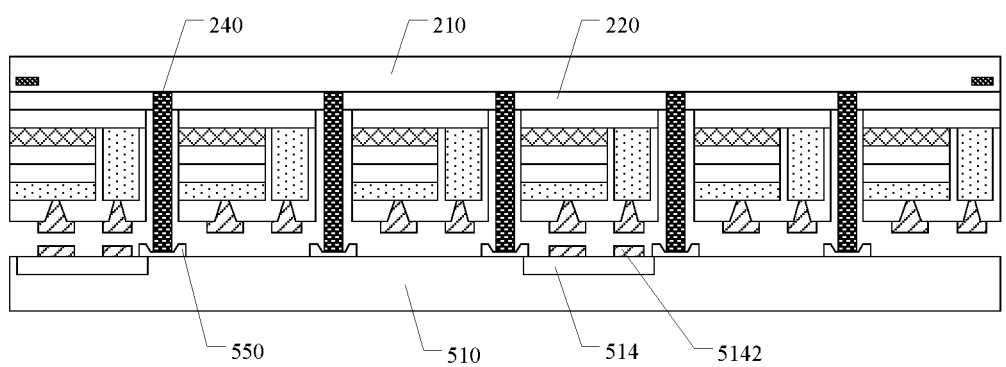
FIG. 19 is a schematic diagram of aligning a transition carrier substrate and a driving substrate according to an embodiment of the present disclosure.

FIG. 19 is a schematic diagram of aligning a transition carrier substrate and a driving substrate according to an embodiment of the present disclosure. As illustrated by FIG. 19, the driving substrate 510 includes a plurality of first receiving structures 550, and aligning the transition carrier substrate 210 with the driving substrate 510 includes: inserting the plurality of first support structures 240 on the transition carrier substrate 210 into the plurality of first receiving structures 550 on the driving substrate 510, the first support structures 240 and the first receiving structures 550 are arranged in one-to-one correspondence, and the size of each first receiving structure 240 in the direction perpendicular to the driving substrate 510 is smaller than the size of the light-emitting diode chip 180 in the direction perpendicular to the driving substrate 510. Therefore, the alignment accuracy between the transition carrier substrate and the driving substrate can be improved through the plurality of first support structures and the plurality of first receiving structures.

Figure 20A:
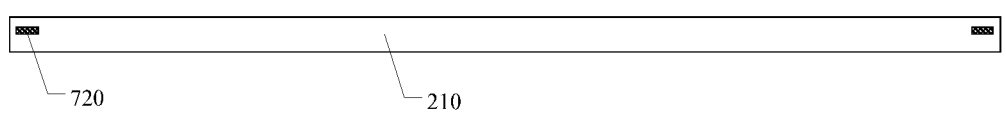
FIGS. 20A-20D are schematic steps of a manufacturing method of a first support structure according to an embodiment of the present disclosure.
Figure 20B:
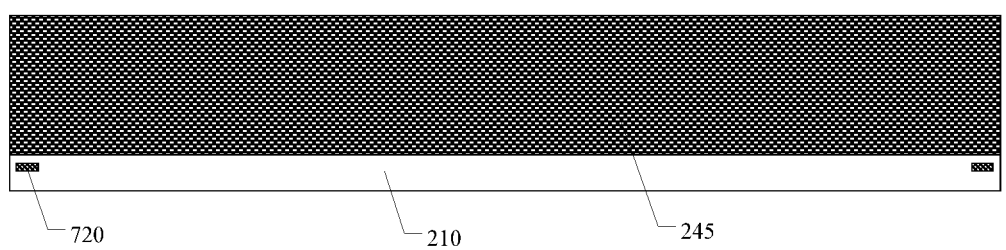
Figure 20C:
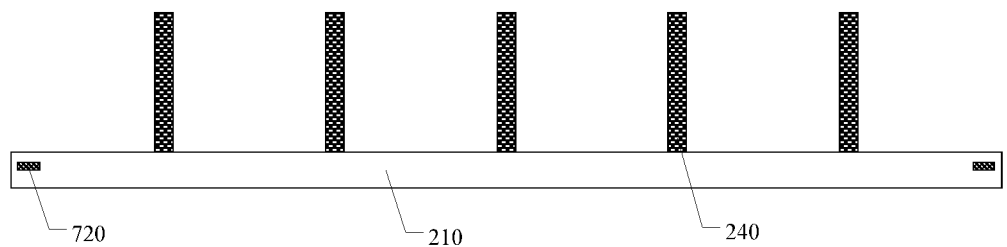
Figure 20D:
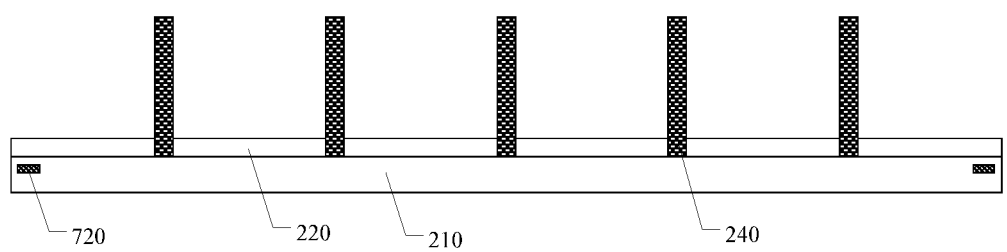

FIGS. 20A-20D are schematic steps of a manufacturing method of a first support structure according to an embodiment of the present disclosure. As illustrated by FIG. 20A, a second alignment mark 720 is formed on the transition carrier substrate 210. As illustrated by FIG. 20B, a support material layer 245 is formed on the transition carrier substrate 210, and the size of the support material layer 245 in the direction perpendicular to the transition carrier substrate 210 is larger than the size of the light-emitting diode chip 180 in the direction perpendicular to the transition carrier substrate 210. As illustrated by FIG. 20C, the support material layer 245 is patterned to form a plurality of first support structures 240, the period and size of the first support structures 240 are related to the spacing between the light-emitting diode chips 180 on the transfer substrate 310 and the size of each first support 240, and the size of each first support structure 240 is smaller than the spacing between the light-emitting diode chips 180. As illustrated by FIG. 20D, the first adhesive layer 220 is formed between the plurality of first support structures 240.

Figure 21A:
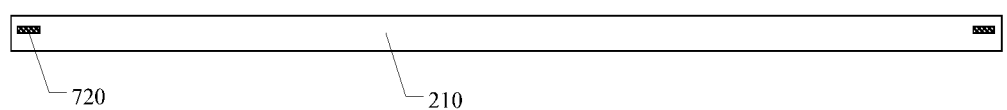
FIGS. 21A-21D are schematic steps of another manufacturing method of the first support structure according to an embodiment of the present disclosure.
Figure 21B:
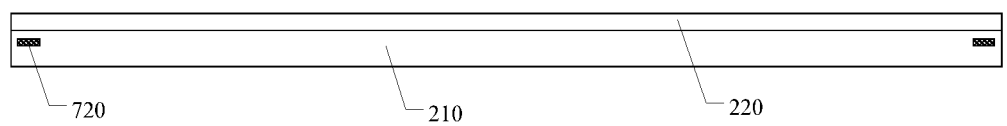
Figure 21C:
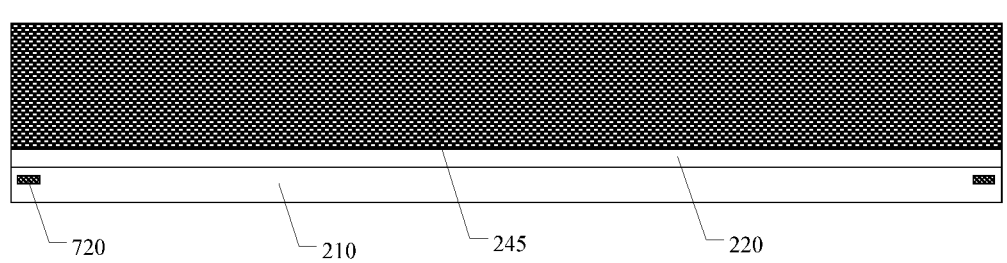
Figure 21D:
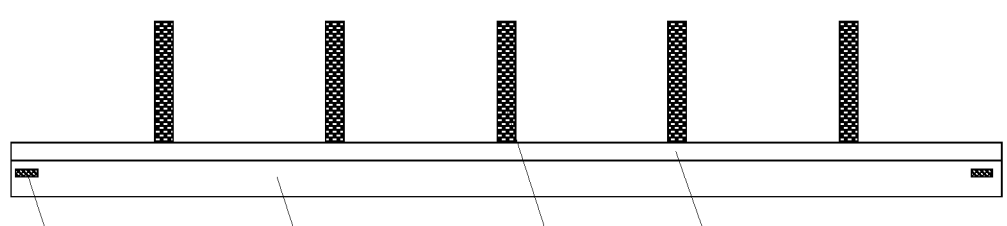

FIGS. 21A-21D are schematic steps of another manufacturing method of the first support structure according to an embodiment of the present disclosure. As illustrated by FIG. 21A, a second alignment mark 720 is formed on the transition carrier substrate 210. As illustrated by FIG. 21B, the first adhesive layer 220 is formed on the transition carrier substrate 210. As illustrated by FIG. 21C, a support material layer 245 is formed on the side of the first adhesive layer 220 away from the transition carrier substrate 210, and the size of the support material layer 245 in the direction perpendicular to the transition carrier substrate 210 is larger than that of the light-emitting diode chip 180 in the direction perpendicular to the transition carrier substrate 210. As illustrated by FIG. 21D, the support material layer 245 is patterned to form a plurality of first support structures 240, the period and size of the first support structures 240 are related to the spacing between the light-emitting diode chips 180 on the transfer substrate 310, and the size of each first support 240 is smaller than the spacing between the light-emitting diode chips 180.

It should be noted that the above-mentioned first support structure can also be manufactured on the transfer substrate through the above-mentioned process, and its function is the same as that on the transition carrier substrate, and upon the light-emitting chip on the transfer substrate being transferred to the transition carrier substrate, the first support structure is synchronously transferred to the transition carrier substrate.

For example, the support material layer can be an organic material layer such as an optical adhesive layer or resin.

FIGS. 22-34 are schematic steps of a manufacturing method of a light-emitting diode substrate according to an embodiment of the present disclosure.

Figure 22:
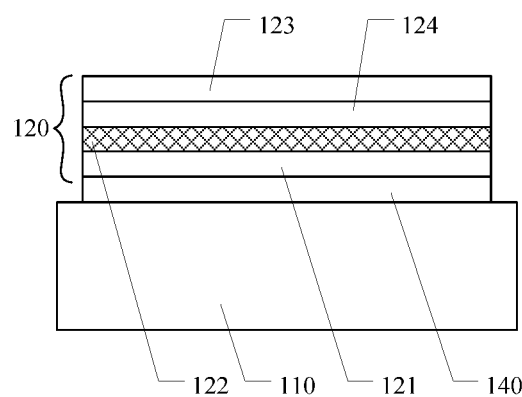
FIGS. 22-34 are schematic steps of a manufacturing method of a light-emitting diode substrate according to an embodiment of the present disclosure.
Figure 23:
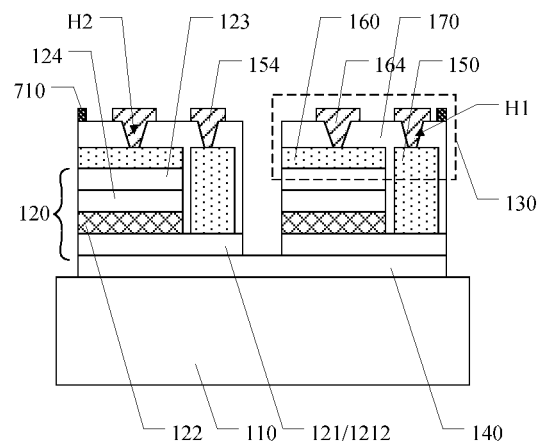

In some examples, as illustrated by FIGS. 22 and 23, after the epitaxial layer group 120 of M light-emitting diode chips is formed on the substrate 110, the manufacturing method of the light-emitting diode substrate further includes: forming M electrode structures 130 on a side of the epitaxial layer group 120 away from the substrate 110; and dividing the epitaxial layer group 120 and the M electrode structures 130 to form M light-emitting diode chips 180. That is, in this example, M electrode structures are formed on the substrate, and the epitaxial layer group and M electrode structures are also divided on the substrate to form M light-emitting diode chips.

In some examples, as illustrated by FIG. 22, forming an epitaxial layer group 120 of M light-emitting diode chips 180 on a substrate 110 includes: forming a first conductivity type semiconductor layer 121 on the substrate 110; forming a light-emitting layer 122 on a side of the first conductivity type semiconductor layer 121 away from the substrate 110; and forming a second conductivity type semiconductor layer 123 on the side of the light-emitting layer 122 away from the first conductivity type semiconductor layer 121 away from the substrate 110.

For example, the first conductivity type semiconductor layer 121 can be an n-type semiconductor layer, and the second conductivity type semiconductor layer 123 can be a p-type semiconductor layer. Of course, embodiments of the present disclosure include, but are not limited to, the first conductivity type semiconductor layer 121 can be a p-type semiconductor layer, and the second conductivity type semiconductor layer 123 can be an n-type semiconductor layer.

For example, materials of the first conductivity type semiconductor layer 121 and the second conductivity type semiconductor layer 123 can be gallium nitride materials. For example, the first conductivity type semiconductor layer 121 can be an n-type gallium nitride layer, and the second conductivity type semiconductor layer 123 can be a p-type gallium nitride layer. In addition, in the case where the light-emitting diode chip is used for emitting red light, gallium phosphide (GaP), aluminum gallium arsenide (AlGaAs) or aluminum gallium indium phosphide (AlGaInP) can be used for the first conductivity type semiconductor layer and the second conductivity type semiconductor layer. Of course, embodiments of the present disclosure include but are not limited thereto, and the first conductivity type semiconductor layer and the second conductivity type semiconductor layer can also be made of other suitable materials.

For example, the substrate can be a sapphire substrate. For another example, the sapphire substrate can also include a patterned sapphire substrate (PSS) layer. On the one hand, the patterned sapphire layer can effectively reduce the dislocation density of the first conductivity type semiconductor layer (i.e., epitaxial layer), thereby reducing non-radiative recombination, reducing reverse leakage current and prolonging the service life of the LED chip. On the other hand, the light emitted by the light-emitting layer can be scattered on the patterned sapphire layer for many times, which changes the exit angle of the totally reflected light, thus improving the light extraction efficiency. Of course, embodiments of the present disclosure include but are not limited thereto, and the LED chip may not be provided with the above-mentioned patterned sapphire layer. It should be noted that the substrate can also adopt other substrates, such as silicon carbide substrate.

For example, the above patterned sapphire layer can be manufactured by dry etching. Of course, the embodiments of the present disclosure include but are not limited thereto, and the above-mentioned patterned sapphire layer can also be manufactured by other suitable methods.

In some examples, as illustrated by FIG. 22, forming the epitaxial layer group 120 of M light-emitting diode chips 180 on the substrate 110 further includes: forming an electron blocking layer 124 between the light-emitting layer 122 and the second conductivity type semiconductor layer 123. The electron blocking layer 124 can block electrons from entering the second conductivity type semiconductor layer 123 to restrict carriers from flowing through, thereby improving light-emitting efficiency and light-emitting intensity.

The electron blocking layer 124 can be p-type aluminum gallium nitride (p-AlGaN), for example. Of course, embodiments of the present disclosure include but are not limited thereto, and the electron blocking layer 124 can also be other suitable materials.

In some examples, as illustrated by FIG. 22, before forming the first conductivity type semiconductor layer 121 on the substrate 110, the manufacturing method further includes: performing high temperature treatment on the substrate 110 and cleaning the surface of the substrate 110; and forming a buffer layer 140 on the substrate 110. Then, a first conductivity type semiconductor layer 121 can be formed on a side of the buffer layer 140 away from the substrate 110. By treating and cleaning the substrate at high temperature and forming a buffer layer on the substrate, the degree of lattice matching can be improved, which is convenient for the subsequent growth of epitaxial layer groups.

For example, in the case where the first conductivity type semiconductor layer is n-type gallium nitride and the second conductivity type semiconductor layer is p-type gallium nitride, the buffer layer is aluminum nitride. Of course, the embodiments of the present disclosure include but are not limited thereto, and the buffer layer can be made of any material that can improve the degree of lattice matching.

In some examples, as illustrated by FIG. 23, forming M electrode structures on a side of the epitaxial layer group away from the substrate includes: patterning the epitaxial layer group 120 to expose part of the first conductivity type semiconductor layer 121 to form M exposed portions 1212; forming M first electrodes 150 on a side of the M exposed portions 1212 away from the substrate 110; forming M second electrodes 160 on a side of the second conductivity type semiconductor layer 123 away from the substrate 110; forming a passivation layer 170 on a side of the M first electrodes 150 and the M second electrodes 160 away from the substrate 110; patterning the passivation layer 170 to form a first via hole H1 corresponding to the first electrode 150 and a second via hole H2 corresponding to the second electrode 160 in the passivation layer 170; forming a first electrode pad 154 and a second electrode pad 164 on a side of the passivation layer 170 away from the substrate 110. The first electrode pad 154 is connected to the first electrode 150 through the first via hole H1, and the second electrode pad 164 is connected to the second electrode 160 through the second via hole H2. Each of the electrode structures 130 includes one first electrode 150, one first electrode pad 154, one second electrode 160 and one second electrode pad 164.

For example, in the manufacturing method of the light-emitting diode substrate, after patterning the epitaxial layer group 120 to expose part of the first conductivity type semiconductor layer 121 to form M exposed portions 1212, a first conductive layer can be formed on the side of the second conductivity type semiconductor layer 123 and the exposed portions 1212 away from the substrate 110, and then the first conductive layer is patterned to form the above first electrode 150 and the second electrode 160. The first electrode 150 is arranged in contact with the exposed portion 1212, and the second electrode 160 is arranged in contact with the second conductivity type semiconductor layer 123, and the first electrode 150 and the second electrode 160 are insulated from each other.

For example, in the manufacturing method of the light-emitting diode substrate, after patterning the passivation layer 170 to form a first via hole H1 corresponding to the first electrode 150 and a second via hole H2 corresponding to the second electrode 160 in the passivation layer 170, a second conductive layer can be formed on the side of the passivation layer 170 away from the substrate 110, and then patterned to form the first electrode pad 154 and the second electrode pad 164 described above.

For example, dividing the epitaxial layer group 120 and the M electrode structures 130 to form M light-emitting diode chips 180 includes: dividing the epitaxial layer group 120 and the M electrode structures 130 to form M light-emitting diode chips 180 by an etching process. Of course, the embodiments of the present disclosure include but are not limited thereto, and other processes can be used for segmentation.

For example, as illustrated by FIG. 23, while forming the epitaxial layer group 120 on the substrate 110, a first alignment mark 710 can be formed on the substrate 110. The embodiment of the present disclosure does not limit the manufacturing method of the first alignment mark.

Figure 24:
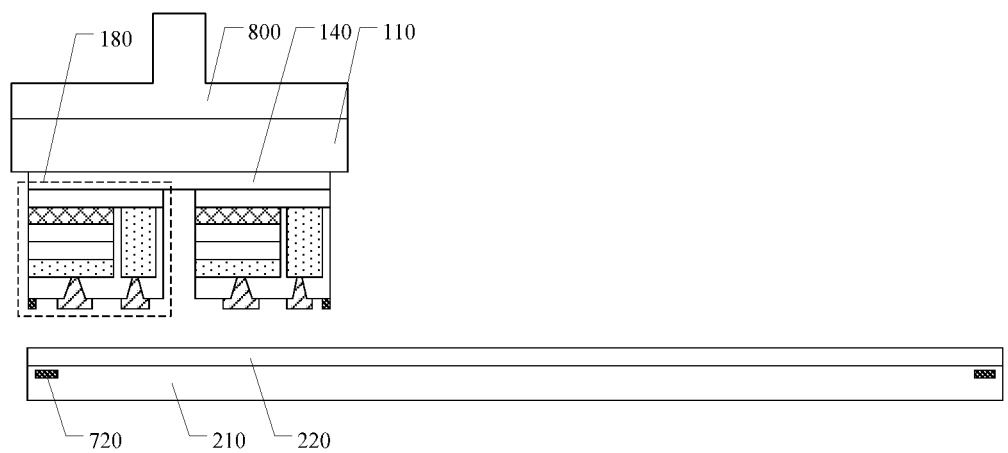
Figure 25:
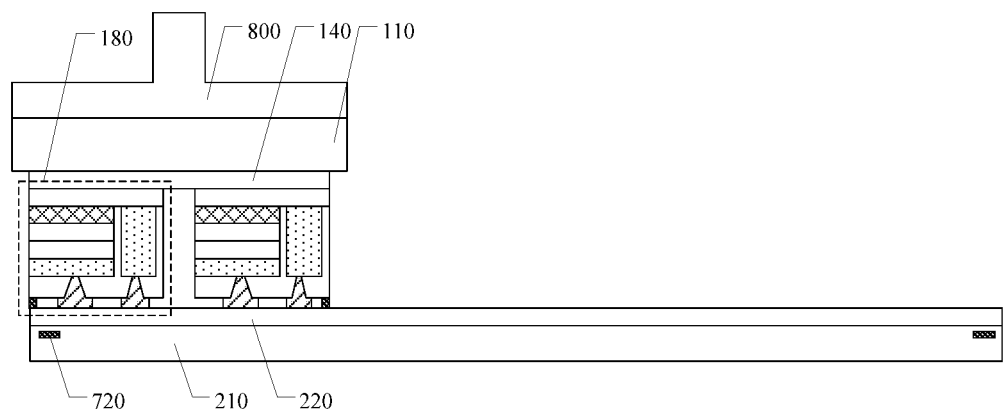
Figure 26:
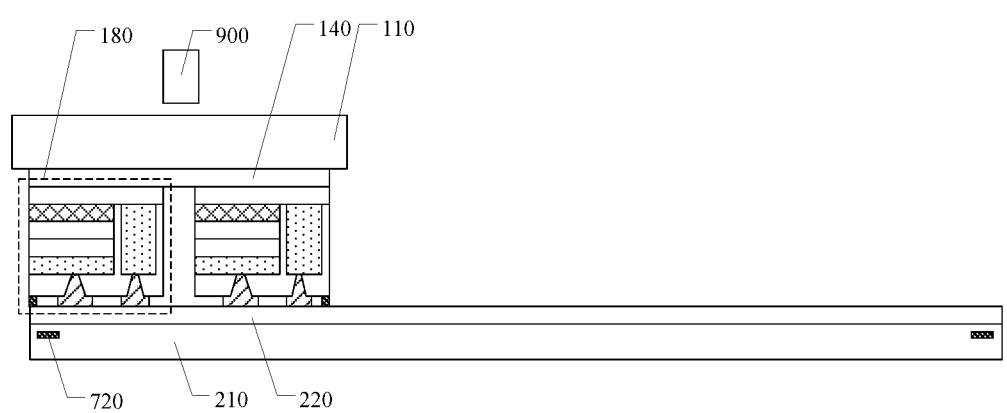

In some examples, as illustrated by FIGS. 24-26, the manufacturing method of the light-emitting diode substrate includes: transferring N epitaxial layer groups 120 on N substrates 110 to the transition carrier substrate 210, and the N epitaxial layer groups 120 on N substrates 110 are densely arranged on the transition carrier substrate 210.

For example, as illustrated by FIG. 24, a first adhesive layer 220 is formed on the transition carrier substrate 210; then, a transfer device 800 (e.g., a transfer head) can be used to move the substrate 110 and the light-emitting diode chip 180 on the substrate 110 above the transition carrier substrate 210 to align with the transition carrier substrate 210. In this case, the light-emitting diode chip 180 is located between the substrate 110 and the transition carrier substrate 210, and the electrode structure 130 of the light-emitting diode chip 180 is located on a side of the light-emitting diode chip 180 close to the transition carrier substrate 210.

For example, as illustrated by FIG. 25, the substrate 110 is moved toward the transition carrier substrate 210 so that the light-emitting diode chip 180 contacts the first adhesive layer 220 on the transition carrier substrate 210; in this case, the first adhesive layer 220 can adhere the light-emitting diode chip 180.

For example, as illustrated by FIG. 26, the substrate 110 is irradiated with laser from the side of the substrate 110 away from the transition carrier substrate 210, so that the buffer layer 140 on the substrate 110 is decomposed, so that the light-emitting diode chip 180 on the substrate 110 is transferred to the transition carrier substrate 210, and the substrate 110 can be peeled off.

For example, the material of the transition carrier substrate can be a glass substrate, so that the cost can be reduced.

For example, the plane shape of the transition carrier substrate can be rectangular, such as a square of 300 mm*300 mm, a square of 500 mm*500 mm, a rectangle of 450 mm*550 mm (2.5 generation line), or a rectangle of 2200 mm*2500 mm (8.5 generation line). Of course, the plane shape and size of the transition carrier substrate according to the embodiments of the present disclosure include but are not limited thereto.

In some examples, the manufacturing method of the light-emitting diode substrate can use an alignment machine, a high-precision alignment device, and a photosensitive device (or a charge coupled device, CCD) to align the transfer substrate and the transition carrier substrate. In addition, in the manufacturing method of the light-emitting diode substrate, a cleaning device can be adopted to clean the adhesive material of the second adhesive layer remaining on the transition carrier substrate, so as to avoid the adhesive material influencing the subsequent process.

For example, as illustrated by FIG. 26, the transition carrier substrate 210 can further include a second alignment mark 720. In this case, the above CCD can identify, record and calculate according to the positions of the first alignment mark on the transfer substrate and the second alignment mark on the transition carrier substrate, and feed them back to the high-precision alignment unit to ensure alignment realization and accuracy.

For example, the alignment machine can have the function of moving in three axial directions, which is convenient for alignment. In addition, the alignment machine can also include a vacuum adsorption function, so as to better adsorb and fix the transition carrier substrate.

For example, the above-mentioned alignment machine can also include a function of aligning, so as to realize the alignment of the initial position of the transition carrier substrate. In addition, the alignment machine can also have a lifting and lowering structure to realize the automatic loading and unloading function of the transition carrier substrate.

Figure 27:
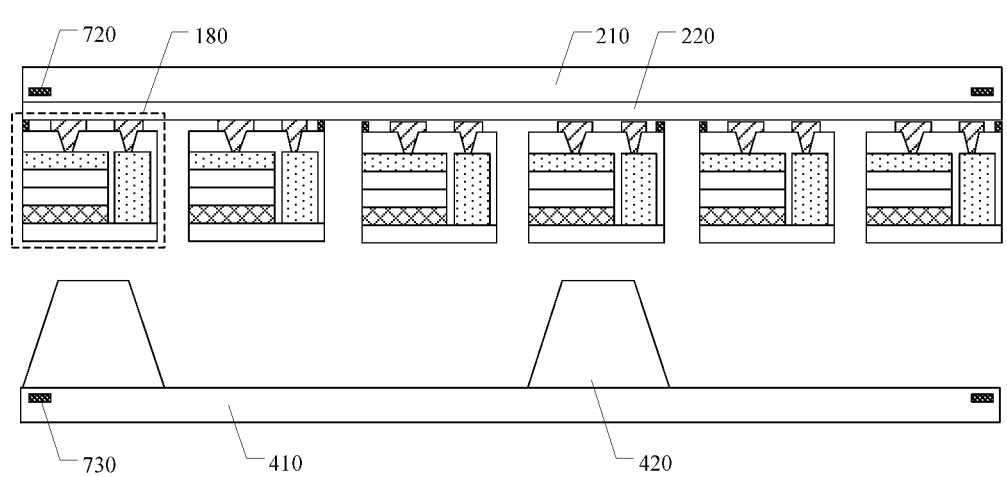
Figure 28:
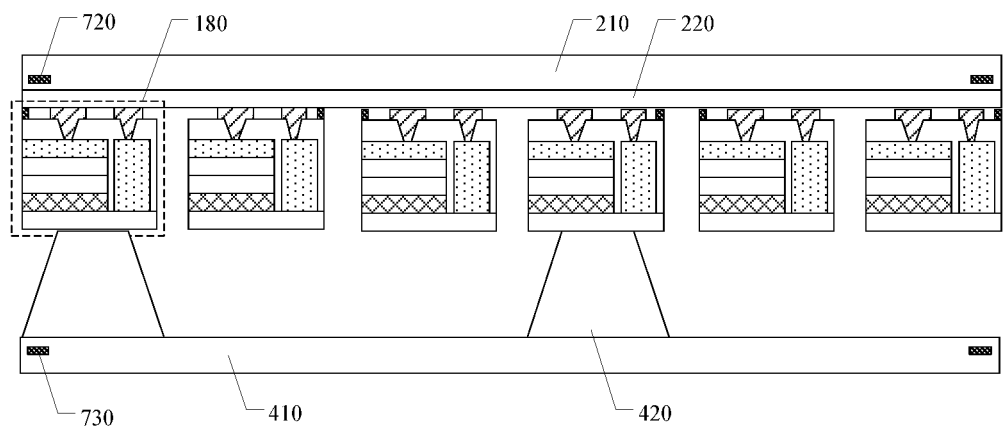
Figure 29:
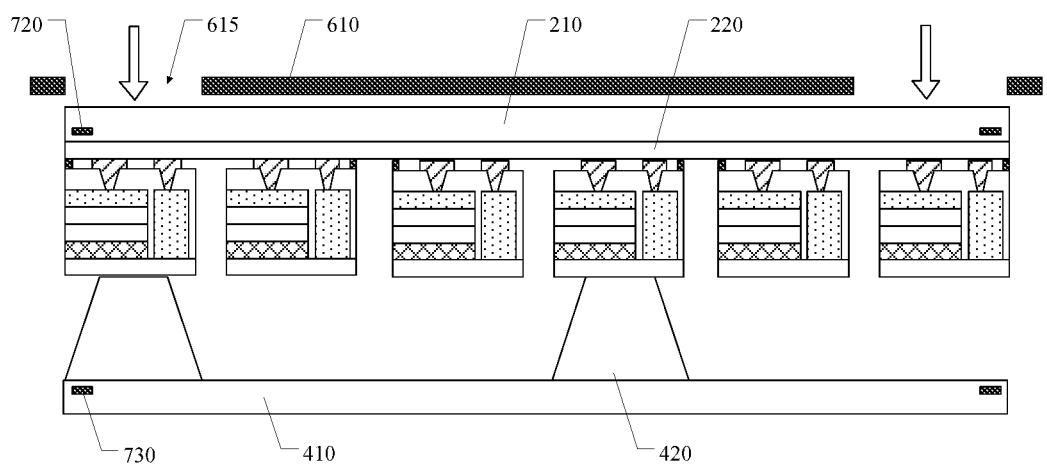
Figure 30:
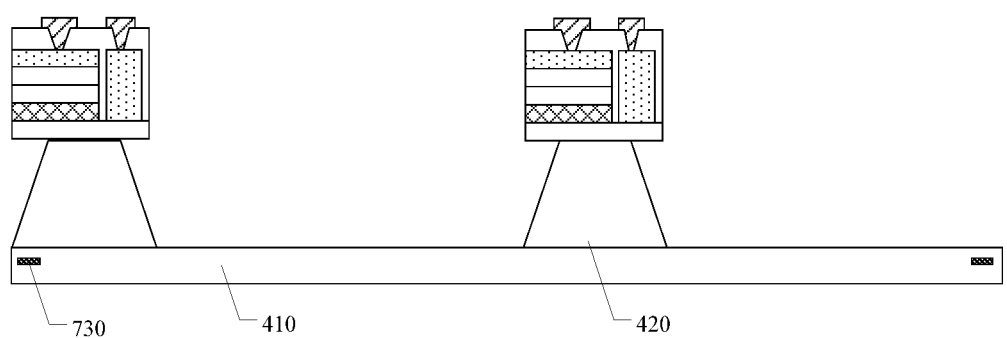
Figure 31:
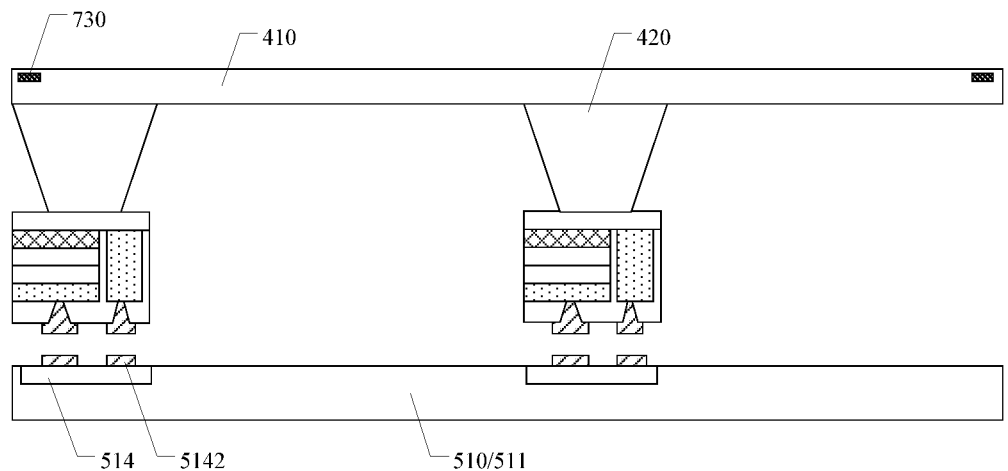
Figure 32:
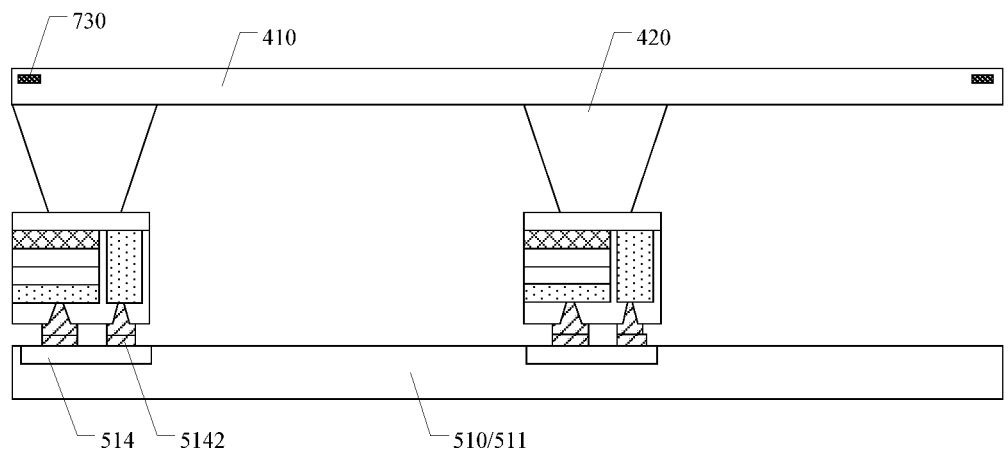
Figure 33:
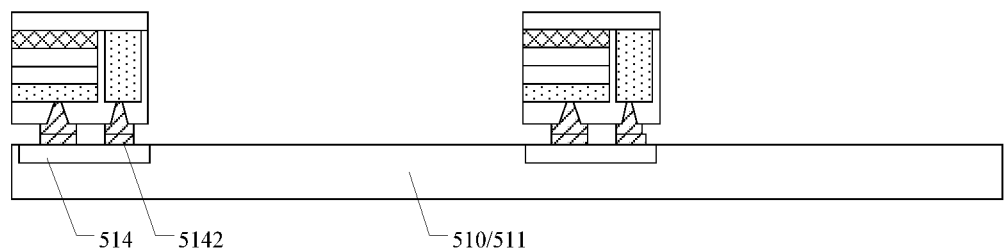

In some examples, as illustrated by FIGS. 27-33, transferring at least part of N*M light-emitting diode chips 180 corresponding to the N epitaxial layer groups 120 on the transition carrier substrate 210 to the driving substrate 510 includes: as illustrated by FIG. 27, providing a selecting substrate 410 including a plurality of selecting structures 420; as illustrated by FIG. 28, aligning the selecting substrate 410 with the transition carrier substrate 210, and contacting the plurality of selecting structures 420 with the plurality of light-emitting diode chips 180 to be transferred. As illustrated by FIG. 29, aligning a second mask plate 620 with the transition carrier substrate 210, and the second mask plate 620 includes a plurality of openings 625 corresponding to a plurality of selecting structures 420. As illustrated by FIGS. 29-30, irradiating light to the transition carrier substrate 210 through the second mask plate 620 to transfer the plurality of light-emitting diode chips 180 to be transferred to the plurality of selecting structures 420 on the selecting substrate 410. As illustrated by FIG. 31, aligning the selecting substrate 410 and the driving substrate 510. As illustrated by FIG. 32, bonding the plurality of light-emitting diode chips 180 to be transferred on the plurality of selecting structures 420 on the selecting substrate 410 with the driving substrate 510. As illustrated by FIG. 33, removing the plurality of selecting structures 420. Therefore, the manufacturing method of the light-emitting diode substrate can transfer the light-emitting diode chip on the transition carrier substrate to the driving substrate through the selecting substrate and the selecting structure on the selecting substrate.

For example, the second mask plate 620 is made of a light-absorbing material, and the light absorption rate of the light-absorbing material is greater than 60%. Therefore, the second mask plate can effectively avoid reflecting the light, thereby preventing the reflected light from entering the non-target region of the selecting substrate again.

Figure 34:
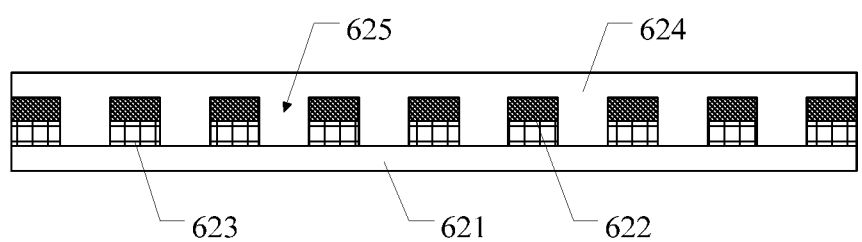

FIG. 34 is a schematic diagram of a second mask plate according to an embodiment of the present disclosure. As illustrated by FIG. 34, the second mask plate 620 includes: a second transparent substrate 621 and a second light-absorbing pattern layer 622. The second light-absorbing pattern layer 622 is located on the second transparent substrate 621 and includes a plurality of openings 625. The second light-absorbing pattern layer 622 is made of light-absorbing material, and the light absorption rate of the light-absorbing material is greater than 60%.

For example, as illustrated by FIG. 34, the second mask plate 620 further includes: a second magnetic attraction structure 623 located between the second transparent substrate 621 and the second light-absorbing pattern layer 622, and the orthographic projection of the second magnetic attraction structure 623 on the second transparent substrate 621 and the orthographic projection of the plurality of openings 625 on the second transparent substrate 621 are arranged at intervals. Therefore, the second magnetic attraction structure 623 can be adsorbed and fixed, so that the flatness of the second mask plate in the exposure process can be improved, and the exposure accuracy can be improved.

For example, the second magnetic attraction structure can be made of nickel, iron-nickel alloy and other materials, so that it has certain magnetism and can be attracted by electromagnets.

For example, the plane shape of the above second magnetic attraction structure can be a grid structure.

For example, as illustrated by FIG. 34, the second mask plate 620 further includes: a second protective layer 624 located on a side of the first light-absorbing pattern layer 622 away from the first transparent substrate 621. The second protective layer 624 can be a transparent protective layer so as not to affect the transmission of light. Of course, embodiments of the present disclosure include but are not limited thereto, and the second protective layer can also be opaque; in this case, the second protective layer can be peeled off upon the second mask plate being used.

For example, the second transparent substrate can be made of quartz or silica glass with high hardness and thickness, so that the deformation of the mask plate caused by gravity can be reduced.

In some examples, as illustrated by FIG. 27, the selecting substrate 410 further includes a third alignment mark 730, in this case, the selecting substrate 410 can be aligned with the transition carrier substrate 210 by using the third alignment mark 70, and the plurality of selecting structures 420 can be in contact with the plurality of light-emitting diode chips 180 to be transferred. Upon the selecting structure 420 being in contact with the LED chip 180, the selecting structure 420 can adhere the LED chip 180.

Figure 35:
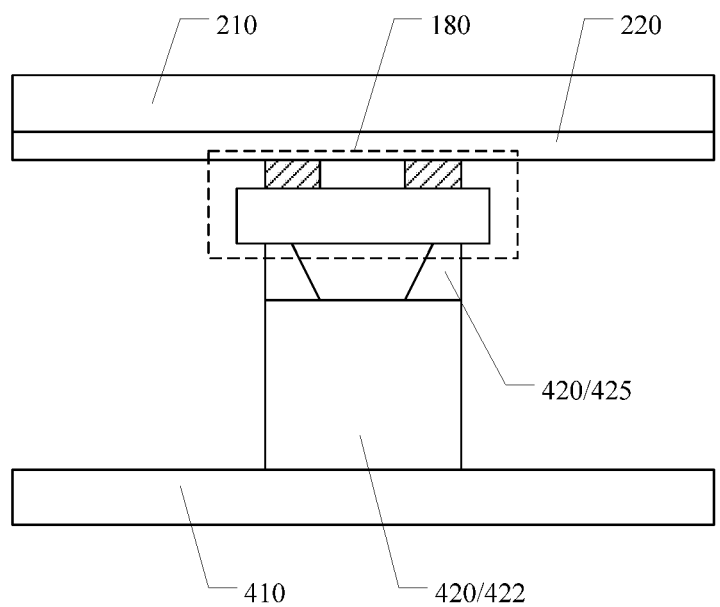
FIG. 35 is a schematic diagram of a selecting structure according to an embodiment of the present disclosure.

FIG. 35 is a schematic diagram of a selecting structure according to an embodiment of the present disclosure. As illustrated by FIG. 35, each selecting structure 420 includes a support portion 422 and a pyrolysis portion 425 located on the side of the support portion 425 away from the selecting substrate 410.

In some examples, in the case where the selecting structure 420 adopts the structure as illustrated by FIG. 35, aligning the selecting substrate 410 with the transition carrier substrate 210 and contacting the plurality of selecting structures 420 with the plurality of LED chips 180 to be transferred includes: aligning the selecting substrate 410 with the transition carrier substrate 210 in a vacuum environment; applying a force to the selecting substrate 410 to make the pyrolysis portion 425 in the selecting structure 420 adhere to the corresponding LED chip 180.

In some examples, irradiating light to the transition carrier substrate 210 through the second mask plate 620 to transfer the plurality of LED chips 180 to be transferred to the plurality of selecting structures 420 on the selecting substrate 410 includes: introducing inert gas between the selecting substrate 410 and the transition carrier substrate 210 after irradiating light to the transition carrier substrate 210 through the second mask plate 620.

In some examples, removing the plurality of selecting structures 420 includes: heating in a vacuum environment to melt the pyrolysis portion 425 to remove the plurality of selecting structures 420.

In some examples, the material of each selecting structure 420 includes ultraviolet light viscosity reducing adhesive or laser dissociation adhesive, and removing the plurality of selecting structures 420 includes: irradiating light to the selecting substrate to remove the plurality of selecting structures.

In some examples, the area of the surface of each selecting structure 420 away from the selecting substrate 410 is approximately equal to the area of the orthographic projection of the LED chip 180 on the selecting substrate 410, so that the LED chip 180 can be better selected.

In some examples, each selecting structure includes elastic materials, which can provide certain buffer and improve the yield of products.

In some examples, the shape of a cross section of each selecting structure cut by a plane perpendicular to the selecting substrate includes a trapezoid. Of course, the embodiments of the present disclosure include but are not limited thereto, and the shape of the cross section of each selecting structure cut by a plane perpendicular to the selecting substrate can also be other shapes.

Figure 36A:
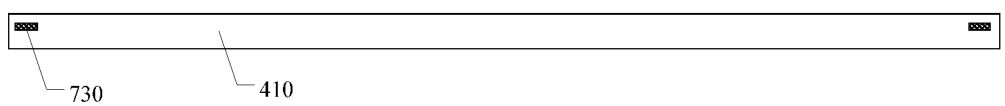
FIGS. 36A-36C are schematic steps of a manufacturing method of a selecting structure according to an embodiment of the present disclosure.
Figure 36B:
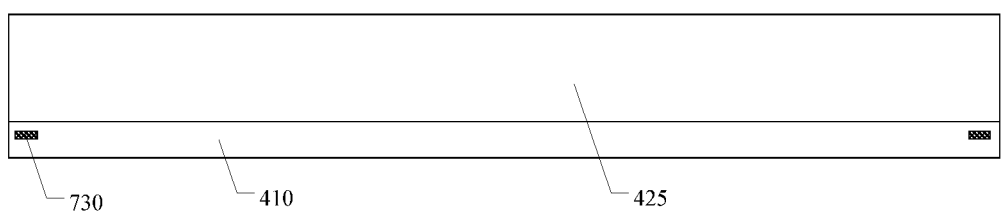
Figure 36C:
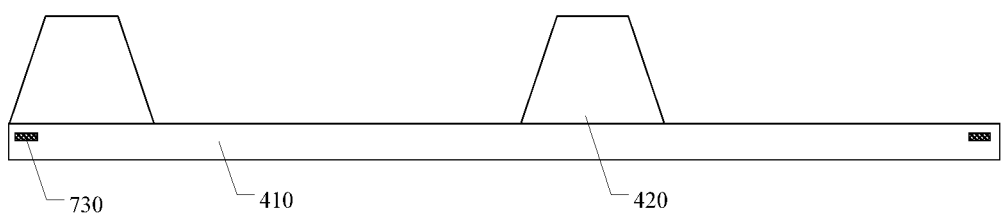

FIGS. 36A-36C are schematic steps of a manufacturing method of a selecting structure according to an embodiment of the present disclosure. As illustrated by FIG. 36A, a third alignment mark 730 is manufactured on the selecting substrate 410. As illustrated by FIG. 36B, a first selecting adhesive material layer 425 is formed on the selecting substrate 410, and the thickness of the first selecting adhesive material layer 425 in the direction perpendicular to the selecting substrate 410 is larger than the thickness of the light-emitting diode chip 180 in the direction perpendicular to the selecting substrate 410. As illustrated by FIG. 36C, the first selective adhesive layer 425 is patterned to form the above selecting structure 420.

Figure 37A:
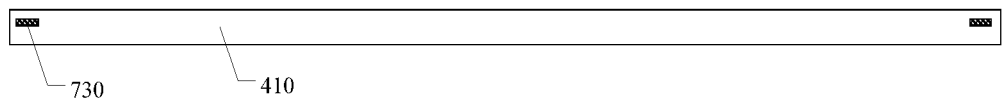
FIGS. 37A-37D are schematic steps of another manufacturing method of the selecting structure according to an embodiment of the present disclosure.
Figure 37B:
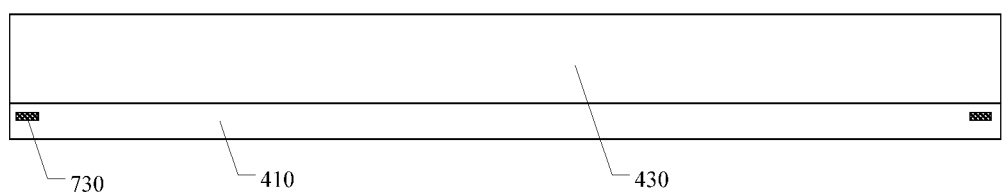
Figure 37C:
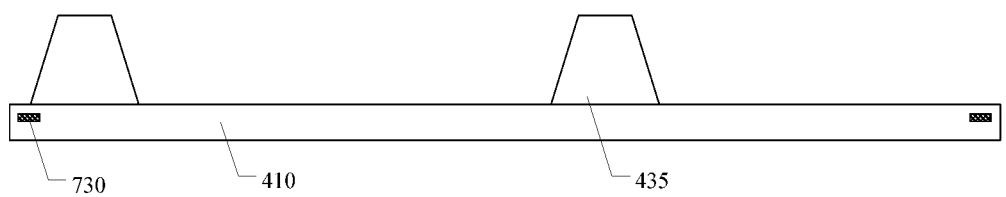
Figure 37D:
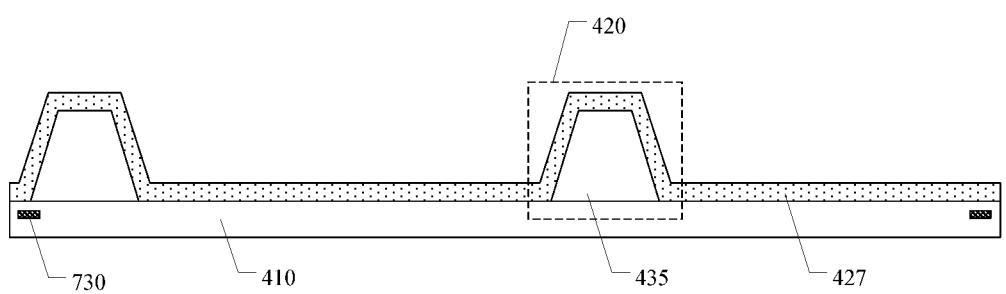

FIGS. 37A-37D are schematic steps of another manufacturing method of the selecting structure according to an embodiment of the present disclosure. As illustrated by FIG. 37A, a third alignment mark 730 is manufactured on the selecting substrate 410. As illustrated by FIG. 37B, a selecting material layer 430 is formed on the selecting substrate 410. As illustrated by FIG. 37C, the selecting material layer 430 is patterned to form a plurality of convex structures 435. As illustrated by FIG. 37D, a second selecting adhesive material layer 427 is formed on a side of the plurality of convex structures 435 away from the selecting substrate 410, and in this case, each convex structure 435 and the second selecting adhesive material layer 427 on the convex structure 435 can form a selecting structure 420.

For example, the materials of the first selecting adhesive material layer 425 and the second selecting adhesive material layer 427 can be ultraviolet light viscosity reducing materials or laser dissociation materials. Of course, the embodiments of the present disclosure include but are not limited thereto, and the materials of the first selecting adhesive material layer 425 and the second selecting adhesive material layer 427 can also be pyrolytic materials.

For example, the above selecting material layer 430 can be an organic material such as optical adhesive or resin.

FIG. 38-FIG. 43 are schematic steps of another manufacturing method of a light-emitting diode substrate according to an embodiment of the present disclosure.

Figure 38:
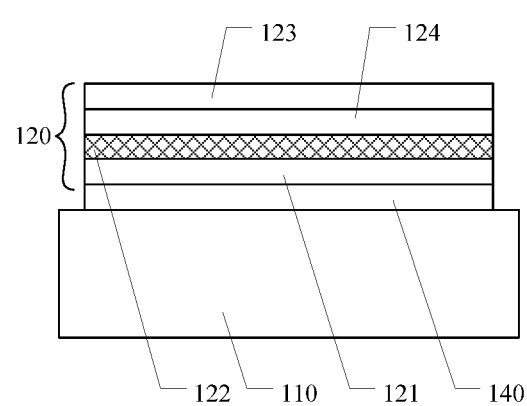
FIGS. 38-43 are schematic steps of a manufacturing method of another light-emitting diode substrate according to an embodiment of the present disclosure.
Figure 39:
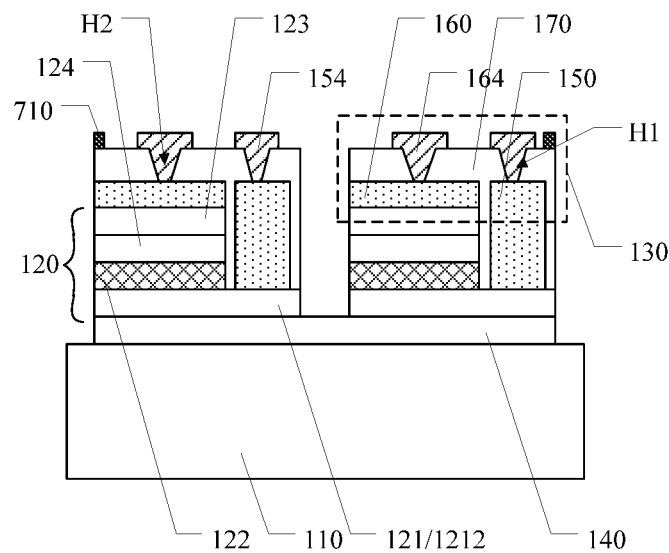

In some examples, as illustrated by FIGS. 38 and 39, after forming the epitaxial layer group 120 of M light-emitting diode chips on the substrate 110, the manufacturing method of the light-emitting diode substrate further includes: forming M electrode structures 130 on the side of the epitaxial layer group 120 away from the substrate 110; and dividing the epitaxial layer group 120 and the M electrode structures 130 to form M light-emitting diode chips 180. That is, in this example, M electrode structures are formed on the substrate, and the epitaxial layer group and M electrode structures are also divided on the substrate to form M light-emitting diode chips.

In some examples, as illustrated by FIG. 38, forming an epitaxial layer group 120 of M light-emitting diode chips 180 on a substrate 110 includes: forming a first conductivity type semiconductor layer 121 on the substrate 110; forming a light-emitting layer 122 on a side of the first conductivity type semiconductor layer 121 away from the substrate 110; and forming a second conductivity type semiconductor layer 123 on the side of the light-emitting layer 122 away from the first conductivity type semiconductor layer 121.

For example, the first conductivity type semiconductor layer 121 can be an n-type semiconductor layer, and the second conductivity type semiconductor layer 123 can be a p-type semiconductor layer. Of course, embodiments of the present disclosure include, but are not limited to, the first conductivity type semiconductor layer 121 can be a p-type semiconductor layer, and the second conductivity type semiconductor layer 123 can be an n-type semiconductor layer.

For example, materials of the first conductivity type semiconductor layer 121 and the second conductivity type semiconductor layer 123 can be gallium nitride materials. For example, the first conductivity type semiconductor layer 121 can be an n-type gallium nitride layer, and the second conductivity type semiconductor layer 123 can be a p-type gallium nitride layer. Of course, the embodiments of the present disclosure include but are not limited thereto, and other suitable semiconductor materials can be selected for the materials of the first conductivity type semiconductor layer 121 and the second conductivity type semiconductor layer 123.

For example, the substrate can be a sapphire substrate. For another example, the sapphire substrate can also include a patterned sapphire substrate (PSS) layer. On the one hand, the patterned sapphire layer can effectively reduce the dislocation density of the first conductivity type semiconductor layer (i.e., epitaxial layer), thereby reducing non-radiative recombination, reducing reverse leakage current and prolonging the service life of the LED chip. On the other hand, the light emitted by the light-emitting layer can be scattered on the patterned sapphire layer for many times, which changes the exit angle of the totally reflected light, thus improving the light extraction efficiency. Of course, embodiments of the present disclosure include but are not limited thereto, and the LED chip may not be provided with the above-mentioned patterned sapphire layer. It should be noted that the substrate can also adopt other substrates, such as silicon carbide substrate.

For example, the patterned sapphire layer can be manufactured by dry etching. Of course, the embodiments of the present disclosure include but are not limited thereto, and the above-mentioned patterned sapphire layer can also be manufactured by other suitable methods.

In some examples, as illustrated by FIG. 38, forming the epitaxial layer group 120 of M light-emitting diode chips 180 on the substrate 110 further includes: forming an electron blocking layer 124 between the light-emitting layer 122 and the second conductivity type semiconductor layer 123. The electron blocking layer 124 can block electrons from entering the second conductivity type semiconductor layer 123 to restrict carriers from flowing through, thereby improving light-emitting efficiency and light-emitting intensity.

The electron blocking layer 124 can be p-type aluminum gallium nitride (p-AlGaN), for example. Of course, embodiments of the present disclosure include but are not limited thereto, and the electron blocking layer 124 can also be other suitable materials.

In some examples, as illustrated by FIG. 38, before forming the first conductivity type semiconductor layer 121 on the substrate 110, the manufacturing method includes: performing high temperature treatment on the substrate 110 and cleaning the surface of the substrate 110; and forming a buffer layer 140 on the substrate 110. Then, a first conductivity type semiconductor layer 121 can be formed on a side of the buffer layer 140 away from the substrate 110. By treating and cleaning the substrate at high temperature and forming a buffer layer on the substrate, the degree of lattice matching can be improved, which is convenient for the subsequent growth of epitaxial layers.

For example, in the case where the first conductivity type semiconductor layer is n-type gallium nitride and the second conductivity type semiconductor layer is p-type gallium nitride, the buffer layer is aluminum nitride. Of course, the embodiments of the present disclosure include but are not limited thereto, and the buffer layer can be made of any material that can improve the degree of lattice matching.

In some examples, as illustrated by FIG. 39, forming M electrode structures on a side of the epitaxial layer group away from the substrate includes: patterning the epitaxial layer group 120 to expose part of the first conductivity type semiconductor layer 121 to form M exposed portions 1212; forming M first electrodes 150 on a side of the M exposed portions 1212 away from the substrate 110; forming M second electrodes 160 on a side of the second conductivity type semiconductor layer 123 away from the substrate 110; forming a passivation layer 170 on a side of the M first electrodes 150 and the M second electrodes 160 away from the substrate 110; patterning the passivation layer 170 to form a first via hole H1 corresponding to the first electrode 150 and a second via hole H2 corresponding to the second electrode 160 in the passivation layer 170; forming a first electrode pad 154 and a second electrode pad 164 on a side of the passivation layer 170 away from the substrate 110. The first electrode pad 154 is connected to the first electrode 150 through the first via hole H1, and the second electrode pad 164 is connected to the second electrode 160 through the second via hole H2. Each of the conductive structures 130 includes one first electrode 150, one first electrode pad 154, one second electrode 160 and one second electrode pad 164.

For example, in the manufacturing method of the light-emitting diode substrate, after patterning the epitaxial layer group 120 to expose part of the first conductivity type semiconductor layer 121 to form M exposed portions 1212, a first conductive layer can be formed on the side of the second conductivity type semiconductor layer 123 and the exposed portions 1212 away from the substrate 110, and then patterned to form the first electrode 150 and the second electrode 160. The first electrode 150 is arranged in contact with the exposed portion 1212, and the second electrode 160 is arranged in contact with the second conductivity type semiconductor layer 123, and the first electrode 150 and the second electrode 160 are insulated from each other.

For example, in the manufacturing method of the light-emitting diode substrate, after patterning the passivation layer 170 to form the first via hole H1 corresponding to the first electrode 150 and the second via hole H2 corresponding to the second electrode 160 in the passivation layer 170, a second conductive layer can be formed on the side of the passivation layer 170 away from the substrate 110, and then patterned to form the first electrode pad 154 and the second electrode pad 164 described above.

For example, dividing the epitaxial layer group 120 and the M electrode structures 130 to form M light-emitting diode chips 180 includes: dividing the epitaxial layer group 120 and the M electrode structures 130 to form M light-emitting diode chips 180 by an etching process. Of course, the embodiments of the present disclosure include but are not limited thereto, and other processes can be used for segmentation.

For example, as illustrated by FIG. 39, while forming the epitaxial layer group 120 on the substrate 110, a first alignment mark 710 can be formed on the substrate 110. The embodiment of the present disclosure does not limit the manufacturing method of the first alignment mark.

Figure 40:
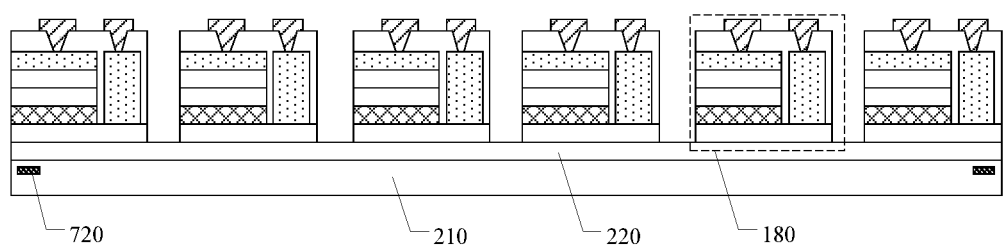

In some examples, as illustrated by FIG. 40, N epitaxial layer groups 120 on N substrates 110 are transferred to the transition carrier substrate 210 through the transfer substrate 310, the specific transfer process can be described in FIGS. 9-11, and will not be described in detail here.

In some examples, as illustrated by FIG. 40, the driving substrate 510 includes a plurality of second support structures 540, and the size of each second support structure 540 in the direction perpendicular to the driving substrate 510 is larger than the size of the light-emitting diode chip 180 in the direction perpendicular to the driving substrate 510. The second support structure 540 can not only support the spacing between the transition carrier substrate 210 and the driving substrate 510 which are oppositely arranged, but also make the spacing between the transition carrier substrate 210 and the driving substrate 510 uniform, and can also play a buffering role.

Figure 41:
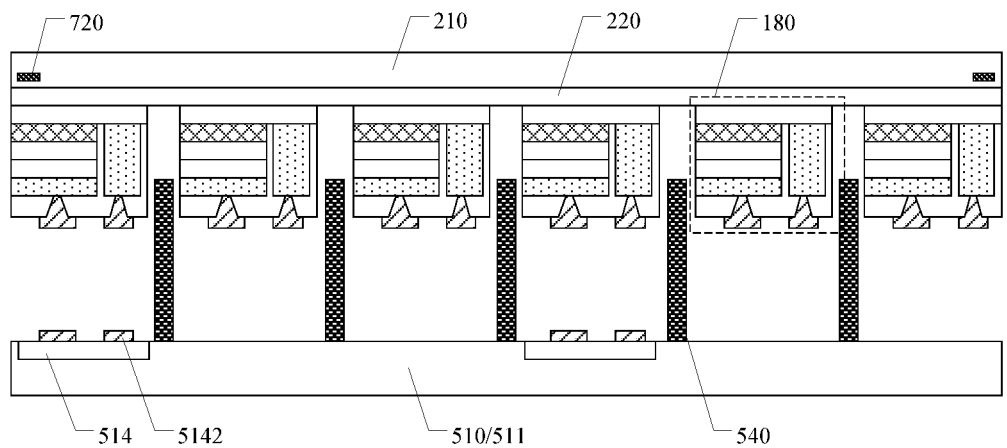
Figure 42:
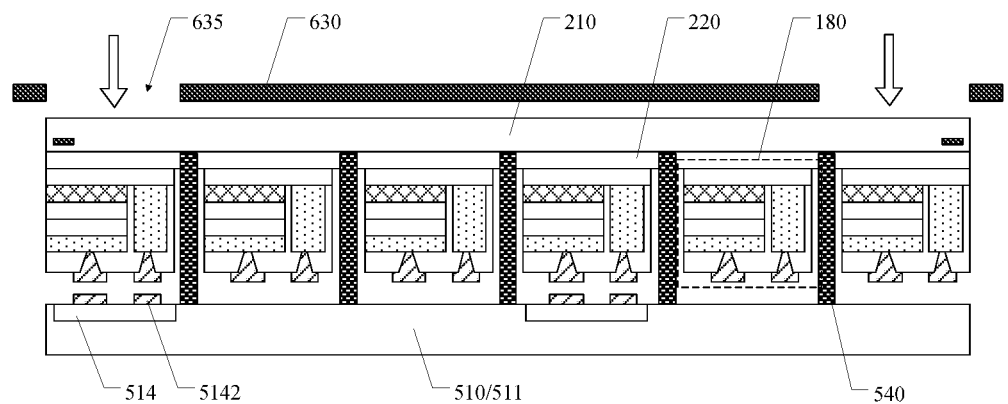
Figure 43:
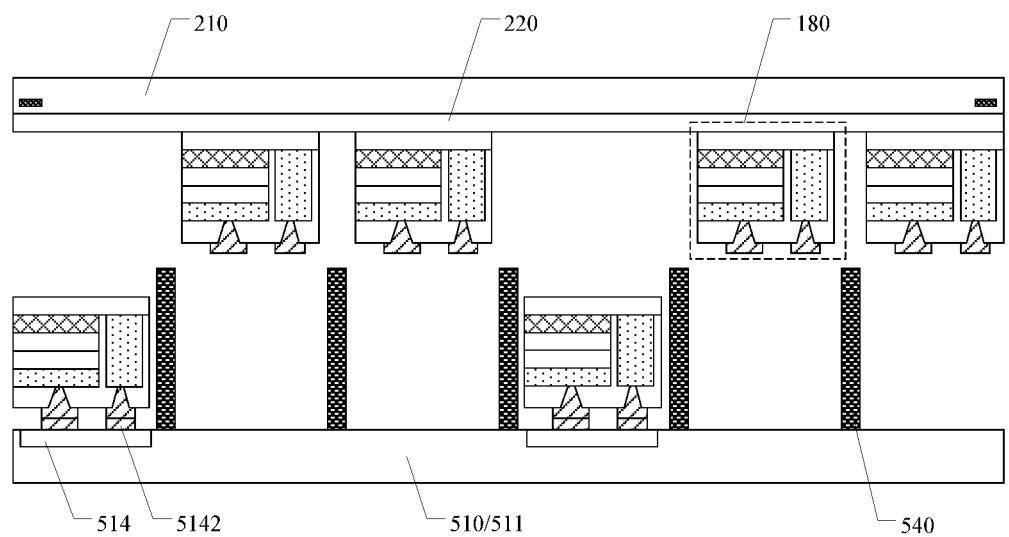

In some examples, as illustrated by FIGS. 41-43, transferring at least part of N*M light-emitting diode chips 180 corresponding to the N epitaxial layer groups 120 on the transition carrier substrate 210 to the driving substrate 510 includes: as illustrated by FIG. 41, aligning the transition carrier substrate 210 with the driving substrate 510, and inserting a plurality of second support structures 540 between two adjacent light-emitting diode chips 180 on the transition carrier substrate 210; as illustrated by FIG. 42, aligning a third mask plate 630 with the transition carrier substrate 210, and the third mask plate 630 includes a plurality of openings 635 corresponding to a plurality of light-emitting diode chips 180 to be transferred; as illustrated by FIG. 42, irradiating light to the transition carrier substrate 210 through the third mask plate 630 to transfer the plurality of light-emitting diode chips 180 to be transferred on the driving substrate 510; as illustrated by FIG. 43, removing the transition carrier substrate 210 from the driving substrate 510, and bonding the light-emitting diode chip 180 transferred on the driving substrate 510 to the driving substrate 510.

For example, the third mask plate 630 is made of a light-absorbing material, and the light absorption rate of the light-absorbing material is greater than 60%. Therefore, the third mask plate can effectively avoid reflecting the light, thereby preventing the reflected light from entering the non-target region of the selecting substrate again.

Figure 44:
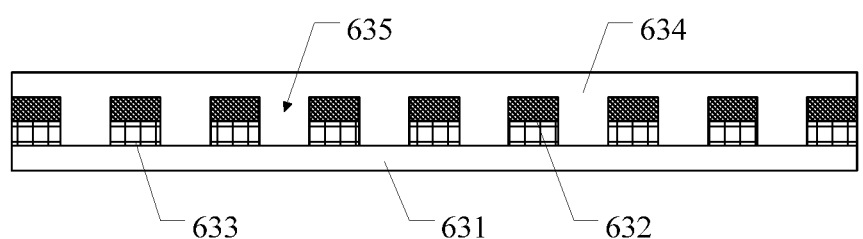
FIG. 44 is a schematic diagram of a third mask plate according to an embodiment of the present disclosure.

FIG. 44 is a schematic diagram of a third mask plate according to an embodiment of the present disclosure. As illustrated by FIG. 44, the third mask plate 630 includes a third transparent substrate 631 and a third light-absorbing pattern layer 632; the third light-absorbing pattern layer 632 is located on the third transparent substrate 631 and includes a plurality of openings 635. The third light-absorbing pattern layer 632 is made of light-absorbing material, and the light absorption rate of the light-absorbing material is greater than 60%.

For example, as illustrated by FIG. 44, the third mask plate 630 further includes: a third magnetic attraction structure 633 located between the third transparent substrate 631 and the third light-absorbing pattern layer 632, and the orthographic projection of the third magnetic attraction structure 633 on the third transparent substrate 631 and the orthographic projection of a plurality of openings 635 on the third transparent substrate 631 are arranged at intervals. Therefore, the third magnetic attraction structure 633 can be adsorbed and fixed, so that the flatness of the third mask plate in the exposure process can be improved, and the exposure accuracy can be improved.

For example, the third magnetic attraction structure can be made of nickel, iron-nickel alloy and other materials, so that it has certain magnetism and can be attracted by electromagnets.

For example, the plane shape of the third magnetic attraction structure can be a grid structure.

For example, as illustrated by FIG. 44, the third mask plate 630 further includes: a third protective layer 634 located on a side of the third light-absorbing pattern layer 632 away from the third transparent substrate 631. The third protective layer 634 can be a transparent protective layer so as not to affect the transmission of light. Of course, embodiments of the present disclosure include but are not limited thereto, and the third protective layer can also be opaque; in this case, the third protective layer can be peeled off upon the third mask being used.

For example, the above third transparent substrate can be made of quartz or silica glass with high hardness and thickness, so that the deformation of the mask plate caused by gravity can be reduced.

It should be noted that in the embodiment of the present disclosure, the first mask plate, the second mask plate and the third mask plate can be the same mask. Of course, embodiments of the present disclosure include but are not limited thereto.

For example, the size range of each second support structure 540 in the direction perpendicular to the driving substrate 510 can be 3-10 microns. Of course, embodiments of the present disclosure include but are not limited thereto. In addition, the manufacturing method of the second support structure 540 can refer to the manufacturing method of the first support structure, and will not be described in detail here.

FIGS. 45-50 are schematic steps of another manufacturing method of a light-emitting diode substrate according to an embodiment of the present disclosure.

Figure 45:
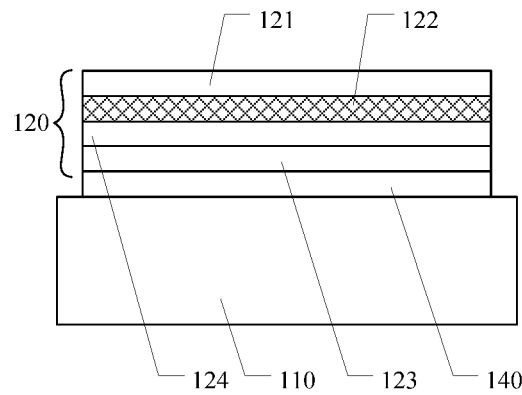
FIGS. 45-50 are schematic steps of a manufacturing method of another light-emitting diode substrate according to an embodiment of the present disclosure.
Figure 46:
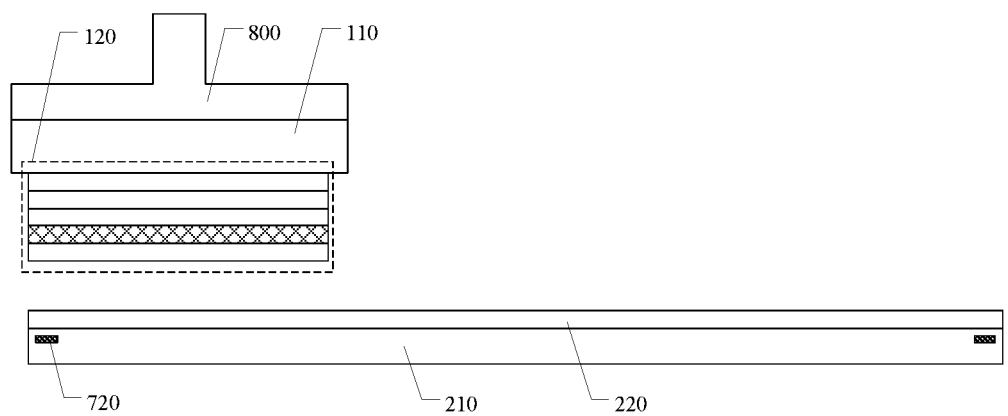
Figure 47:
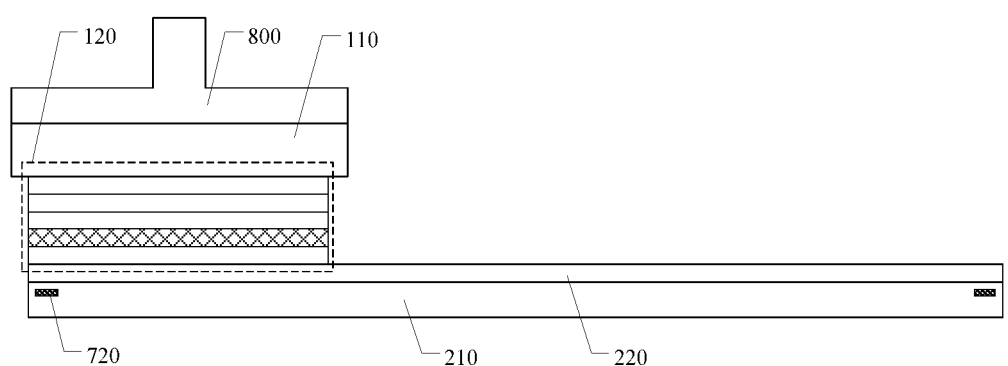

In some examples, as illustrated by FIG. 45, forming an epitaxial layer group 120 of M light-emitting diode chips 180 on a substrate 110 includes: forming a second conductivity type semiconductor layer 123 on the substrate 110; forming a light-emitting layer 122 on a side of the second conductivity type semiconductor layer 123 away from the substrate 110; and forming the first conductivity type semiconductor layer 121 on the side of the light-emitting layer 122 away from the second conductivity type semiconductor layer 123. It should be noted that the order of each epitaxial layer in the epitaxial layer group illustrated in FIG. 45 is opposite to the order of each epitaxial layer in the epitaxial layer group illustrated in FIG. 7. Of course, the embodiments of the present disclosure include but are not limited thereto, and the order of each epitaxial layer in the epitaxial layer group illustrated in FIG. 45 can also be the same as that in the epitaxial layer group illustrated in FIG. 7.

For example, the first conductivity type semiconductor layer 121 can be an n-type semiconductor layer, and the second conductivity type semiconductor layer 123 can be a p-type semiconductor layer. Of course, embodiments of the present disclosure include, but are not limited to, the first conductivity type semiconductor layer 121 can be a p-type semiconductor layer, and the second conductivity type semiconductor layer 123 can be an n-type semiconductor layer.

For example, materials of the first conductivity type semiconductor layer 121 and the second conductivity type semiconductor layer 123 can be gallium nitride materials. For example, the first conductivity type semiconductor layer 121 can be an n-type gallium nitride layer, and the second conductivity type semiconductor layer 123 can be a p-type gallium nitride layer. Of course, the embodiments of the present disclosure include but are not limited thereto, and other suitable semiconductor materials can be selected for the materials of the first conductivity type semiconductor layer 121 and the second conductivity type semiconductor layer 123.

For example, the substrate can be a sapphire substrate. For example, the substrate can be a sapphire substrate. For another example, the sapphire substrate can also include a patterned sapphire substrate (PSS) layer. On the one hand, the patterned sapphire layer can effectively reduce the dislocation density of the first conductivity type semiconductor layer (i.e., epitaxial layer), thereby reducing non-radiative recombination, reducing reverse leakage current and prolonging the service life of the LED chip. On the other hand, the light emitted by the light-emitting layer can be scattered on the patterned sapphire layer for many times, which changes the exit angle of the totally reflected light, thus improving the light extraction efficiency. Of course, embodiments of the present disclosure include but are not limited thereto, and the LED chip may not be provided with the above-mentioned patterned sapphire layer. It should be noted that the substrate can also adopt other substrates, such as silicon carbide substrate.

For example, the patterned sapphire layer can be manufactured by dry etching. Of course, the embodiments of the present disclosure include but are not limited thereto, and the above-mentioned patterned sapphire layer can also be manufactured by other suitable methods.

In some examples, forming the epitaxial layer group 120 of M light-emitting diode chips 180 on the substrate 110 further includes: forming an electron blocking layer 124 between the light-emitting layer 122 and the second conductivity type semiconductor layer 123. The electron blocking layer 124 can block electrons from entering the second conductivity type semiconductor layer 123 to restrict carriers from flowing through, thereby improving light-emitting efficiency and light-emitting intensity.

The electron blocking layer 124 can be p-type aluminum gallium nitride (p-AlGaN), for example. Of course, embodiments of the present disclosure include but are not limited thereto, and the electron blocking layer 124 can also be other suitable materials.

In some examples, before forming the first conductivity type semiconductor layer 121 on the substrate 110, the manufacturing method includes: performing high temperature treatment on the substrate 110 and cleaning the surface of the substrate 110; and forming a buffer layer 140 on the substrate 110. Then, a first conductivity type semiconductor layer 121 is formed on the side of the buffer layer 140 away from the substrate 110. By treating and cleaning the substrate at high temperature and forming a buffer layer on the substrate, the degree of lattice matching can be improved, which is convenient for the subsequent growth of epitaxial layers.

For example, in the case where the first conductivity type semiconductor layer is n-type gallium nitride and the second conductivity type semiconductor layer is p-type gallium nitride, the buffer layer is aluminum nitride. Of course, the embodiments of the present disclosure include but are not limited thereto, and the buffer layer can be made of any material that can improve the degree of lattice matching.

Figure 50:
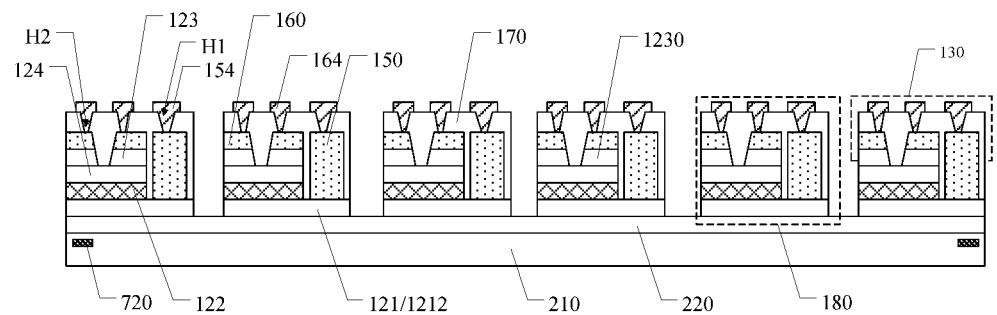

In some examples, as illustrated by FIG. 46-FIG. 50, in the manufacturing method of the light-emitting diode substrate, transferring N epitaxial layer groups 120 on N substrates 110 to the transition carrier substrate 210 includes: as illustrated by FIG. 46-FIG. 49, sequentially transferring N epitaxial layer groups 120 on N substrates 110 to the transition carrier substrate 210, in this case, the epitaxial layer groups 120 have not been divided; as illustrated by FIG. 50, forming M electrode structures 130 on a side of the N epitaxial layer groups 120 away from the transition carrier substrate 210; dividing the N epitaxial layer groups 120 on the transition carrier substrate 210 to form M light-emitting diode chips 180 together with M electrode structures 130.

Figure 48:
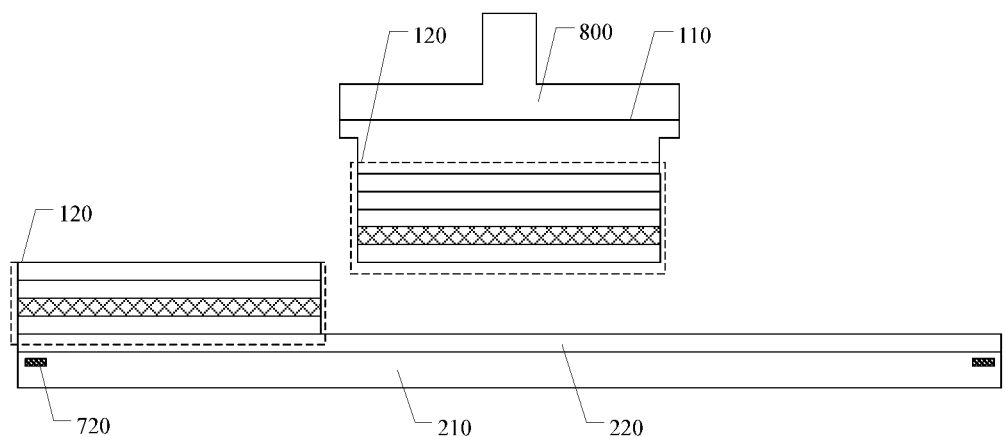
Figure 49:
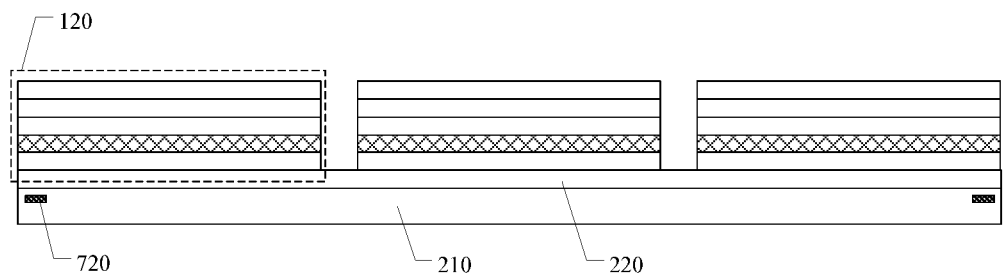

In some examples, as illustrated by FIG. 48, after the epitaxial layer group 120 on the first substrate 110 is transferred to the transition carrier substrate 210, in the process of transferring the epitaxial layer group 120 on the second substrate 110 to the transition carrier substrate 210, the substrate 110 can be first approached to the transition carrier substrate 210, and the part outside the epitaxial layer group 120 can be thinned, thereby avoiding the substrate 100 from colliding or damaging the epitaxial layer group 120 having been transferred to the transition carrier substrate 210.

In some examples, dividing the N epitaxial layer groups on the transition carrier substrate to form M light-emitting diode chips together with M electrode structure groups includes: dividing the N epitaxial layer groups on the transition carrier substrate to form M light-emitting diode chips together with M electrode structure groups by adopting an etching process. Of course, the embodiments of the present disclosure include but are not limited thereto, and other suitable methods such as laser cutting can also be used to divide the N epitaxial layer groups on the transition carrier substrate to form M LED chips together with the M electrode structure groups.

In some examples, as illustrated by FIG. 50, each electrode structure 130 includes a first electrode 150 and J second electrodes 160, and forming M electrode structures 130 on a side of the epitaxial layer group 120 away from the substrate 110 includes: patterning the epitaxial layer group 120 to expose part of the first conductivity type semiconductor layer 121 to form M exposed portions 1212, and dividing the second conductivity type semiconductor layer 123 into M*J second conductivity type semiconductor blocks 1230; forming M*J second electrodes 160 on a side of the M*J second conductivity type semiconductor blocks 1230 away from the transition carrier substrate 210; forming a passivation layer 170 on the side of the M*J second electrodes 160 away from the transition carrier substrate 210; patterning the passivation layer 170 to form M first via holes H1 corresponding to M exposed portions 1212 and M*J second via holes H2 corresponding to M*J second electrodes 160 in the passivation layer 170; forming M first electrodes 150 on a side of the M exposed portions 1212 away from the substrate 110 through the M first via holes H1; and forming a first electrode pad 154 and a second electrode pad 164 on a side of the passivation layer 170 away from the transition carrier substrate 210, wherein the first electrode pad 154 is connected with the first electrode 150 through the first via hole H1 and the second electrode pad 164 is connected with the second electrode 160 through the second via hole H2, and J is a positive integer greater than or equal to 2.

In the manufacturing method of the light-emitting diode chip substrate, in the case where each electrode structure 130 includes a first electrode 150 and J second electrodes 160, a first electrode, a second electrode, a first conductivity type semiconductor layer, a second conductivity type semiconductor block and a light-emitting layer can form an LED light-emitting structure. Therefore, a single light-emitting diode chip can include J (J is a positive integer greater than or equal to 2) second conductivity type semiconductor blocks and J second electrodes, so that a single light-emitting diode chip can be formed with at least two light-emitting structures capable of emitting light independently. On the one hand, in a case where the overall size of the formed single light-emitting chip remains unchanged, the size of a single light-emitting structure can be reduced by forming a plurality of light-emitting structures in the light-emitting diode chip. That is to say, LED chips with smaller size can be manufactured with the existing process precision. Therefore, the light-emitting diode chip can reduce the manufacturing difficulty and cost of the small-sized LED light-emitting structure, and can also realize higher pixels per inch. On the other hand, because the size of a single light-emitting structure is small, its efficiency is high under the drive of a small current, so that the light-emitting efficiency can be improved.

It should be noted that after the transition carrier substrate 210 and the light-emitting diode chips 180 on the transition carrier substrate 210 illustrated in FIG. 50 are formed, at least a part of the light-emitting diode chips 180 on the transition carrier substrate 210 can be transferred on the driving substrate 510, the specific process can be described as illustrated by FIGS. 12-14, and will not be described in detail here.

Figure 51A:
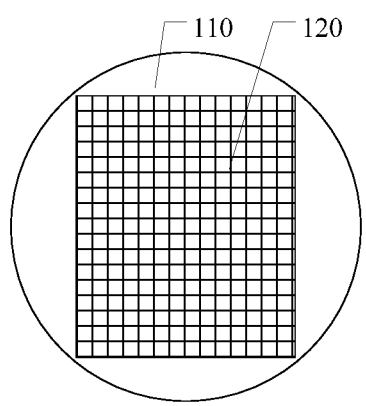
FIG. 51A-51C are schematic diagrams of a method for transferring N epitaxial layer groups on N substrates onto a transition carrier substrate according to an embodiment of the present disclosure.
Figure 51B:
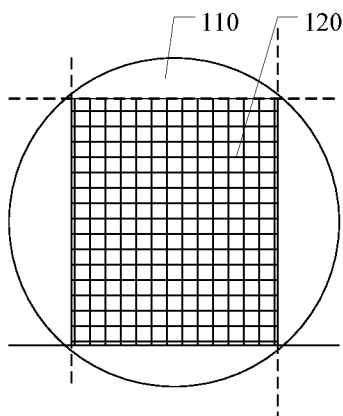
Figure 51C:
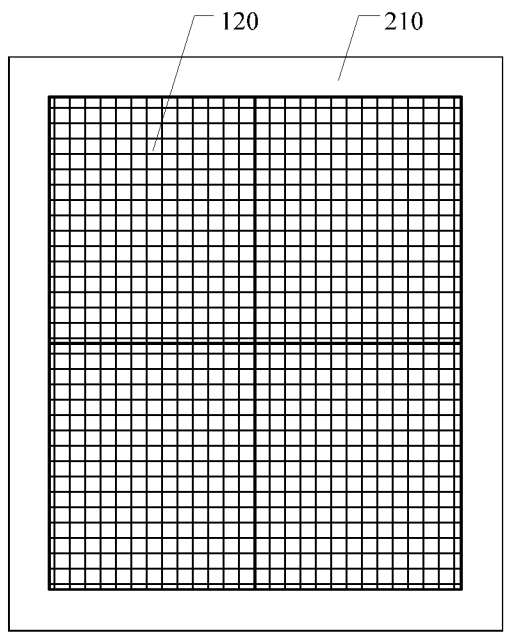

FIG. 51A-FIG. 51C are schematic diagrams of a method for transferring N epitaxial layer groups on N substrates onto a transition carrier substrate according to an embodiment of the present disclosure. Forming the epitaxial layer group 120 of M light-emitting diode chips 180 on the substrate 110 includes: as illustrated by FIG. 51A, forming the epitaxial layer group 120 of M light-emitting diode chips 180 on a circular substrate 110, and the shape of the orthographic projection of the epitaxial layer group 120 on the substrate 110 is square; as illustrated by FIG. 51B, cutting the circular substrate 110 into a square substrate 110 along the edge of the epitaxial layer group 120; as illustrated by FIG. 51C, transferring the N epitaxial layer groups 120 on the N substrates 110 to the transition carrier substrate 210 includes: arranging the N epitaxial layer groups 120 on the N square substrates 110 densely on the transition carrier substrate 210. Of course, the embodiments of the present disclosure include but are not limited thereto, according to the crystalline characteristics of the substrate, the circular substrate can also be cut into hexagonal substrates.

Figure 52A:
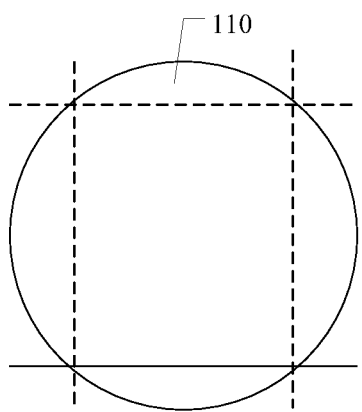
FIGS. 52A-52C are schematic diagrams of another method for transferring N epitaxial layer groups on N substrates onto a transition carrier substrate according to an embodiment of the present disclosure.
Figure 52B:
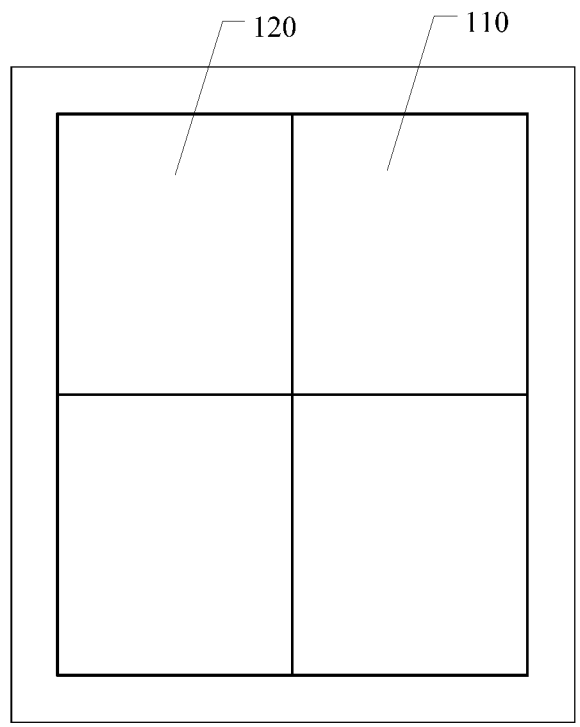
Figure 52C:
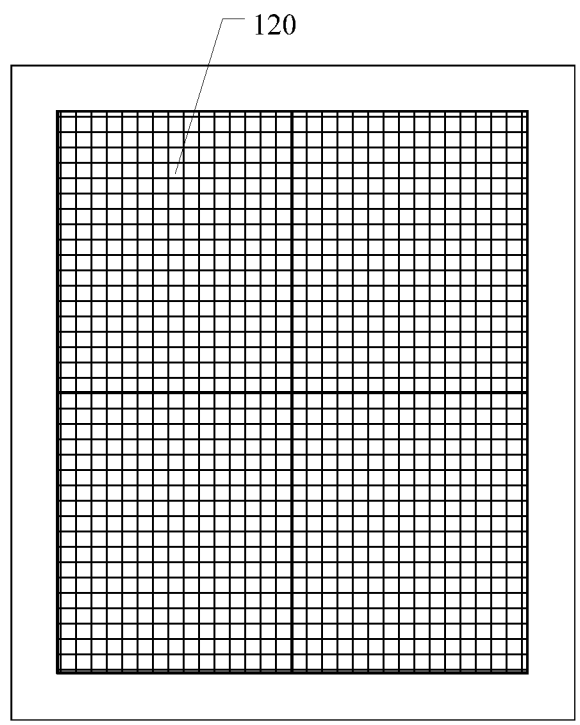

For example, in the case where the substrate is sapphire substrate, because sapphire is hexagonal crystal, there is a concept of dissociation plane in the crystal. Dissociation plane refers to the plane that the mineral crystal breaks strictly along a certain crystal direction under the action of external force and can crack out smooth plane. As for sapphire substrate, the epitaxial layer is epitaxially grown along the crystal axis, so there are two crystal planes on the dissociation plane parallel to the crystal axis, and the two crystal planes are perpendicular to each other. Therefore, sapphire can be dissociated along the reference edge or perpendicular to the reference edge, so that the circular sapphire substrate can be cut into square sapphire substrate, and it can also be dissociated into hexagonal sapphire substrate according to the crystal plane distribution. FIG. 52A-FIG. 52C are schematic diagrams of another method for transferring N epitaxial layer groups on N substrates to a transition carrier substrate according to an embodiment of the present disclosure. Forming the epitaxial layer group 120 of M light-emitting diode chips 180 on the substrate 110 includes: as illustrated by FIG. 52A, cutting the circular substrate 110 into a square substrate 110; as illustrated by FIG. 52B, splicing N square substrates 110 together to form a combination of N substrates 110; as illustrated by FIG. 52C, forming the epitaxial layer groups 120 of M*N light-emitting diode chips 180 on the combination of N substrates 110. Similarly, embodiments of the present disclosure include but are not limited thereto. According to the crystalline characteristics of the substrate, the above-mentioned circular substrate can also be cut into hexagonal substrates.

In some examples, transferring N epitaxial layer groups on N substrates to the transition carrier substrate includes: transferring the epitaxial layer groups of M*N light-emitting diode chips formed on the combination of N substrates to the transition carrier substrate.

Figure 53:
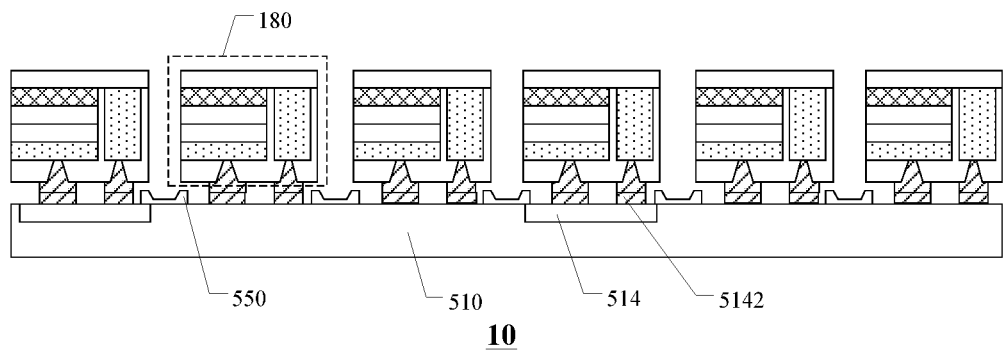
FIG. 53 is a schematic diagram of a light-emitting diode substrate according to an embodiment of the present disclosure.

An embodiment of the present disclosure also provides a light-emitting diode substrate. FIG. 53 is a schematic diagram of a light-emitting diode substrate according to an embodiment of the present disclosure. The light-emitting diode substrate can be manufactured by any of the above manufacturing methods. In the above manufacturing method of the light-emitting diode substrate, N epitaxial layer groups on N substrates are firstly transferred onto a transition carrier substrate with larger size, and these epitaxial layer groups are densely arranged on the transition carrier substrate; then, at least part of the light-emitting diode chips on the transition carrier substrate are selected and transferred on the driving substrate. Because the N epitaxial layer groups on the N substrates are densely arranged on the transition carrier substrate, so that during the process of transferring at least part of N*M light-emitting diode chips corresponding to the N epitaxial layer groups on the transition carrier substrate to the driving substrate, the light-emitting diode chips on the transition carrier substrate are uniformly distributed, so that more light-emitting diode chips can be taken at one time (greater than the number of light-emitting diode chips that can be taken by one substrate), even the LED chips of the same color required by the driving substrate can be taken at one time, that is, the transfer of the LED chips of the same color on the driving substrate can be completed only by one transfer process. Therefore, the manufacturing method of the light-emitting diode substrate can greatly improve the taking efficiency and the transfer efficiency. Therefore, the light-emitting diode substrate has higher manufacturing efficiency and lower cost.

For example, as illustrated by FIG. 53, in the light-emitting diode substrate 10, the driving substrate 510 includes a plurality of receiving structures 560, and the size of each receiving structure 560 in the direction perpendicular to the driving substrate 510 is smaller than the size of the light-emitting diode chip 180 in the direction perpendicular to the driving substrate 510. Therefore, the alignment accuracy between the transition carrier substrate and the driving substrate can be improved through the receiving structure, so that the product yield can be improved.

Figure 54:
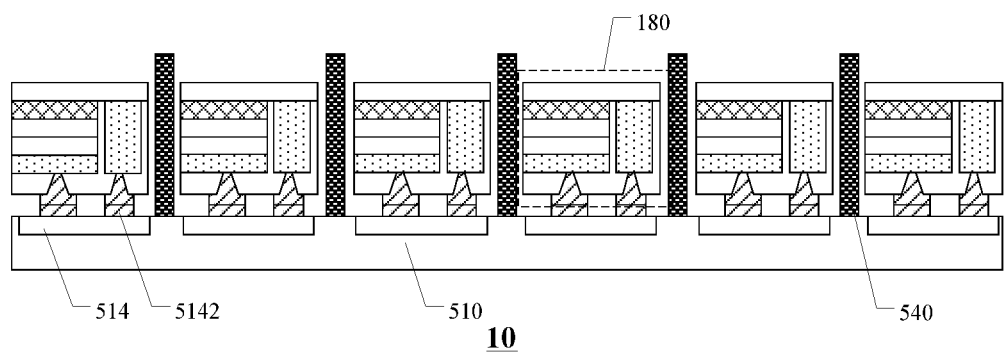
FIG. 54 is a schematic diagram of another light-emitting diode substrate according to an embodiment of the present disclosure.

FIG. 54 is a schematic diagram of another light-emitting diode substrate according to an embodiment of the present disclosure. As illustrated by FIG. 54, the light-emitting diode substrate 10 includes a driving substrate 510 and a plurality of light-emitting diode chips 180 on the driving substrate 510. In addition, the LED substrate 10 further includes a plurality of support structures 540 located between adjacent LED chips 180, and the size of each support structure 540 in the direction perpendicular to the driving substrate 510 is larger than that of the LED chips 180 in the direction perpendicular to the driving substrate 510. Therefore, the support can not only support the spacing between the transition carrier substrate and the driving substrate 510 which are oppositely arranged in the manufacturing process, and make the spacing between the transition carrier substrate and the driving substrate uniform, but also play a buffering role, thereby improving the product yield.

Figure 55:
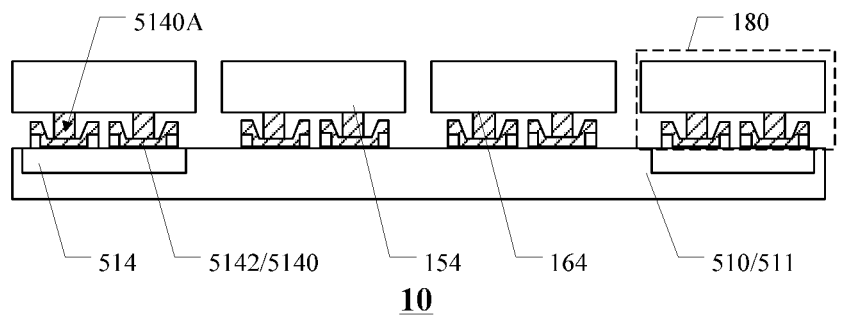
FIG. 55 is a schematic diagram of another light-emitting diode substrate according to an embodiment of the present disclosure.

FIG. 55 is a schematic diagram of another light-emitting diode substrate according to an embodiment of the present disclosure. As illustrated by FIG. 55, the driving substrate 510 includes a base substrate 511 and a plurality of driving circuits 514 located on the base substrate 511, each driving circuit 514 includes a pad 5142; each driving circuit 514 is configured to drive the LED chip 180 electrically connected to the pad 5142 to emit light. Each pad 5142 includes at least two sub-pads 5140, and each sub-pad 5140 includes a groove 5140A configured to receive the electrode pad 154 or 164 of the corresponding LED chip 180. Therefore, the driving substrate can drive the light-emitting diode chip to emit light or display. In addition, the groove can also improve the bonding accuracy, thus improving the product yield.

In some examples, as illustrated by FIG. 55, the number of driving circuits 514 on the driving substrate 510 is approximately the same as the number of light-emitting diode chips 180 on the transition carrier substrate 210. The positions of the driving circuits 514 on the driving substrate 510 and the positions of the LED chips 180 on the transition carrier substrate 210 are arranged in one-to-one correspondence. Therefore, after the transition carrier substrate and the driving substrate are aligned, any number of LED chips which need to be transferred on the transition carrier substrate can be transferred onto the driving substrate at one time.

Figure 56:
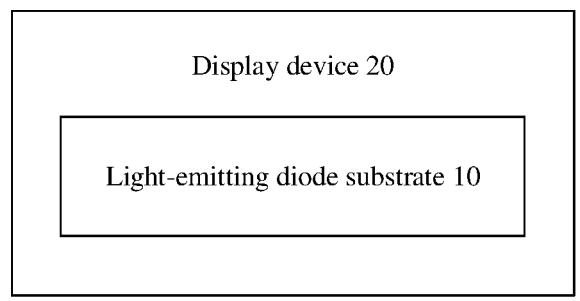
FIG. 56 is a schematic diagram of a display device according to an embodiment of the present disclosure.

An embodiment of the present disclosure also provides a display device. FIG. 56 is a schematic diagram of a display device according to an embodiment of the present disclosure. As illustrated by FIG. 56, the display device 20 includes the light-emitting diode substrate 10 described above. It should be noted that, in the case where the above LED substrate 10 includes LED chips emitting light of various colors (e.g., red, green and blue), the LED substrate 10 can be a display substrate of the display device 20, and can directly perform color display. In the case where the LED substrate 10 includes only LED chips emitting one color (e.g., white or blue), the LED substrate 10 can be the backlight source of the display device 20.

For example, the display device can be electronic products with display functions such as televisions, computers, notebook computers, smart phones, navigators, tablet computers, and electronic picture frames.

An embodiment of the present disclosure also provides a mask plate. FIG. 16 is a schematic diagram of a mask plate according to an embodiment of the present disclosure. As illustrated by FIG. 16, the mask plate 610 includes a transparent substrate 611 and a light-absorbing pattern layer 612. The light-absorbing pattern layer 612 is located on the transparent substrate 611 and includes a plurality of openings 615. The light-absorbing pattern layer 612 is made of a light-absorbing material, and the light absorption rate of the light-absorbing material is greater than 60%.

In the manufacturing method of the above light-emitting diode substrate, in the case where the laser is used to irradiate through the common mask plate, because the energy of the laser is high, and the chrome pattern adopted by the common mask plate has a reflectivity of 65% (about 35% absorption rate), the laser will be reflected; after reflection and projection, the reflected laser light will shoot at the non-target region again, which will lead to the exposure of the non-target region and lead to the wrong dissociation. However, in the case of using the mask plate according to the embodiment of the present disclosure, because the light-absorbing pattern layer is made of light-absorbing material, and the light absorption rate of the light-absorbing material is greater than 60%, the mask plate can reduce or even eliminate the reflection of the mask plate, thus avoiding the exposure of non-target regions and causing wrong dissociation.

For example, as illustrated by FIG. 16, the mask plate 610 further includes: a magnetic attraction structure 613 located between the transparent substrate 611 and the light-absorbing pattern layer 612, and the orthographic projection of the magnetic attraction structure 613 on the transparent substrate 611 and the orthographic projection of a plurality of openings 615 on the transparent substrate 611 are arranged at intervals. Therefore, the magnetic attraction structure 613 can be adsorbed and fixed, so that the flatness of the mask plate in the exposure process can be improved, and the exposure accuracy can be improved.

For example, as illustrated by FIG. 16, the mask plate 610 further includes: a protective layer 614 located on a side of the light-absorbing pattern layer 612 away from the transparent substrate 611. The protective layer 614 can be a transparent protective layer so as not to affect the transmission of light. Of course, embodiments of the present disclosure include but are not limited thereto, and the protective layer can also be opaque; in this case, the protective layer can be peeled off upon the mask plate being used.

For example, the light-absorbing material can be obtained by oxidizing a metal pattern.

For example, the transparent substrate of the mask plate includes transparent materials such as quartz, glass and sapphire. For example, the transparent substrate of the mask plate can be made of quartz or silica glass with high hardness and thickness, so that the deformation of the mask plate caused by gravity can be reduced.

The following statements need to be explained:

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure can be combined.

The above are merely exemplary embodiments of the present disclosure but are not limitative to the scope of the present disclosure; any person familiar with this technical field can easily think of changes or substitutions within the technical scope disclosed in this disclosure, which should be covered within the protection scope of this disclosure. Therefore, the scopes of the present disclosure should be defined in the appended claims.

The invention claimed is:

1. A manufacturing method of a light-emitting diode substrate, comprising:
   growing an epitaxial layer group of M light-emitting diode chips on a substrate;
   transferring N epitaxial layer groups on N substrates onto a transition carrier substrate, the N epitaxial layer groups on the N substrates being densely arranged on the transition carrier substrate; and
   transferring at least part of N*M light-emitting diode chips corresponding to the N epitaxial layer groups on the transition carrier substrate onto a driving substrate,
   wherein an area of the transition carrier substrate is greater than or equal to a sum of areas of the N substrates, M is a positive integer greater than or equal to 2, and N is a positive integer greater than or equal to 2,
   growing the epitaxial layer group of M light-emitting diode chips on the substrate comprises:
   forming a first conductivity type semiconductor layer on the substrate; forming a light-emitting layer on a side of the first conductivity type semiconductor layer away from the substrate; and forming a second conductivity type semiconductor layer on a side of the light-emitting layer away from the first conductivity type semiconductor layer,
   the light-emitting diode chips corresponding to the N epitaxial layer groups on the N substrates are configured to emit light of a same color.

2. The manufacturing method of the light-emitting diode substrate according to claim 1, wherein, on the transition carrier substrate, a distance between two adjacent epitaxial layer groups is approximately equal to a distance between two adjacent light-emitting diode chips.

3. The manufacturing method of the light-emitting diode substrate according to claim 1, wherein the driving substrate comprises a base substrate and a plurality of driving circuits on the base substrate, each of the plurality of driving circuits comprises a pad and is configured to drive a light-emitting diode chip electrically connected with the pad to emit light, and the manufacturing method further comprises:
   bonding the light-emitting diode chip transferred on the driving substrate with the pad of a corresponding one of the plurality of driving circuits by adopting a bonding process.

4. The manufacturing method of the light-emitting diode substrate according to claim 3, wherein the driving substrate further comprises a plurality of conductive bumps located at a side of the pad away from the base substrate, and an orthographic projection of the pad on the base substrate is overlapped with an orthographic projection of at least one of the plurality of conductive bumps on the base substrate, and the manufacturing method further comprises:
   coating an organic insulating adhesive on the driving substrate before transferring at least part of the N*M light-emitting diode chips corresponding to the N epitaxial layer groups on the transition carrier substrate onto the driving substrate;
   bonding the light-emitting diode chip transferred on the driving substrate with the pad of the corresponding one of the plurality of driving circuit by adopting a bonding process comprises:

performing thermal reflow on the driving substrate and evaporating a solvent in the organic insulating adhesive, to bond the light-emitting diode chip and the pad together.

5. The manufacturing method of the light-emitting diode substrate according to claim 1, wherein transferring the N epitaxial layer groups on the N substrates to the transition carrier substrate comprises:
forming a first adhesive layer on the transition carrier substrate; and
transferring the N epitaxial layer groups on the N substrates to a side of the first adhesive layer away from the transition carrier substrate.

6. The manufacturing method of the light-emitting diode substrate according to claim 5, wherein a material of the first adhesive layer comprises ultraviolet light viscosity reducing adhesive or laser dissociation adhesive.

7. The manufacturing method of the light-emitting diode substrate according to claim 1, wherein after forming the epitaxial layer group of the M light-emitting diode chips on the substrate, the manufacturing method further comprises:
forming M electrode structures on a side of the epitaxial layer group away from the substrate; and
dividing the epitaxial layer group and the M electrode structures to form the M light-emitting diode chips.

8. The manufacturing method of the light-emitting diode substrate according to claim 7, wherein transferring the N epitaxial layer groups on the N substrates to the transition carrier substrate comprises:
transferring the substrate on which the M light-emitting diode chips are formed to a transfer substrate;
peeling off the substrate from the transfer substrate; and
transferring N*M light-emitting diode chips on N transfer substrates to the transition carrier substrate,
wherein an area of the transfer substrate is approximately equal to an area of the substrate.

9. The manufacturing method of the light-emitting diode substrate according to claim 8, wherein transferring the substrate on which M light-emitting diode chips are formed to the transfer substrate comprises:
coating a second adhesive layer on the transfer substrate; and
transferring the substrate on which M light-emitting diode chips are formed to a side of the second adhesive layer away from the transfer substrate.

10. The manufacturing method of the light-emitting diode substrate according to claim 8, wherein the transition carrier substrate comprises a plurality of first support structures, and a size of each of the plurality of first support structures in a direction perpendicular to the transition carrier substrate is larger than a size of the light-emitting diode chips in the direction perpendicular to the transition carrier substrate, and transferring the N*M light-emitting diode chips on the N transfer substrates to the transition carrier substrate comprises:
sequentially aligning the N transfer substrates with the transition carrier substrate so that each of the plurality of first support structures is located between two adjacent light-emitting diode chips on the transfer substrate.

11. The manufacturing method of the light-emitting diode substrate according to claim 10, wherein transferring at least part of the N*M light-emitting diode chips corresponding to the N epitaxial layer groups on the transition carrier substrate onto the driving substrate comprises:

aligning the transition carrier substrate with the driving substrate so that the plurality of first support structures are located between the transition carrier substrate and the driving substrate;
aligning a first mask plate with the transition carrier substrate, wherein the first mask plate comprises a plurality of openings corresponding to a plurality of light-emitting diode chips to be transferred; and
irradiating light to the transition carrier substrate through the first mask plate to transfer the plurality of light-emitting diode chips to be transferred onto the driving substrate.

12. The manufacturing method of the light-emitting diode substrate according to claim 11, wherein the driving substrate comprises a plurality of first receiving structures, and aligning the transition carrier substrate with the driving substrate comprises: inserting the plurality of first support structures on the transition carrier substrate into the plurality of first receiving structures on the driving substrate, wherein the plurality of first support structures and the plurality of first receiving structures are arranged in one-to-one correspondence, and a size of each of the plurality of first receiving structures in a direction perpendicular to the driving substrate is smaller than a size of each of the light-emitting diode chips in the direction perpendicular to the driving substrate.

13. The manufacturing method of the light-emitting diode substrate according to claim 7, wherein transferring at least part of the N*M light-emitting diode chips corresponding to the N epitaxial layer groups on the transition carrier substrate onto the driving substrate comprises:
providing a selecting substrate, wherein the selecting substrate comprises a plurality of selecting structures;
aligning the selecting substrate with the transition carrier substrate, and contacting the plurality of selecting structures with a plurality of light-emitting diode chips to be transferred;
aligning a second mask plate with the transition carrier substrate, the second mask plate comprising a plurality of openings corresponding to the plurality of selecting structures;
irradiating light to the transition carrier substrate through the second mask plate to transfer the plurality of light-emitting diode chips to be transferred onto the plurality of selecting structures on the selecting substrate;
aligning the selecting substrate and the driving substrate;
bonding the plurality of light-emitting diode chips to be transferred on the plurality of selecting structures on the selecting substrate with the driving substrate; and
removing the plurality of selecting structures.

14. The manufacturing method of the light-emitting diode substrate according to claim 13, wherein each of the plurality of selecting structures comprises a support portion and a pyrolysis portion located on a side of the support portion away from the transition carrier substrate, removing the plurality of selecting structures comprises:
heating in a vacuum environment to melt the pyrolysis portion to remove the plurality of selecting structures.

15. The manufacturing method of the light-emitting diode substrate according to claim 8, wherein the driving substrate comprises a plurality of second support structures, and a size of each of the plurality of second support structures in a direction perpendicular to the driving substrate is larger than a size of each of the plurality of light-emitting diode chips in the direction perpendicular to the driving substrate.

16. The manufacturing method of the light-emitting diode substrate according to claim 15, wherein transferring at least part of the N*M light-emitting diode chips corresponding to the N epitaxial layer groups on the transition carrier substrate onto the driving substrate comprises:
- aligning the transition carrier substrate with the driving substrate, and inserting the plurality of second support structures between two adjacent light-emitting diode chips on the transition carrier substrate;
- aligning a third mask plate with the transition carrier substrate, wherein the third mask plate comprises a plurality of openings corresponding to a plurality of light-emitting diode chips to be transferred; and
- irradiating light to the transition carrier substrate through the third mask plate to transfer the plurality of light-emitting diode chips to be transferred onto the driving substrate.

17. A light-emitting diode substrate manufactured by the manufacturing method according to claim 1.

18. The light-emitting diode substrate according to claim 17, wherein the driving substrate comprises a plurality of receiving structures, and a size of each of the plurality of first receiving structures in a direction perpendicular to the driving substrate is smaller than a size of the light-emitting diode chips in the direction perpendicular to the driving substrate.

19. The light-emitting diode substrate according to claim 17, further comprising:
- a plurality of support structures, each of which is located between two adjacent light-emitting diode chips, and a size of each of the plurality of support structures in the direction perpendicular to the driving substrate is larger than a size of the light-emitting diode chips in the direction perpendicular to the driving substrate.

20. A display device comprising the light-emitting diode substrate according to claim 17.

* * * * *